(12) United States Patent
Hidaka

(10) Patent No.: US 6,542,428 B2
(45) Date of Patent: *Apr. 1, 2003

(54) SEMICONDUCTOR MEMORY DEVICE ALLOWING INCREASE IN CAPACITY AND OPERATION SPEED WITH A SUPPRESSED LAYOUT AREA

(75) Inventor: Hideto Hidaka, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,709

(22) Filed: Dec. 1, 1999

(65) Prior Publication Data

US 2001/0026496 A1 Oct. 4, 2001

(30) Foreign Application Priority Data

Dec. 24, 1998 (JP) ............................................ 10-367454
Oct. 5, 1999 (JP) ............................................ 11-284070

(51) Int. Cl.⁷ .............................................. G11C 8/00
(52) U.S. Cl. ............................ 365/230.03; 365/230.01; 365/230.06
(58) Field of Search ....................... 365/230.03, 230.01, 365/230.06

(56) References Cited

U.S. PATENT DOCUMENTS

| | | | |
|---|---|---|---|
| 4,485,460 A | * 11/1984 | Stambaugh | 365/203 |
| 5,274,595 A | 12/1993 | Seok et al. | 365/203 |
| 5,283,760 A | 2/1994 | Chin et al. | 365/189.01 |
| 5,341,331 A | 8/1994 | Jeon | 365/189.01 |
| 5,386,387 A | 1/1995 | Tanizaki | 345/200 |
| 5,555,215 A | * 9/1996 | Nakagome et al. | 365/230.03 |
| 5,652,731 A | 7/1997 | Saeki | 365/230.06 |
| 5,668,774 A | * 9/1997 | Furutani | 365/133 |
| 6,084,818 A | 7/2000 | Ooishi | 365/230.03 |
| 6,137,740 A | * 10/2000 | Noda | 365/230.03 |

FOREIGN PATENT DOCUMENTS

| | | |
|---|---|---|
| JP | 63183687 A | 7/1988 |
| JP | 04029394 A | 7/1992 |
| JP | 0431956 A | 11/1992 |
| JP | 05074143 A | 3/1993 |
| JP | 05282894 A | 10/1993 |
| JP | 06076596 A | 3/1994 |
| JP | 06302187 A | 10/1994 |

OTHER PUBLICATIONS

"Ultra LSI Memory" by Kiyoo Ito, Baifukan, Nov. 5, 1994, pp. 165–170, 181–183.

"Ultra LSI Memory", Kiyoo ITO, Advanced Electronics Series, 1–9, Baifukan, Nov. 5, 1994, pp. 165–167 and pp. 333–341 (with English commentary).

* cited by examiner

Primary Examiner—Son T. Dinh
(74) Attorney, Agent, or Firm—McDermott, Will & Emery

(57) ABSTRACT

A column select gate of a semiconductor memory device includes read gate circuits. Each read gate circuit includes read gate transistors. Each read gate transistor connects a read column select line to a global I/O line pair in response to a potential level on a bit line pair received on its gate and the potential on the read column select line. A voltage drop caused on one of the paired global I/O lines by turn-on of the read gate transistor is amplified by a main read amplifier to obtain read data.

35 Claims, 31 Drawing Sheets

SEMICONDUCTOR MEMORY DEVICE ALLOWING INCREASE IN CAPACITY AND OPERATION SPEED WITH A SUPPRESSED LAYOUT AREA

BACKGROUND OF THE INVENTION

1. Field of the Invention

The present invention relates to a semiconductor memory device, and particularly data read and write circuits of a dynamic random access memory (which will also be referred to as a "DRAM" hereinafter).

2. Description of the Background Art

A hierarchical data I/O (input/output) line structure and a direct sensing system have been used as techniques for satisfying demands for large capacities and high operation speeds of semiconductor memories in recent years.

With increase in capacity of memories, parasitic capacitances of I/O lines may increase and cause remarkable delay in signal transmission. The hierarchical I/O line structure is employed for reducing an influence of this delay by hierarchically arranged I/O lines. For example, the hierarchical I/O line structure is described, e.g., in "Ultra LSI Memory" (Kiyoo ITO, BAIFUKAN), pp. 167–170.

The direct sensing system is a technique having such a feature that the operation speed is increased by directly taking memory cell signals onto I/O lines without waiting for amplification by sense amplifiers, and is disclosed, e.g., in "Ultra LSI Memory" (Kiyoo ITO, BAIFUKAN), pp. 165–167.

FIG. 31 schematically shows an I/O line structure of a semiconductor memory device 500 having a typical hierarchical I/O line structure.

Referring to FIG. 31, a memory cell array of a semiconductor memory device 500 is divided into a plurality of sense amplifier blocks 501 of k in number. A sense amplifier S/A amplifies data read onto bit line pair BL and /BL provided correspondingly to a column of memory cells. Sense amplifiers S/A in each sense amplifier block are activated independently of those in other sense amplifier blocks.

The I/O lines provided for transmitting output data are divided into lines I/O1–I/O3 which are hierarchically arranged for reducing an influence of delay in data transmission caused by increase in parasitic capacitance. Further, main amplifiers MA1 and MA2 are arranged for amplifying potential differences occurring on I/O lines I/O2 and I/O3, respectively.

According to the above structure, a column decoder/driver 502 controls a column select signal, and thereby the sense amplifier amplifies the data on the bit line pair of the corresponding column and transmits the same onto the data I/O line. In general, it is I/O1 in which increase in parasitic capacitance may cause a problem. Therefore, I/O1 is divided, and data lines I/O2 crossing I/O1 are connected to divided I/O1 with switches therebetween, respectively.

Further, upper or high-order data lines I/O3 connected to the plurality of lines I/O2 are arranged. Thereby, the device can perform fast input/output of a large quantity of data as a whole. In particular, lines I/O2 can have a simple structure, and therefore can be arranged on the memory cell array so that lines I/O2 do not significantly increase a chip area.

According to the above system, however, many switches controlling connection between the I/O lines are required, resulting in disadvantageous increase in chip area.

FIG. 32 conceptually shows a semiconductor memory device employing a typical direct sensing system, and particularly a structure of a column select circuit 510 relating to read and write of data.

Referring to FIG. 32, word line WL and a bit line pair BL and /BL are arranged correspondingly to a memory cell MC. Column select circuit 510 includes sense amplifier S/A for amplifying data on the bit line pair, a read select circuit 511 for reading data from the memory cell, a write select circuit 512 for writing data into the memory cell, a read data line pair RO and /RO and a write data line pair WI and /WI.

When word line WL is activated, the data in memory cell is read onto bit line pair BL and /BL, and is amplified by sense amplifier S/A activated by sense amplifier activating signals $\phi_N$ and /$\phi_P$. A read gate transistor 513 or 514 included in read select circuit 511 is turned on by the data read onto bit line pair BL and /BL, and directly drives data read line pair RO and /RO in accordance with selection by a read column select signal YR. Thereby, a voltage difference occurring on read data line pair RO and /RO is amplified and taken out. In this manner, the data stored in the memory cell can be read out.

Data writing is performed by writing the data, which is transmitted onto write data line pair WI and /WI, onto bit line pair BL and /BL in accordance with selection by a write column select signal YW.

As described above, the direct sensing system increases the speed of data read operation by directly driving the read data line pair based on the memory cell signal read onto the bit line pair.

Although the speed of data read operation can be increased, disadvantageous increase in number of circuit elements and increase in layout area occur because the column selection in the read operation is performed independently of that in the write operation, and additional read gate transistors are required.

For improving production yields while increasing capacities of memories, such a structure is employed that a memory cell array includes a preliminary memory cell array having a spare line (a spare row or a spare column) for each unit of rows or columns, and a failed memory cell having a defect is repaired by replacing the row or column containing the failed memory cell with the spare line. Thus, a so-called redundant repair structure is employed.

FIG. 33 conceptually shows a structure of a redundant repair circuit 520 in the redundant repair structure.

Referring to FIG. 33, redundant repair circuit 520 includes a spare memory cell array 521 in which spare rows or columns are arranged, and program elements 525a and 525b which are arranged correspondingly to the spare row and spare columns, respectively.

Each of program element 525a and 525b is formed of a program fuse which can be blown by laser applied thereto, or a thin insulating film to be broken by a high voltage for turning on the element.

For example, when a defect occurs in a memory cell at (x1, y1), i.e., a row address x1 and a column address y1 in a regular memory cell array, processing is externally effected on the program element for replacing the whole regular row at row address x1 with one spare row. Naturally, processing may be performed to use the spare column based on column address y1.

When the address of row or column containing the defective memory cell is determined, the redundant repair structure can repair a defect in the regular memory cell by replacement with the spare row or column of the spare memory cells based on the state of program elements in the above manner. Thereby, the redundant repair structure can reduce a product rejection rate of semiconductor memory devices.

In the conventional redundant repair structure, however, the program elements are provided for both the rows and columns of the preliminary memory cell lines. Therefore, the chip having a huge capacity requires a significantly large chip area due to increase in number of the program elements.

Since transistors forming the memory cells have been scaled down in accordance with increase in capacity, increase in number of the transistors does not cause a significant problem in the area of the preliminary memory cell array. However, the program elements such as fuse elements are less scaled down compared with the memory cells. Accordingly, increase in number of the program elements significantly increases the layout area.

SUMMARY OF THE INVENTION

An object of the invention is to provide a semiconductor memory device capable of suppressing increase in layout area, which may be cause by employing the direct sensing system and the hierarchical I/O line structure for increasing the capacity and operation speed.

In summary, the present invention is a semiconductor memory device for reading and writing storage data in accordance with an address signal and including a plurality of memory cell blocks, read column select lines, column select circuits and read data transmitting circuits.

The plurality of memory cell blocks are arranged in a matrix of a first number of columns and a second number of rows, and each include a plurality of memory cells arranged in a matrix of rows and columns, bit line pairs arranged corresponding to the memory cell columns, respectively, and at least one first data I/O line pair for transmitting a read data from one of the memory cells selected according to an address signal.

The read column select lines instruct selection of at least one of the memory cell columns.

The column select circuit selectively activates at least one of the read column select lines in accordance with the address signal.

The read data transmitting circuits are provided corresponding to the memory cell blocks, respectively for transmitting the read data sent from the selected memory cell column onto the first data I/O line pair. Each read data transmitting circuit includes a plurality of first gate circuits provided corresponding to the memory cell columns, respectively, and being activated by the corresponding one among the read column select lines, and each of the first gate circuits has a first read gate switch for connecting the corresponding read column select line to one line of the first data I/O line pair in accordance with the potential level on one line of the bit line pair, and a second read gate switch for connecting the corresponding read column select line to the other line of the paired first data I/O line pair in accordance with the potential level on the other line of the bit line pair.

According to another aspect of the invention, a semiconductor memory device for reading and writing the storage data in accordance with an address signal, includes a plurality of memory cell blocks, a plurality of read column select lines, column select circuits, global data I/O line pairs, read data transmitting circuits and a column select line switching circuit.

The plurality of memory cell blocks are arranged in a matrix of a first number of columns and a second number of rows, and each including a plurality of memory cells arranged in a matrix of rows and columns, bit line pairs arranged corresponding to the memory cell columns, respectively, and at least one first data I/O line pair transmitting a read data read from one of the memory cells.

The plurality of read column select lines instruct selection of one of the memory cell columns.

The column select circuits are provided corresponding to the memory cell blocks, respectively, and selectively activates at least one read column selects line in accordance with the address signal.

The global data I/O line pairs are provided in common for the second plurality of the memory cell blocks belonging to the identical column of the memory cell blocks, and are connected to the first data I/O line pairs of the second plurality of the memory cell blocks.

The read data transmitting circuits transmit the read data from the selected memory cell column onto the global data I/O line pair, and are provided corresponding to the memory cell blocks, respectively. Each of read data transmitting circuits includes a third number of fourth gate circuits each provided for each of the memory cell columns in each of the memory cell blocks, each of fourth gate circuits being activated by a corresponding one of the read column select lines. The fourth gate circuits each have a fifth read gate switch for connecting the corresponding read column select line to a first one out of the remainder of the read column select lines in accordance with the potential level on one line of the bit line pair, and a sixth read gate switch for connecting the corresponding read column select line to a second one out of the remainder of the read column select lines in accordance with the potential level on the other line of the bit line pair and a plurality of column select line switching circuits each for connecting the first and second read column select lines to the lines of said global data I/O line pair, respectively, in accordance with an instruction from a corresponding one of the column select circuits.

According to still another aspect of the invention, the invention provides a semiconductor memory device for reading and writing storage data in accordance with an address signal, including a regular memory cell array and a redundant repair circuit.

The regular memory cell array has a plurality of regular memory cells arranged in rows and columns, and is divided into a plurality of regular memory cell groups each having at least one memory cell row and at least one memory cell column having, a correspondence established in advance with each other.

The redundant repair circuit is provided for repairing a regular memory cell having a defect, and includes a plurality of spare memory cell groups, a plurality of replacement address storing circuits and an address comparing circuit.

The plurality of spare memory cell groups are replaced with the regular memory cell groups when the address signal matches with a replacement address.

Each of the spare memory cell groups includes spare memory cell rows and spare memory cell columns being equal in number to the memory cell rows and the memory cell columns of each of the regular memory cell groups, respectively.

The plurality of replacement address storage circuits are provided for the spare memory cell groups, and store, as the replacement addresses, the addresses corresponding to the regular memory cell groups containing the defective memory cells, respectively.

The address comparing circuit instructs repairing of the regular memory cell in accordance with the comparison between the address signal and the replacement address.

Accordingly, the invention can achieve the following major advantage. Since the read operation based on the direct sensing method can be executed by the column select gates formed of a reduced number of circuit elements, the direct sensing method and the hierarchical I/O line structure can be employed for increasing the capacity and the operation speed while suppressing increase in the layout area.

Since the column select line can be used also as the data I/O line, lines can be reduced in number, and therefore the layout area can be further reduced.

Moreover, the replacement address storing circuits are arranged to have a correspondence with both the row addresses and the column addresses for storing the address of the defective memory cell. Therefore, the replacement address storing circuits can be reduced in number while maintaining the redundant repair performance, and the defective memory cell can be repaired with a reduced layout area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in detail with reference to the drawings. In the figures, the same or corresponding portions bear the same reference numbers.

First Embodiment

Figure 1:
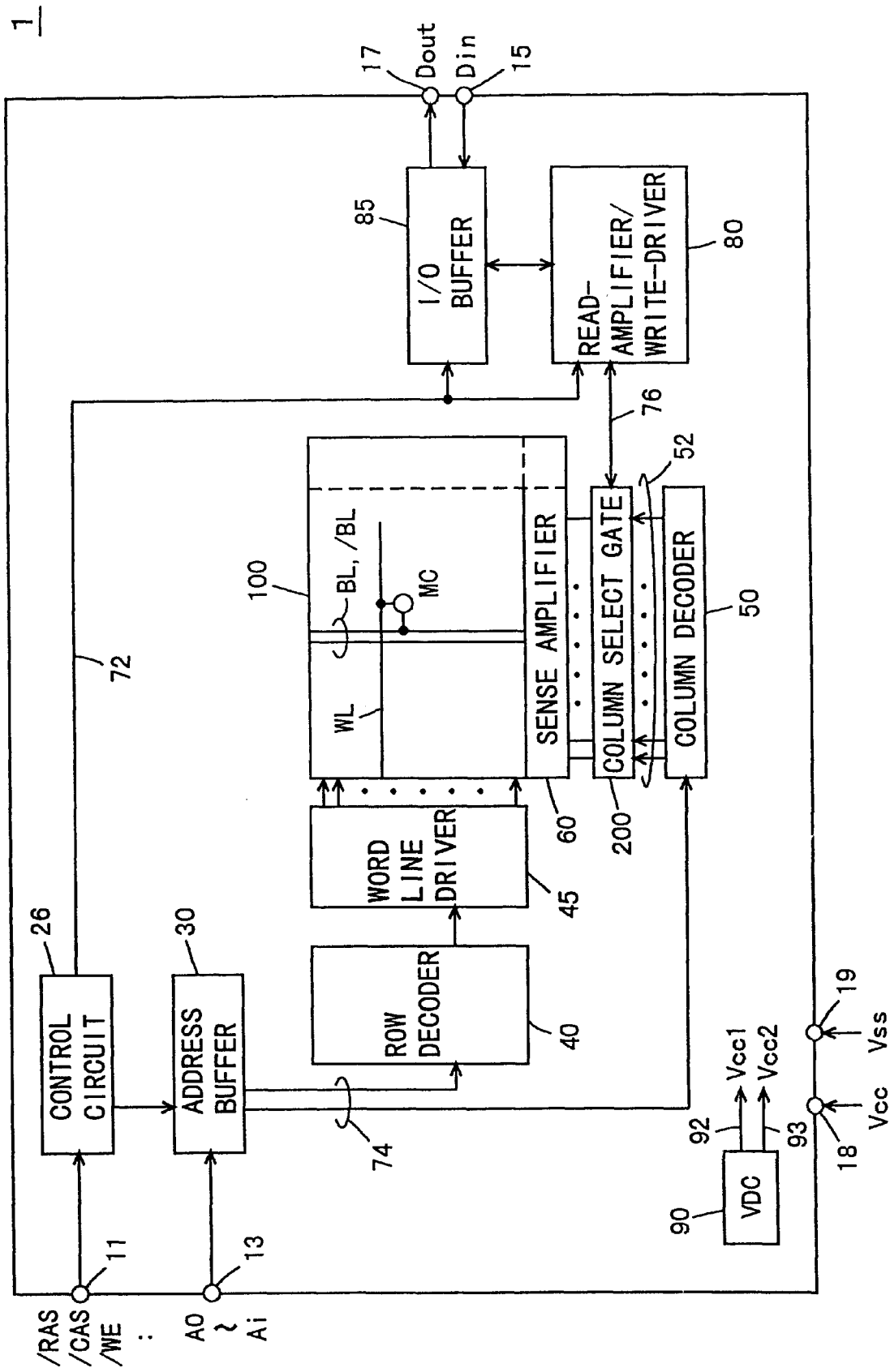
FIG. 1 is a schematic block diagram showing a whole structure of a semiconductor memory device 1 of a first embodiment 1 of the present invention.

FIG. 1 is a schematic block diagram showing a whole structure of a semiconductor memory device 1 of a first embodiment of the present invention.

Referring to FIG. 1, a semiconductor memory device 1 includes a control signal input terminal 11 receiving control signals such as a row address strobe signal /RAS, a column address strobe signal /CAS and a write enable signal /WE, an address input terminal 13 receiving address signals A0–Ai (i: natural number), a data input terminal 15 for data input, a data output terminal 17 for data output, a Vcc terminal 18 receiving a power supply potential Vcc and a Vss terminal 19 receiving a ground voltage Vss.

Semiconductor memory device 1 further includes a control circuit 26 which operates in accordance with the control signals to generate internal control signals for controlling a whole operation of semiconductor memory device 1, an internal control signal bus 72 transmitting the internal control signals, an address buffer 30 which receives an external address signal from address input terminal 13 and generates an internal address signal, and a memory cell array 100 having a plurality of memory cells MC arranged in a matrix form, i.e., in rows and columns.

Although not shown, each memory cell MC is formed of a capacitor for holding data and an access transistor having a gate which is connected to a word line WL corresponding to each row.

In memory cell array 100, word line WL is provided correspondingly to each row of the memory cells, and bit line pair BL and /BL is provided for each column of the memory cells. In accordance with the internal address signal transmitted through an address bus 74, row and column decoders 40 and 50 select the row and column of memory cells, respectively.

In accordance with the output of row decoder 40, a word line driver 45 selectively activates corresponding word line WL. Column decoder 50 activates a column select signal. The column select signal is applied to a column select gate 200 via a column select line 52. Column select gate 200 selectively connects sense amplifiers 60, which amplify the data on bit line pairs BL and /BL, to a global I/O line 76 in accordance with the column select signal. Global I/O line 76 transmits storage data sent to or from data I/O terminal 15 or data output terminal 17 via a read-amplifier/write-driver 80 and an I/O buffer 85. Thereby, storage data is transmitted between memory cells MC and data input terminal 15 or data output terminal 17.

Semiconductor memory device 1 further includes a VDC (Voltage Down Converter) 90 which generates a voltage Vcc1 corresponding to a potential at "H" level on the bit line pair and a voltage Vcc2 corresponding to a potential at "H" level on a global I/O line.

Figure 2:
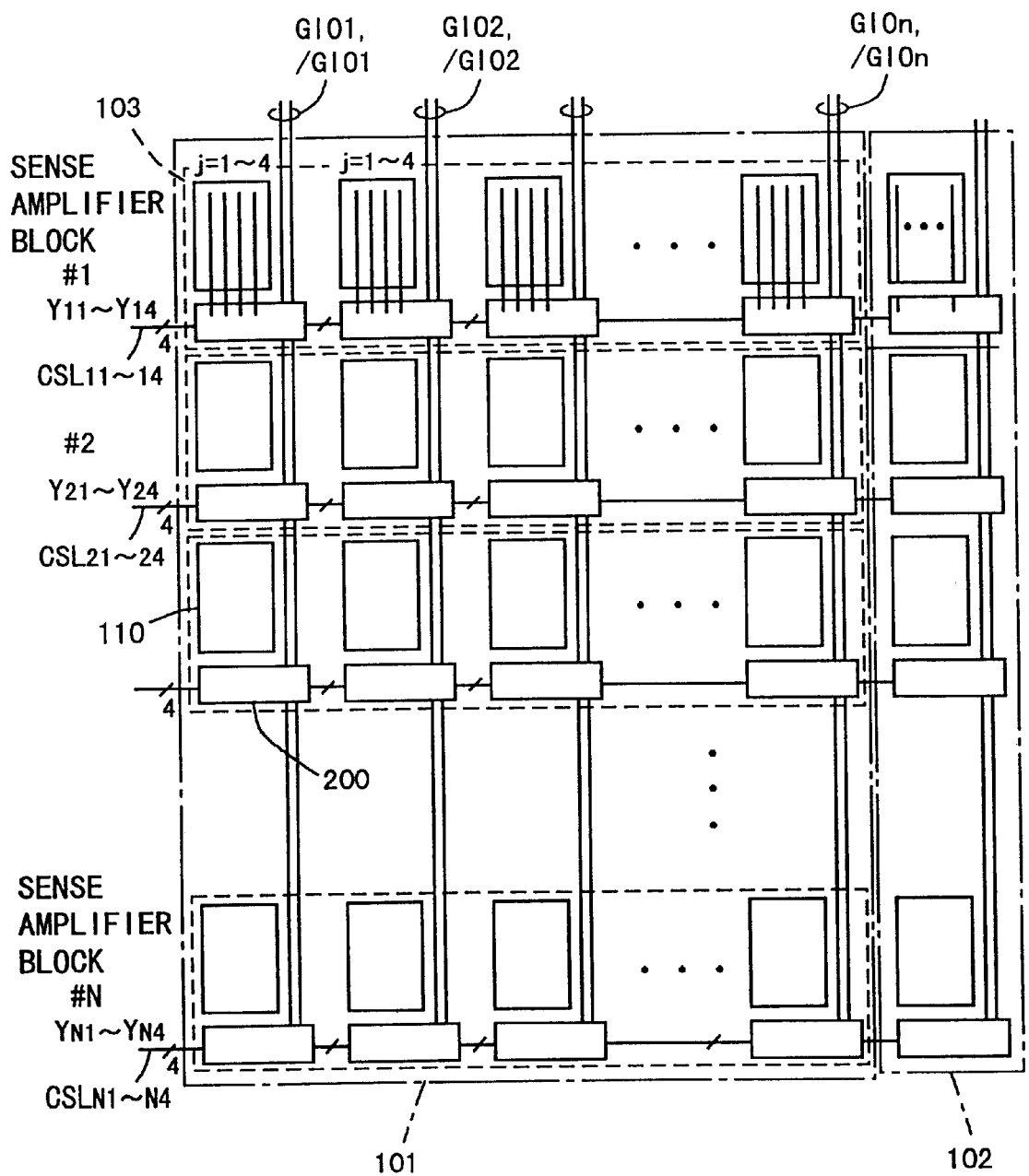
FIG. 2 schematically shows a structure of a memory cell array 100.

FIG. 2 schematically shows a structure of memory cell array 100 of semiconductor memory device 1 of the first embodiment of the present invention.

Referring to FIG. 2, memory cell array 100 is divided into a regular memory cell array 101 and a spare memory cell array 102 used for redundant repair. In regular memory cell array 101, each global I/O line pair is provided for four columns. Regular memory cell array 101 is provided with global I/O line pairs GIO1 and /GIO1–GIOn and /GIOn of n in number as a whole (n: natural number).

Semiconductor memory device 1 of the fist embodiment is intended to improve the number of data, which can be handled by one column selecting operation, i.e., the data rate by arranging a large number of global I/O line pairs in parallel. However, the structure wherein each global I/O line pair is provided for the four columns is shown only by way of example, and this specific structure does not limit the number of columns which are related to each global I/O line pair.

Regular memory cell array 101 includes divided sense amplifier blocks 103 of N in number which are arranged in the row direction (N: natural number). The sense amplifiers belonging to the same sense amplifier block are activated by a common sense amplifier activating signal.

As described above, regular memory cell array 101 is divided into sub-blocks 110 of (N×n) in number based on the corresponding global I/O line pairs and sense amplifier blocks. Sub-blocks 110 are arranged in rows of N in number and columns of n in number.

Column select gate 200 is provided for each sub-block 110. Column select gate 200 transmits data between bit line pair BL and /BL of the corresponding column and the global I/O line pair in accordance with a column select signal Yij.

Column select signal Yij includes a read column select signal YRij for performing column selection in the read operation, and a write column select signal YWij for performing column selection in the write operation. The suffix "i" represents the number indicating the position of the sense amplifier block, and the suffix "j" represents the number indicating the position of the column in the same sub-block (i=1–N, and j=1–4 in the first embodiment).

Column decoder 50 produces column select signal Yij for each sense amplifier block. In this embodiment, column select signals Y11–Y14, . . . , and YN1–YN4 are produced.

The column select line includes read column select line RCSLij and write column select line WCSLij. Read column select signal YRij is transmitted through read column select signal line RCSLij, and write column select signal YWij is transmitted through write column select line WCSLij.

Figure 3:
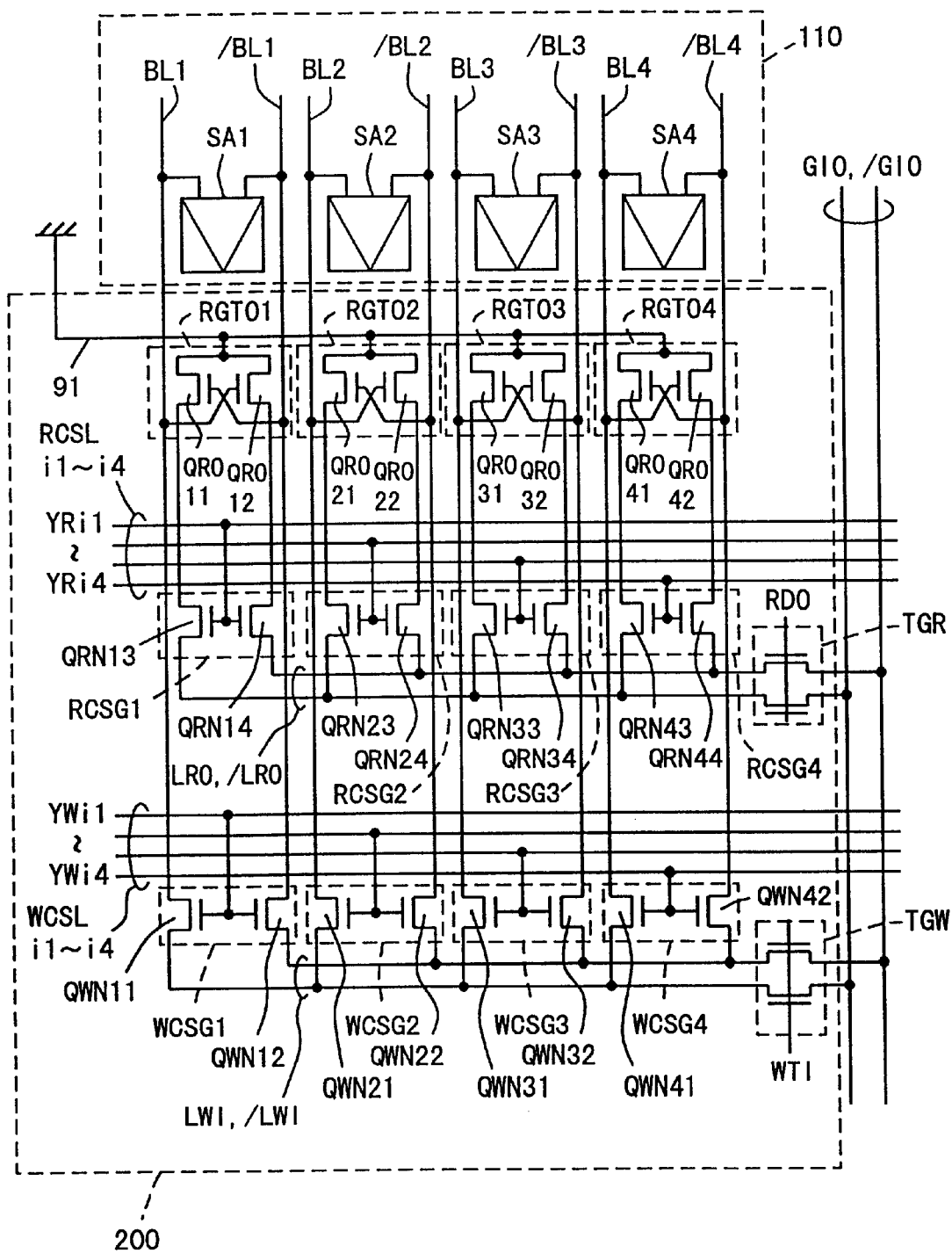
FIG. 3 is a circuit diagram showing a structure of a column select gate 200.

FIG. 3 is a circuit diagram showing the structure of column select gate 200 in greater detail.

Referring to FIG. 3, bit line pairs BL1 and /BL1–BL4–/BL4 are provided for four columns included in sub-block 110, respectively. The data read onto bit line pairs BL1 and /BL1–BL4 and /BL4 is amplified by sense amplifiers SA1–SA4, respectively.

For the read operation, column select gate 200 includes read gate circuits RGTO1–RGTO4 provided correspondingly to the respective columns, read column select gates RCSG1–RCSG4, and a local read line pair LRO and /LRO connected to global I/O line pair GIO and /GIO via a transistor gate TGR.

Read gate circuit RGTO1 has read gate transistors QRO11 and QRO12, and read column select gate RCSG1 has transistors QRN13 and QRO14. Read gate transistor QRN11 has a gate connected to bit line /BL1, and is connected between a ground interconnection 91 and transistor QRN13. Likewise, read gate transistor QRO12 has a gate connected to bit line BL1, and is connected between ground interconnection 91 and transistor QRN14.

Each of transistors QRN13 and QRN14 has a gate connected to read column select line RCSLi1 transmitting read column select signal YRi1, and is responsive to read column select signal YRi1 to connect read gate transistors QRO11 and RQO12 to paired local read lines LRO and /LRO, respectively. Transistor gate TGR connects read local line pair LRO and /LRO to global I/O line pair GIO and /GIO in response to control signal RDO which is activated and attains "H" level in the read operation.

Owing to the above structure, one of read gate transistors QRO11 and QRO12, which corresponds to one of the paired bit lines transmitting the data at "H" level, is turned on to drive directly the local read line pair and global I/O line pair in accordance with activation of the read column select signal. Thereby, the voltage difference caused between paired global I/O lines GIO and /GIO is amplified by a main amplifier (not shown), and is taken out as the read data.

The structures and operations of read gate circuits RGTO2–RGTO4 and read column select gates RCS2–RCS4, which correspond to bit line pairs BL2 and /BL2–BL4 and /BL4, are the same as those described above, and therefore will not be repeated here.

Column select gate 200 further includes write column select gates WCSG1–WCSG4 related to the write operation, a transistor gate TGW which is turned on in response to a control signal WTI which is activated and attains "H" level in the write operation, and local write line pair LWI and /LWI connected to global I/O line pair GIO and /GIO via transistor gate TGW.

Write column select gate WCSG1 has a transistor QWN11 for connecting lines BL and LWI together, and a transistor QWN12 for connecting lines /BL and /LWI together. Transistors QWN11 and QWN12 have gates connected to write column select line WCSi1 transmitting write column select signal YWi1. Likewise, write column select gates WCSG2–WSCG4 include transistors QWN21–QWN42.

When write column select gates WCSG1–WCSG4 are turned on in response to write column select signals YWi1–YWi4, the data on global I/O line pair GIO and /GIO is written through local write line pair LWI and /LWI into the bit line pair which corresponds to the column selected by the write column select signal.

In the semiconductor memory device 1 of the first embodiment, the data rate can be improved by parallel arrangement of the many global I/O line pairs, and the speed of data read operation can be increased owing to employment of the direct sensing system.

Second Embodiment

Although the embodiment 1 can improve the data rate and the operation speed, an extremely large current must be supplied to ground line 91 because it is commonly used by the many read gate transistors. Therefore, ground line 91 must have a sufficiently large width. As a result of employment of the direct sensing system, the column select gate must be provided for each of read and write operations, and the read gate circuit must be provided as already described in connection with the prior art. Therefore, the elements increase in number. For the above reasons, the layout area disadvantageously increases in the foregoing first embodiment.

The second embodiment provides a structure of the column select gates for suppressing increase in layout area in the direct sensing system.

Figure 4:
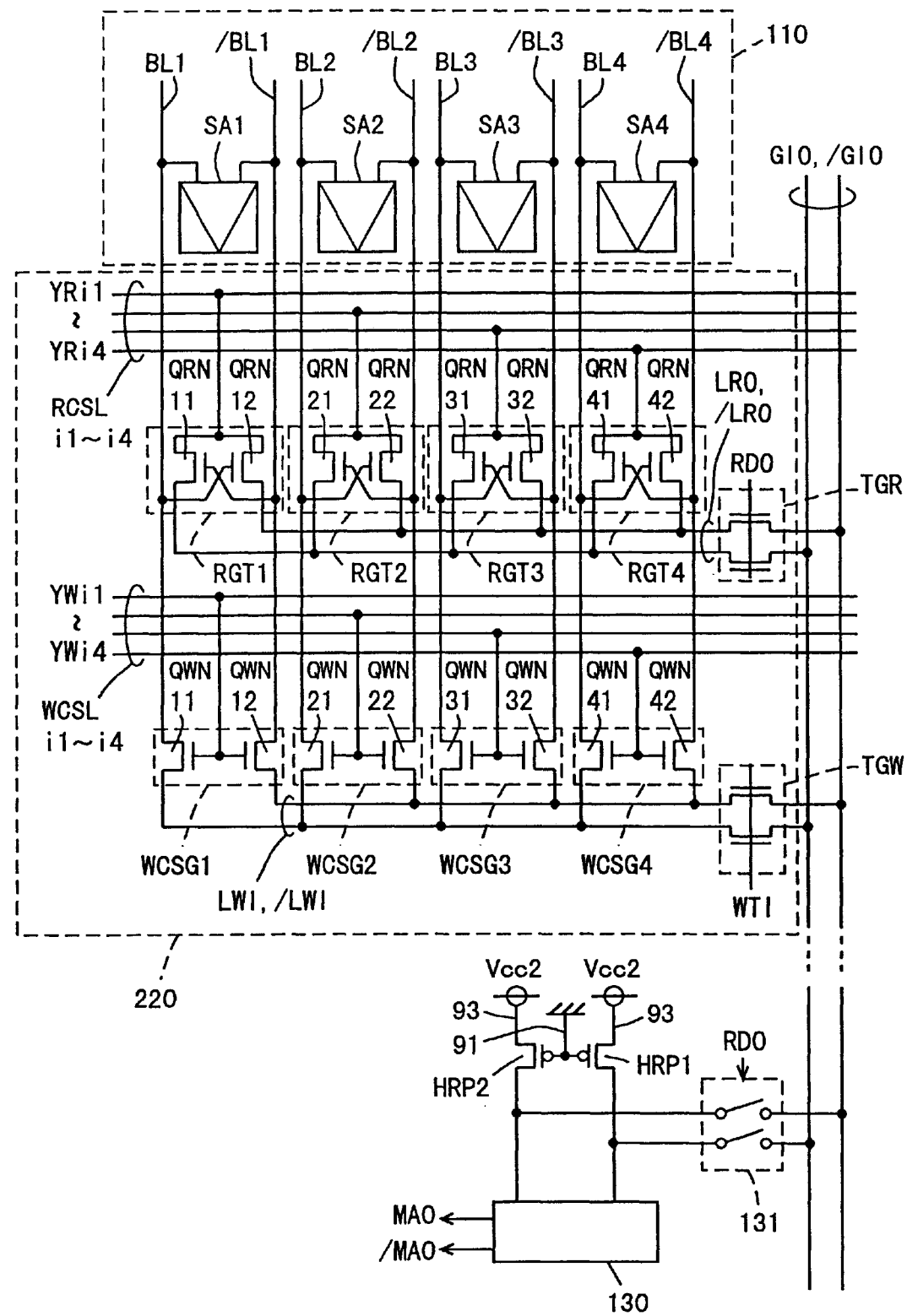
FIG. 4 is a circuit diagram showing a structure of a column select gate 220 of a second embodiment.

FIG. 4 is a circuit diagram showing a structure of a column select gate 220 of the second embodiment of the invention.

Referring to FIG. 4, read gates circuits RGT1–RGT4 of column select gate 220 differs from the read gate circuit of column select gate 200 in that the sources of the read gate transistors QRN11–QRN42 forming the read gate circuit are not connected to ground line 91, but are connected to read column select lines RCSLi1–RCSLi4 transmitting read column select signals YRi1–YRi4, respectively. Although description in greater detail will be given later, the above structure of the read gate circuit allows elimination of read column select gates RSCG1–RSCG4 in column select gate 200.

The structure of the second embodiment further differs from that of the first embodiment in that a read main amplifier 130, a Vcc2 power supply line 93, a precharge switch 131 and high-resistance loads HRP1 and HRP2 are provided for global I/O line pair GIO and /GIO.

Precharge switch 131 is controlled by a control signal RDO which is activated in response to the read operation, and connects global I/O line pair GIO and /GIO to Vcc2 power supply line 93 via high-resistance loads HRP1 and HRP2 for precharging to Vcc2 prior to the read operation. Main read amplifier 130 amplifies a voltage difference, which occurs on precharged global I/O line pair GIO and /GIO in response to selective turnon of any one of read gate circuits RGT1–RGT4.

Structures of write column select gates WCSG1–WCSG4 and transistors TGR and TGW are the same as those in column select gate 200, and therefore description will not be repeated here.

Among read column select signals YRi1–YRi4, the signal for the column to be selected is activated ("L" level), and the signals for the other columns are deactivated ("H" level). Thereby, the column select gate 220 is selectively supplied with the ground potential from the read column select line which is activated by the read column select signal. Therefore, the common ground line is not required, and the column selection can be performed without the read column select gate.

Description will now be given on the operation of column select gate 220 with reference to a waveform diagram showing various operation signals.

Figure 5:
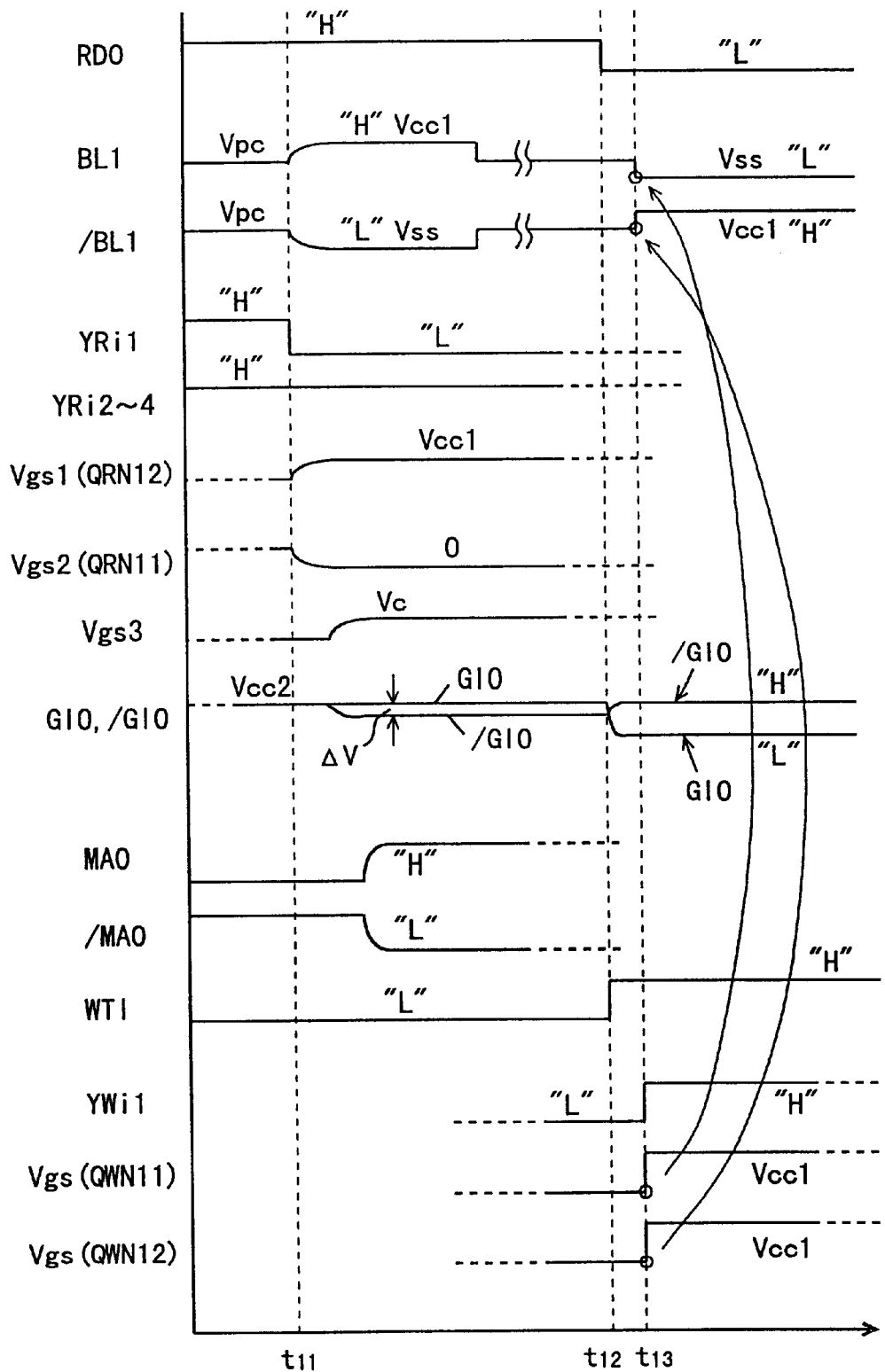
FIG. 5 is a waveform diagram showing various operation signals of column select gate 220.

FIG. 5 is the waveform diagram showing various operation signals related to column select gate 220.

FIG. 5 shows by way of example the read operation for reading "H" and "L" level data from paired bit lines BL1 and /BL1, respectively, and thereafter writing "L" and "H" levels data onto lines BL1 and /BL1, respectively.

At time t11, read column select signal YRi1 is activated ("L" level) for reading out the data on bit line pair BL1 and /BL1. Other read column select signals YRi2–YRi4 remain inactive ("H" level).

Prior to the above, control signal RDO is activated ("H" level) for starting the read operation Global I/O line pair GIO and /GIO is already precharged to potential Vcc2.

At the substantially same time as activation of read column select signal YRi1, the word line is activated, and data at "H" level and data at "L" level are read onto paired bit lines BL1 and /BL1, respectively.

Thereby, gate-source voltage Vgs1 of read gate transistor QRN12 attains Vcc1 (bit line amplitude) so that read gate transistor QRN12 is turned on. Meanwhile, a gate-source voltage Vgs2 of read gate transistor QRN11 receiving on its gate the potential on line /BL1 goes to 0, and maintains the off state.

When read gate transistor QRN12 is turned on, a current path including local read line /LRO and line /GIO in the global I/O line pair is formed from Vcc2 line 93 via high-resistance load HRP2, line /GIO and line /LRO to RCSLi1 (Vss) so that the potential on line /GIO lowers by ΔV from the precharge potential of Vcc2. Meanwhile, the potential on line GIO is kept at Vcc2.

Main read amplifier 130 amplifies the potential difference ΔV occurring on the global I/O line pair, and issues output signals MAO at "H" level and /MAO at "L" level.

In the case where the column select operation is performed via bit line pair BL1 and /BL1 as described above, a gate-source voltage Vgs3 rises to Vc (Vc=Vcc1−(Vcc2−ΔV)) in each of read gate transistors QRN22, QRN32 and QRN42, which are connected to line /GIO carrying the potential lowered by ΔV, among the read gate transistors corresponding to the other bit line pairs. For accurately performing the column selection in the above state, it is necessary that these read gate transistors QRN22, QRN32 and QRN42 maintain the off state, and in other words, that voltage Vc does not exceed a threshold voltage Vtn of read gate transistor.

Voltage drop ΔV can be expressed as ΔV=i·RH where i represents a current flowing through the foregoing current path, and RH represents a resistance value of the high-resistance load. Current i depends on the current drivability of read gate transistor.

In column select gate 220, therefore, the current drive performance of read gate transistor and resistance value RH of the high-resistance load must be set within a range satisfying the following formula (1):

$$Vcc2 - i \cdot RH > Vcc1 - Vtn \qquad (1)$$

Vcc1: "H" level potential on bit line pair
Vcc2: "H" level potential on global I/O line pair
Vth: threshold voltage of read gate transistor By using P-type MOS transistors in high-resistance loads HRP1 and HRP2, the potential difference occurring in the high-resistance loads can be clamped to a predetermined value or less so that the operation can be more stable.

According to the above structure and setting, it is not necessary to provide the ground line and read column select gate, and it is possible to provide column select gate 220 achieving an effect similar to that of column select gate 200 while suppressing increase in layout area.

The write operation will now be described below. At time t12, a control signal WTI is activated so that global I/O lines GIO and /GIO are supplied with write data at "L" and "H" levels, respectively.

At time t13, write column select signal YWi1 is activated so that transistors QWN11 and QWN12 forming write column select gate WSCG1 are turned on, and the data at "L" and "H" levels on global I/O line pair are written onto bit line pair BL1 and /BL1 via local write lines LWI and /LWI.

First Modification of the Second Embodiment

Figure 6:
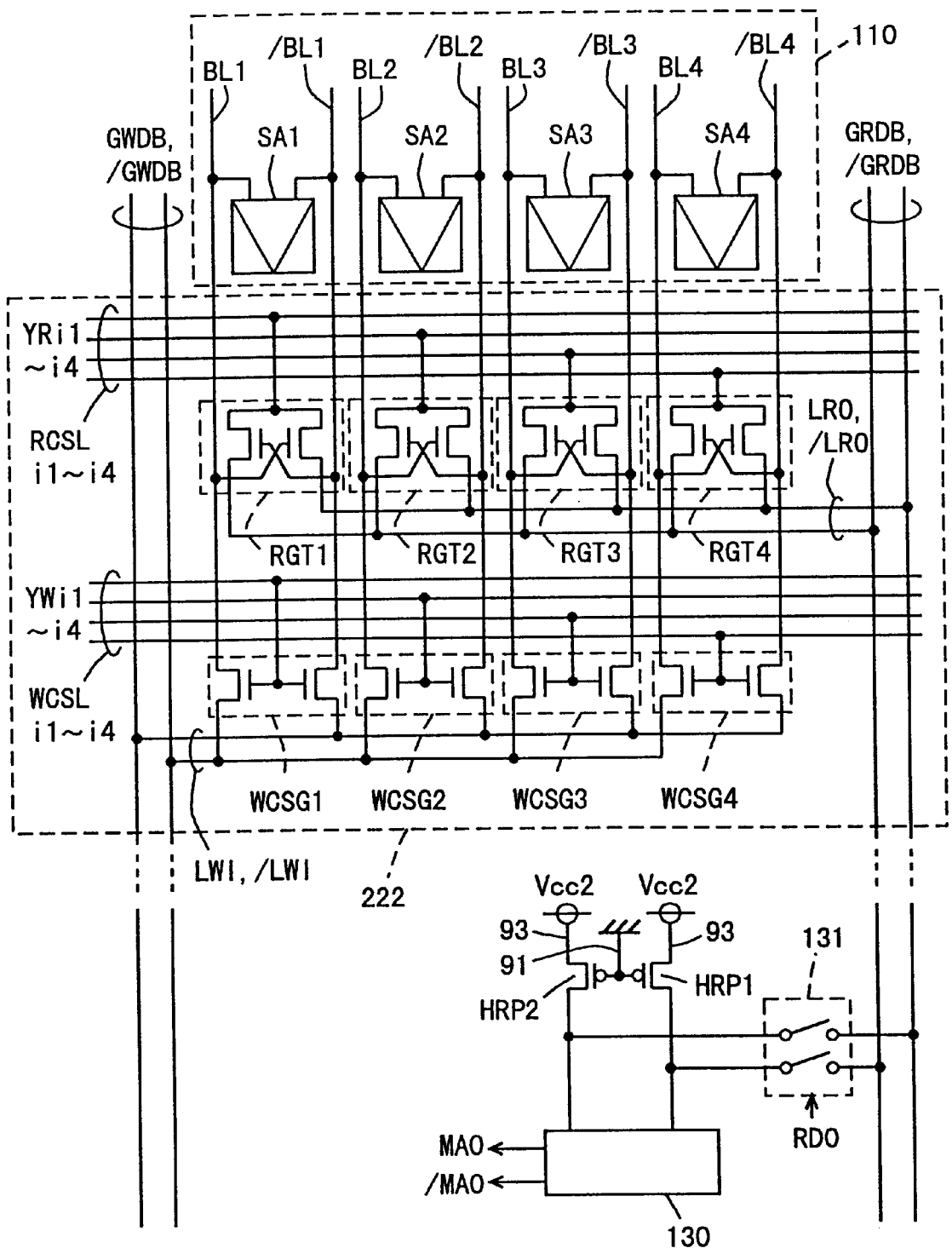
FIG. 6 shows a structure of a circuit related to column selection of a semiconductor memory device of a modification of the second embodiment.

FIG. 6 shows a first modification of the second embodiment of the present invention, and more particularly shows a structure of a circuit related to column selection of a semiconductor memory device.

Referring to FIG. 6, the semiconductor memory device of the first modification of the second embodiment has such a feature that global I/O line pair GIO and /GIO are divided into read global data bus pair GRDB and /GRDB dedicated to read data as well as write global data bus pair GWDB and /GWDB which is dedicated to write data and is arranged independently of read global data bus pair GRDB and /GRDB.

By dividing the global I/O line pair into the read and write global data bus pairs as described above, transistor gates TGR and TGW which are controlled in accordance with signals RDO and WTI, respectively, can be eliminated in column select gate 222, and the circuit elements can be reduced in number. Structures and operations other than the above are similar to those of column select gate 220, and therefore description will not be repeated below.

By dividing the global data lines into those for reading and writing, the read operation and the write operation can be completely isolated from each other so that both the operations can be completely performed in parallel, and the data processing performance can be further improved.

Second Modification of the Second Embodiment

Figure 7:
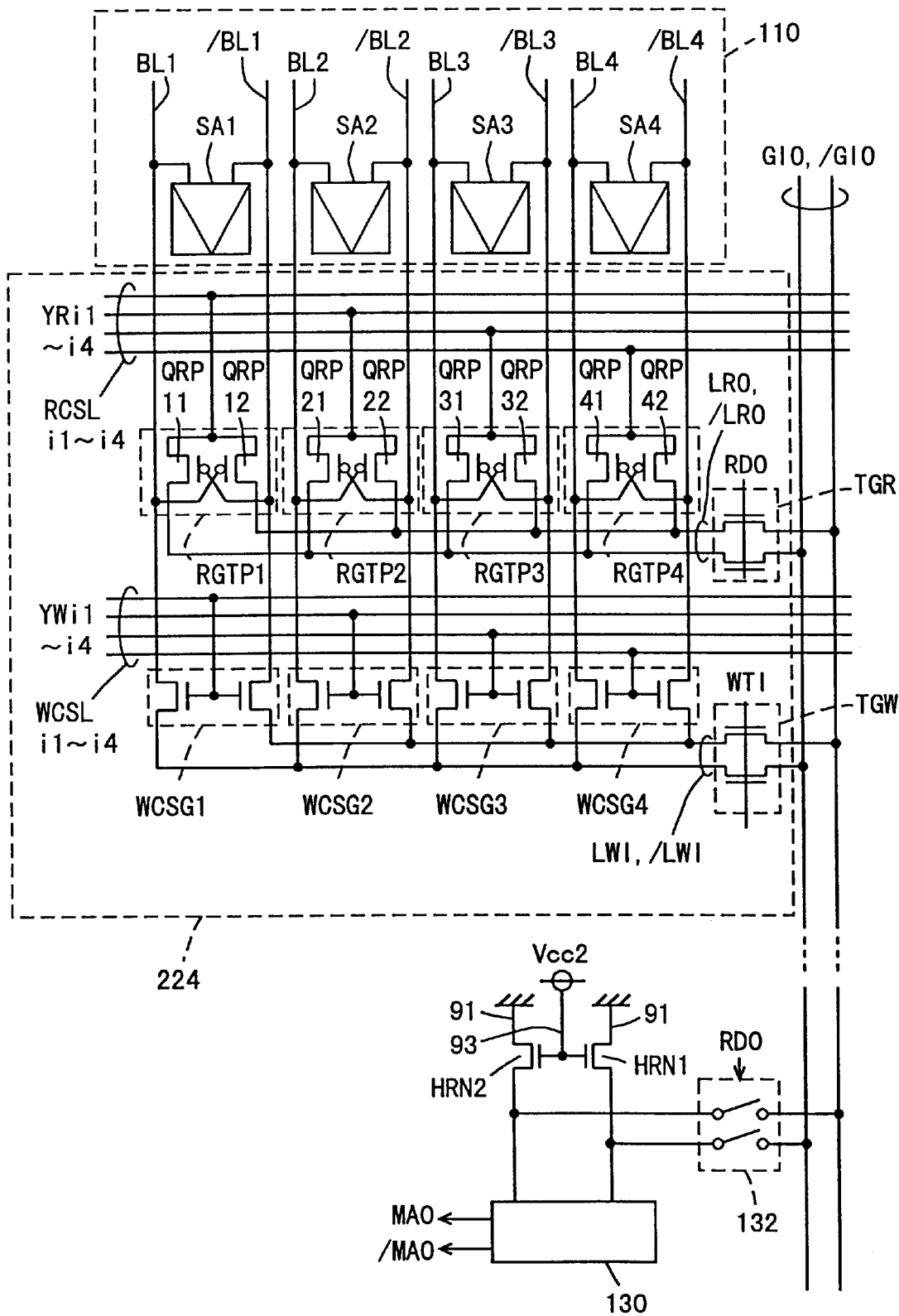
FIG. 7 shows a structure of a circuit related to column selection of a semiconductor memory device of another modification of the second embodiment.

FIG. 7 shows a semiconductor memory device of a second modification of the second embodiment, and particularly a structure of a circuit related to column selection.

Referring to FIG. 7, the semiconductor memory device of the second modification of the second embodiment includes a column select gate 224 having such a feature that read gate transistors QRP11–QRP42 forming read data circuits RGTP1–RGTP4 are formed of P-type MOS transistors. As described above, the structure of the column select gate already described in the second embodiment can be achieved by employing the P-type MOS transistors as the read gate transistors.

In column select gate 224, the read column select signal corresponding to the selected column is active high ("H" level), and is inactive low ("L" level).

Global I/O line pair GIO and /GIO is precharged to potential Vss by a precharge switches 132 and high-resistance loads HRN1 and HRN2 in the read operation.

When the current path is formed, read gate transistor connected to the inactive read column select line is not turned on because a voltage rise by ΔV' occurs on the global I/O line pair. In the column select gate 224, therefore, such a design must be employed that the current drive performance of read gate transistor and the resistance value of the high-resistance load fall within ranges satisfying the following formula (2):

$$i \cdot RH < Vtp \qquad (2)$$

i: current drivability of read gate transistor
RH: resistance value of high-resistance load
Vtp: threshold voltage of read gate transistor QRP Structures and operations other than the above are similar to those of column select gate 220, and therefore description will not be repeated below.

Third Modification of the Second Embodiment

In a third modification of the second embodiment, a hierarchical I/O line structure is applied to the semiconductor memory device, and particularly is applied to the plurality of sub-blocks including column select gates 220 of the second embodiment.

Figure 8:
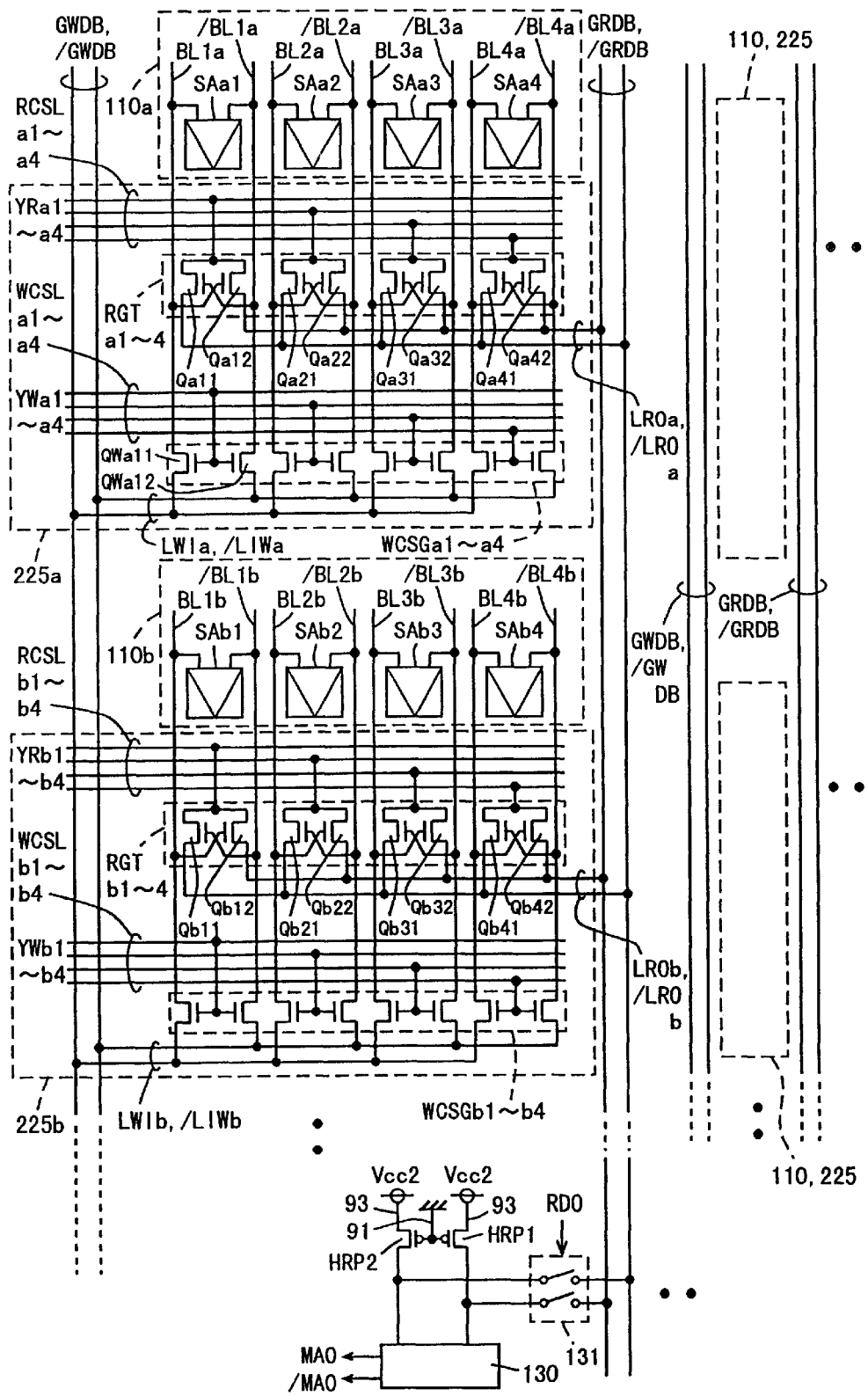
FIG. 8 is a schematic view showing a structure of a circuit related to column selection of a semiconductor memory device of the second embodiment employing hierarchical I/O lines.

FIG. 8 schematically shows the semiconductor memory device of the third modification of the second embodiment of the present invention employing the hierarchical I/O lines, and particularly a structure of a circuit related to column selection.

Referring to FIG. 8, the semiconductor memory device of the second embodiment of the present invention employs the hierarchical I/O lines. In this semiconductor memory device, global read data bus pair RGDB and /RGDB as well as global write data bus pair GWDB and /GWDB are arranged commonly to a plurality of sub-blocks 110*a*, 110*b*, . . . .

A column select gate 225*a*, a local read line pair LROa and /LROa, and a local write line pair LWIa and /LWIa are provided correspondingly to sub-block 110*a*. Likewise, a column select gate 225*b*, a local read line pair LROb and /LROb, and a local write line pair LWIb and /LWIb are provided correspondingly to sub-block 110*b*.

Column select gate 225*a* includes read gate circuits RGTa1–RGTa4 and write column select gates WCSGa1–WCSGa4, which are provided correspondingly to bit line pairs BL1a and /BL1a–BL4a and /BL4a.

Read gate circuit RGTa1 includes N-type MOS transistors Qa11 and Qa12. Transistors Qa11 and Qa12 are connected to bit line pair BL1a and /BL1a as well as a read column select line RCSLa1 in a manner similar to that in column select gate 222. Other circuits RGTa2–RGTa4 have similar structures. Write column select gate WCSGa1 includes N-type MOS transistors QWa11 and QWa12. Transistors QWa11 and QWa12 are connected to bit line pair BL1a and /BL1a as well as a write column select line WCSLa1 in a manner similar to that in column select gate 222. Other write column select gates WCSGa2–WCSGa4 have similar structures.

Column select gate 225a receives read column select signals YRaj (j=1–4) produced for the sense amplifier blocks belonging to sub-block 110a via read column select lines RCSLa1–RCSLa4, respectively, and also receives write column select signals YWaj (j=1–4) produced for the sense amplifier blocks belonging to sub-block 110a via write column select lines WCSLa1–WCSLa4, respectively. Operations of read gate circuits RGTa1–RGTa4 and write column select gates WCSGa1–WCSGa4, which are performed with respect to read and write column select signals YRaj and YWaj applied thereto, are similar to that of column select gate 222, and therefore will not be repeated.

Likewise, column select gate 225b includes read gate circuits RGT1–RGT4 and write column select gates WCSGb1–WCSGb4, which are provided correspondingly to sub-bit line pairs BL1b and /BL1b–BL4b and /BL4b in the sub-block, respectively.

Column select gate 225b receives read column select signals YRbj (j=1–4) and write column select signals YWbj (j=1–4), which are produced for the sense amplifier blocks belonging to sub-block 110b, via read column select lines RCSLb1–RCSLb4 and write column select lines WCSLb1–WCSLb4, respectively. Operations of read gate circuits RGTb1–RGTb4 and write column select gates WCSGb1–WCSGb4, which are performed with respect to read and write column select signals YRbj and YWbj applied thereto, is similar to that of column select gate 225a.

Sub-blocks 110a and 110b belong to different sense amplifier blocks, respectively, and sense amplifiers SAa1–SAa4 are activated independently of sense amplifier SAb1–SAb4.

In the semiconductor memory device of the third modification of the second embodiment, the global read data bus pair is commonly used by the sub-blocks belonging to the different sense amplifier blocks. Therefore, in order to perform the column select operation without an error, the read gate transistor corresponding to the inactive read column select signal in the unselected sub-block must maintain the off state when the data is read onto the global read data bus pair.

Figure 9:
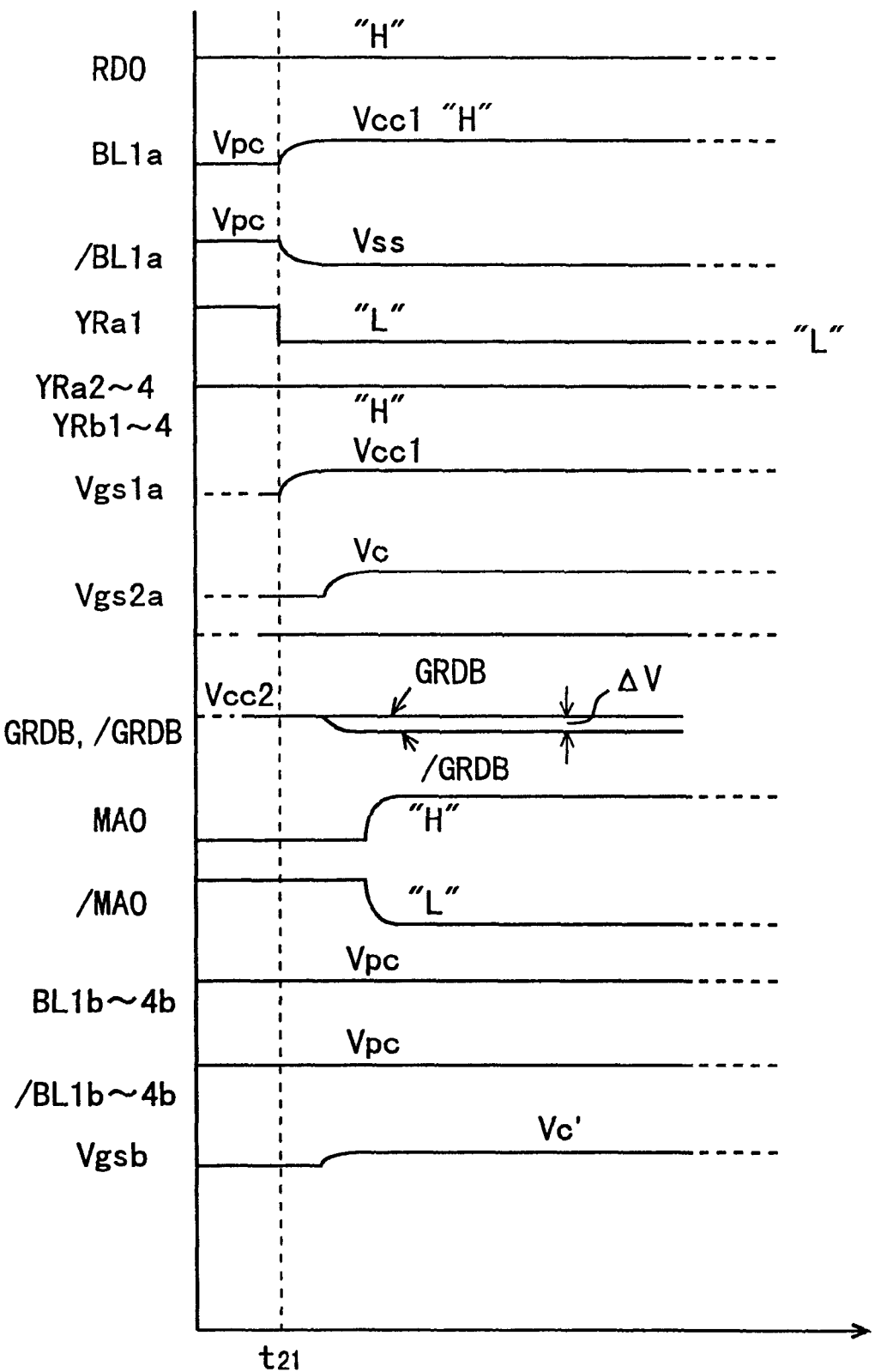
FIG. 9 is a waveform diagram showing operation signals on various portions of the semiconductor memory device in FIG. 8.

FIG. 9 is a waveform diagram of operation signals of various portions in the semiconductor memory device shown in FIG. 8.

FIG. 9 shows by way of example the read operation of reading the data at "H" and "L" level from paired bit line BL1a and /BL1a in sub-block 110a, respectively.

At time t21, read column select signal YRa1 is activated ("L" level) for reading the data on bit line pair BL1a and /BL1a. Other read column select signals YRa2–YRa4 and YRb1–YRb4 are inactive and therefore at "H" level.

Prior to this, control signal RDO is activated ("H" level) for starting the read operation, and global read data bus line pair GRDB and /GRDB is already precharged to the potential of Vcc2.

At the substantially same time as activation of read column select signal YRa1, the word line is activated, and data at "H" and "L" levels are read onto paired bit lines BL1a and /BL1a, respectively.

Thereby, gate-source voltage Vgs1a of read gate transistor Qa12 goes to Vcc1 (bit line amplitude) so that read gate transistor Qa12 is turned on. However, read gate transistor Qa11 receiving the data on line /BL1a maintains the off state because the gate-source voltage thereof goes to 0.

In response to turn-on of read gate transistor Qa12, the potential on line /GRDB lowers by ΔV from the precharged potential of Vcc2, as already described with reference to FIG. 5. Line GRDB maintains the potential of Vcc2.

Main read amplifier 130 amplifies potential difference ΔV occurring on the global read data bus pair, and issues output signal MAO at "H" level and /MAO at "L" level.

In order to maintain the off state of the other read gate transistors included in sub-block 110a in the above state, the current drive performance of read gate transistor and resistance value RH of the high-resistance load must be designed so that gate-source voltage Vgs2a (=Vc) in read gate transistors Qa22, Qa32 and Qa42 connected to line /GRDB carrying the voltage lowered by ΔV may satisfy the foregoing formula (1).

In sub-block 110b which is not selected in the above state, since each bit line pair has been precharged to a precharge potential Vpc, gate-source voltage Vgsb in each of read gate transistors Qb12, Qb22, Qb32 and Qb42, which are connected to line /GRDB carrying the voltage lowered by ΔV, rises to Vc' (Vc'=Vpc−(Vcc2−ΔV)). In order to perform the column selection without an error, these read gate transistors must maintain the off state, and in other words voltage Vc' must not exceed threshold voltage Vtn of read gate transistor.

In column select gates 225a and 225b, therefore, the current drive performance of read gate transistor and resistance value RH of the high-resistance load must be set within the ranges satisfying the foregoing formula (1) and the following formula (3):

$$Vcc2 - i \cdot RH > Vpc - Vtn \quad (3)$$

Vpc: precharged potential of bit line pair
Vcc2: "H" level potential of global I/O line pair
Vtn: threshold voltage of read gate transistor
The write operation is performed similarly to that by column select gate 222, and therefore description will not be repeated.

Owing to the above structure and design, it is not necessary to provide the select switches between the local read/wuite line pairs and the global data bus line pair in each sub-block. Accordingly, the hierarchical I/O line structure can be employed for achieving advantageous increase in data transmission speed while preventing increase in layout area, which may be caused by provision of many switches for connection between the I/O line pairs.

Third Embodiment

In the third embodiment, a semiconductor memory device has another structure employing the hierarchical I/O line structure.

Figure 10:
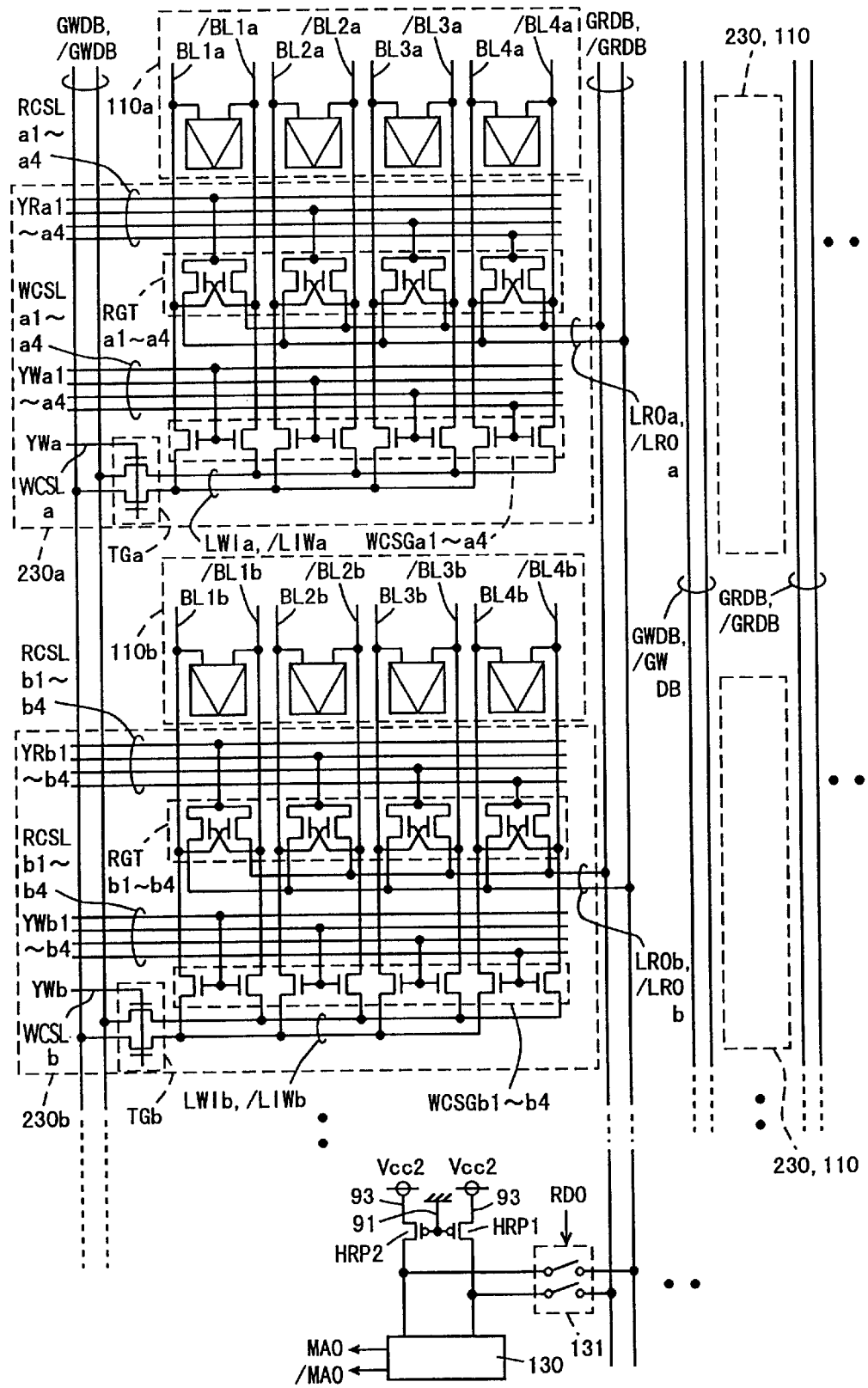
FIG. 10 shows a structure of a circuit related to column selection of a semiconductor memory device of the third embodiment.

FIG. 10 shows a structure of a circuit related to column selection of the semiconductor memory device of the third embodiment of the invention.

In the semiconductor memory device of the third embodiment shown in FIG. 10, write sub-block select lines WCSLa and WCSLb transmit decode signals YWa and YWb for the sense amplifier blocks, respectively. Decode signals YWa and YWb are activated ("H" level) for selecting one of the sub-blocks of N in number connected to the same global read data bus pair GRDB and /GRDB as well as the same write global data bus pair GWDB and /GWDB.

Column select gates 230a and 230b differ from column select gates 225a and 225b in that gates 230a and 230b further include transistor gates TGa and TGb, respectively, which are connected between the local write line pairs and the write global data bus. Transistor gate TGa is controlled by signal YWa, and transistor gate TGb is controlled by signal YWb.

When the sense amplifier block belonging to sub-block 110a is to be activated, transistor gate TGa is turned on. When the sense amplifier block belonging to sub-block 110b is to be activated, transistor gate TGb is turned on. The column select gates in the respective sub-blocks include similar transistors.

Other structures and operations are the same as those of column select gates 225a and 225b, and therefore will not be described.

In general, the data read operation is performed by amplifying a minute potential difference occurring on the data line pair, and the data write operation is performed by transmitting a voltage signal having an amplitude corresponding to "H" level onto one of the paired data lines. Therefore, a difference is likely to occur in operation speed between the data write operation and the data read operation, and the whole operation speed of the semiconductor memory device is restricted by the write operation speed in some cases.

According to the structure of the third embodiment, the parasitic capacitance of the I/O line pair in the write operation can be reduced, and therefore the speed of write operation can be increased so that the foregoing problems can be avoided, and the semiconductor memory device can have an increased operation speed.

Fourth Embodiment

In the first to third embodiments, the semiconductor memory devices have the structures for improving the data rate and enabling fast operations. For the column select gates of these embodiments, however, the read column select lines and write column select lines, which extend parallel with each other and in the row direction, are arranged on the same area as the sense amplifiers. There is a possibility that this arrangement increases the layout area, resulting in disadvantageous increase in chip area.

In the semiconductor memory devices of the fourth and fifth embodiments, at least a part of the read and write column select lines can be arranged along the column direction so that increase in layout area can be suppressed.

Figure 11:
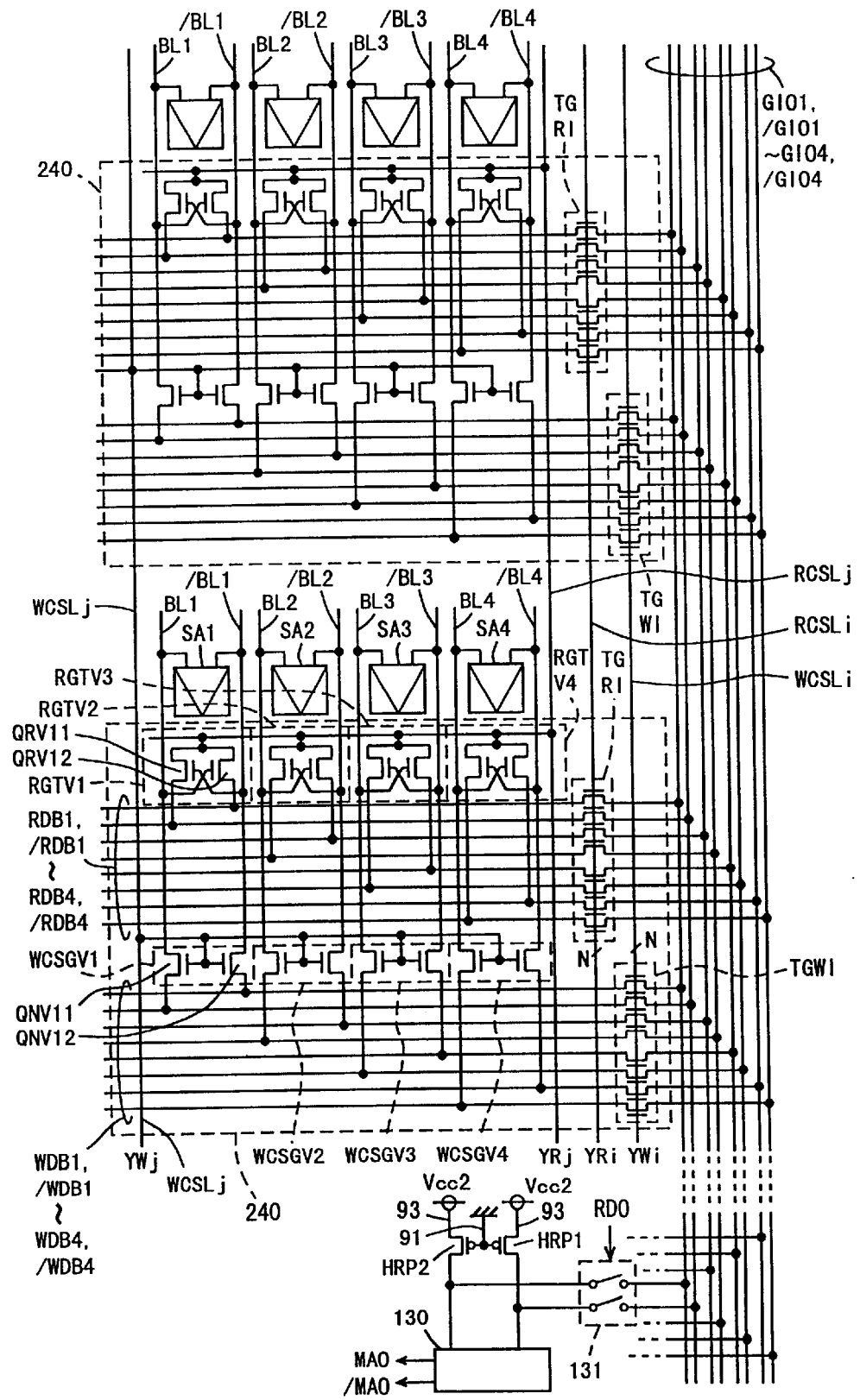
FIG. 11 is a circuit diagram showing a structure related to column selection of a semiconductor memory device of a fourth embodiment.

FIG. 11 schematically shows a structure of a circuit related to column selection of the semiconductor memory device of the fourth embodiment.

In the semiconductor memory device of the fourth embodiment shown in FIG. 11, read column select signals YRij and write column select signals YWij are divided into signals YRi and YWi produced by decoding the sense amplifier blocks, and signals YRj and YWj for selecting all the columns in the sub-block. Further, the column select lines transmitting the column select signals thus divided are arranged parallel with the bit line pairs so that remarkable increase in number of lines arranged in the row direction may be avoided, and thereby increase in layout area may be avoided.

In the semiconductor memory device of the fourth embodiment, read column select signal YRi (i=1–N) for each sense amplifier block is set independently of that for the other sense amplifier blocks for selecting one of N sense amplifier blocks, and is active when signal RDO is active and the corresponding sense amplifier block is selected.

Read column select signals YRj (j=1–n) employed in this structure are equal in number to the columns of the sub-blocks, and each are applied commonly to the sub-blocks of N in number arranged in the column direction. Each signal YRj selects all the columns in the N sub-blocks.

Signals YRi are transmitted through read column select lines RCSLi (i=1–N) of N in number, respectively. Signals YRj are transmitted through read column select lines RCSLj (j=1–n) of n in number.

Signals YWi (i=1–N) and YWj (j=1–n) are set similarly to signals YRi and YRj, and are transmitted through write column select lines WCSLi (i=1–N) of N in number and write column select lines WCSLj (j=1–n) of n in number, respectively.

Signals YRi, YWi and YWj are active high ("H" level). Signal YRj is active low ("L" level).

Read column select lines RCSLi and RCSLj as well as write column select lines WCSLi and WCSLj are arranged parallel with the bit line pair.

In column select gate 240 of the semiconductor memory device of the fourth embodiment, one column selecting operation brings about such a state that the data of all the columns belonging to the same sub-block are targets to be read or write. Therefore, read data bus pairs RDB1 and /RDB1–RDB4 and /RDB4 as well as write data bus pairs WDB1 and /WDB1–WDB4 and /WDB4 are employed in place of the local read line pairs and local write line pairs. Accordingly, the structure employs four global I/O line pairs GIO1 and /GIO1–GIO4 and /GIO4.

Main read amplifier and precharge switch are provided corresponding to each of global I/O line pairs. In FIG. 11, main read amplifier 130 and precharge switch 131 provided corresponding to global I/O line pair GIO1 and /GIO1 are representatively shown. Likewise, main read amplifier and precharge switch are provided corresponding to each of other global I/O line pairs GIO2 and /GIO2–GIO4 and /GIO4 (not shown).

Column select gate 240 includes read gate circuits RGTV1–RGTV4 as well as write column select gates WCSGV1–WCSGV4, which are arranged correspondingly to bit line pairs BL1 and /BL1–BL4 and /BL4, respectively.

Read gate circuit RGTV1 includes read gate transistors QRV11 and QRV12.

Read gate transistor QRV11 has a gate connected to line /BL1. When read column select line RCSLj is activated ("L" level), read gate transistor QRV11 connects one (/RDB1) of the paired read data buses to read column select line RCSLj, and thereby reads the data on line /BL1 onto bus /RDB1. Read gate transistor QRV12 has a gate connected to line BL1. When read column select line RCSLj is activated ("L" level), read gate transistor QRV12 connects the other (RDB1) of the paired read data buses to read column select line RCSLj, and thereby reads the data on line BL1 onto bus RDB1.

The read gate transistors included in read gate circuits RGTV2–RGTV4 are connected in a similar manner, and operate in the corresponding columns to read the data on the bit line pairs onto the corresponding read data line pairs, respectively.

Write column select gate WCSGV1 includes transistors QNV11 and QNV12. Transistor QNV11 has a gate connected to write column select line WCSLj. When write column select line WCSLj is activated ("H" level), transistor QNV11 connects one (WDB1) of the paired write data buses to line BL1, and thereby writes the data on bus WDB1 onto line BL1. Transistor QNV12 has a gate connected to write column select line WCSLj. When write column select line WCSLj is activated ("H" level), transistor QNV12 connects the other (/WDB1) of the paired write data buses to line /BL1, and thereby writes the data on bus /WDB1 onto line /BL1. Transistors included in write column select gates WCSGV2–WCSGV4 are connected in a similar manner, and operate in the corresponding columns to read the data on the write data bus pairs onto the corresponding bit line pairs, respectively.

Column select gate 240 further includes transistor gate TGRI. Transistor gates TGRI are provided correspondingly to the sub-blocks, respectively, and each connect the read data bus pairs to the global I/O line pairs when the corresponding sub-block is selected in response to activation ("H" level) of read column select signal YRi.

Column select gate 240 further includes transistor gates TGWI. Transistor gates TGWI are provided correspondingly to the sub-blocks, respectively, and each connect the corresponding write data bus pairs to the global I/O line pairs when the corresponding sub-block is selected in response to activation ("H" level) of write column select signal YWi.

Owing to the above structure, the column selecting operation can be accurately performed in spite of the fact that the read and write column select lines are arranged parallel with the bit line pairs, and it is possible to avoid disadvantageous increase in layout area, which may be cause by remarkable increase in number of the signal lines arranged in the same direction, while maintaining the foregoing advantages, i.e., fast data access owing to the direct sensing and improvement in data rate owing to the parallel arrangement of the global I/O line pairs.

First Modification of the Fourth Embodiment

Figure 12:
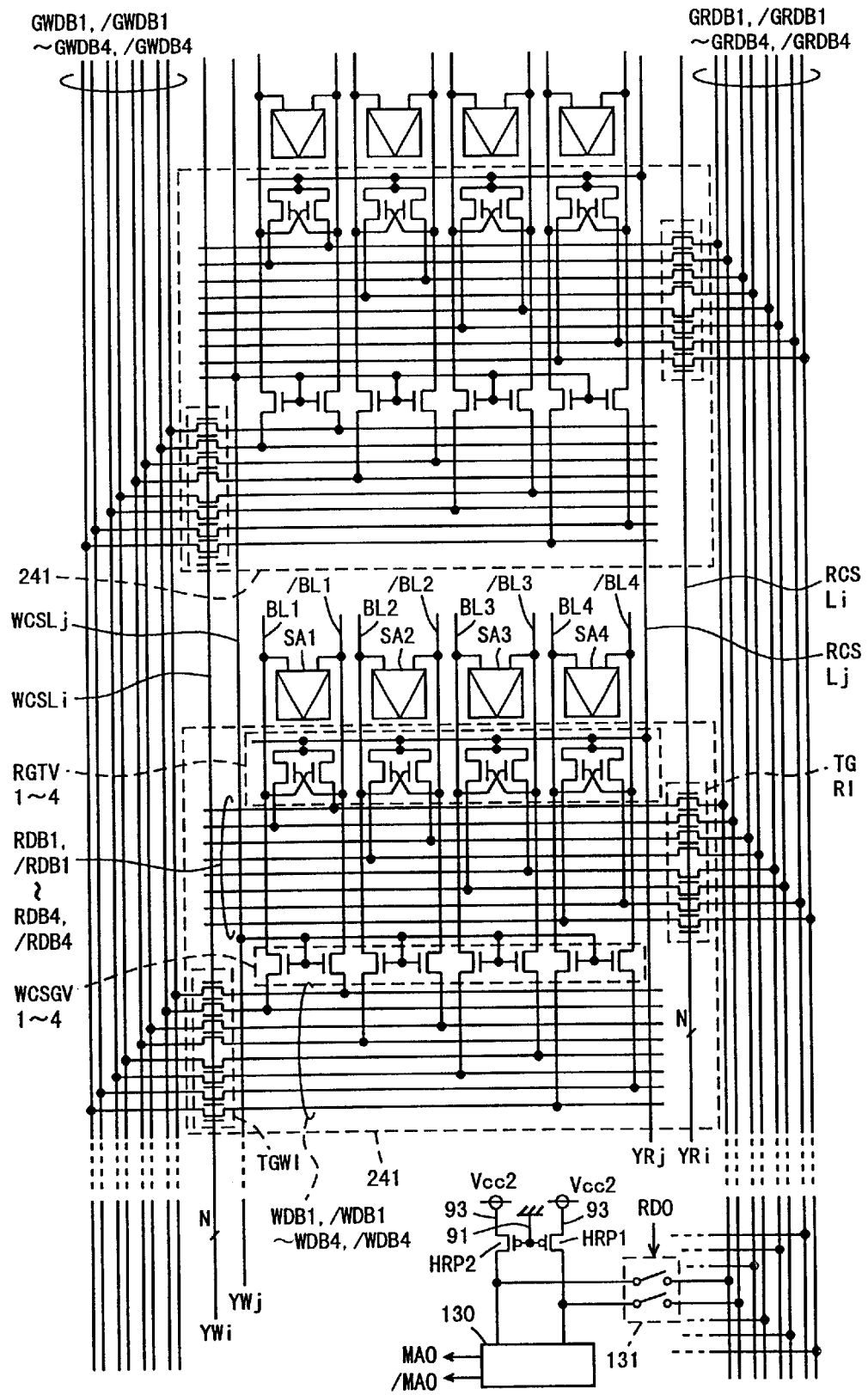
FIG. 12 is a circuit diagram showing a structure related to column selection of a semiconductor memory device of a modification of the fourth embodiment.

FIG. 12 is a circuit diagram showing a first modification of the fourth embodiment of the present invention, and particularly a structure of a circuit related to column section of the semiconductor memory device.

The semiconductor memory device of the first modification of the fourth embodiment in FIG. 12 has the same structure as the semiconductor memory device of the fourth embodiment, and additionally has such a structure that global I/O line pairs GIO1 and /GIO1–GIO4 and /GIO4 are divided into global read data bus pairs GRDB1 and /GRDB1–GRDB4 and /GRDB4 dedicated to read data as well as global write data bus pairs GWDB1 and /GWDB1–GWDB4 and /GWDB4 which are dedicated to write data and are independent of the global read data bus pairs.

By dividing the global data lines into lines for reading and lines for writing, the read operation and the write operation can be completely isolated from each other, and both the operations can be performed completely in parallel so that the data processing performance can be improved.

In the semiconductor memory device of the fourth embodiment, read column select signal YRi (i=1–N) for each sense amplifier block is set independently of that for the other sense amplifier blocks for selecting one of N sense amplifier blocks, and is active when signal RDO is active and the corresponding sense amplifier block is selected.

Read column select signals YRj (j=1–n) employed in this structure are equal in number to the columns of the sub-blocks, and each are applied commonly to the sub-blocks of N in number arranged in the column direction. Each signal YRj selects all the columns in the N sub-blocks.

Other structures and operations are the same as those of the fourth embodiment, and therefore description will not be repeated.

Second Modification of the Fourth Embodiment

Figure 13:
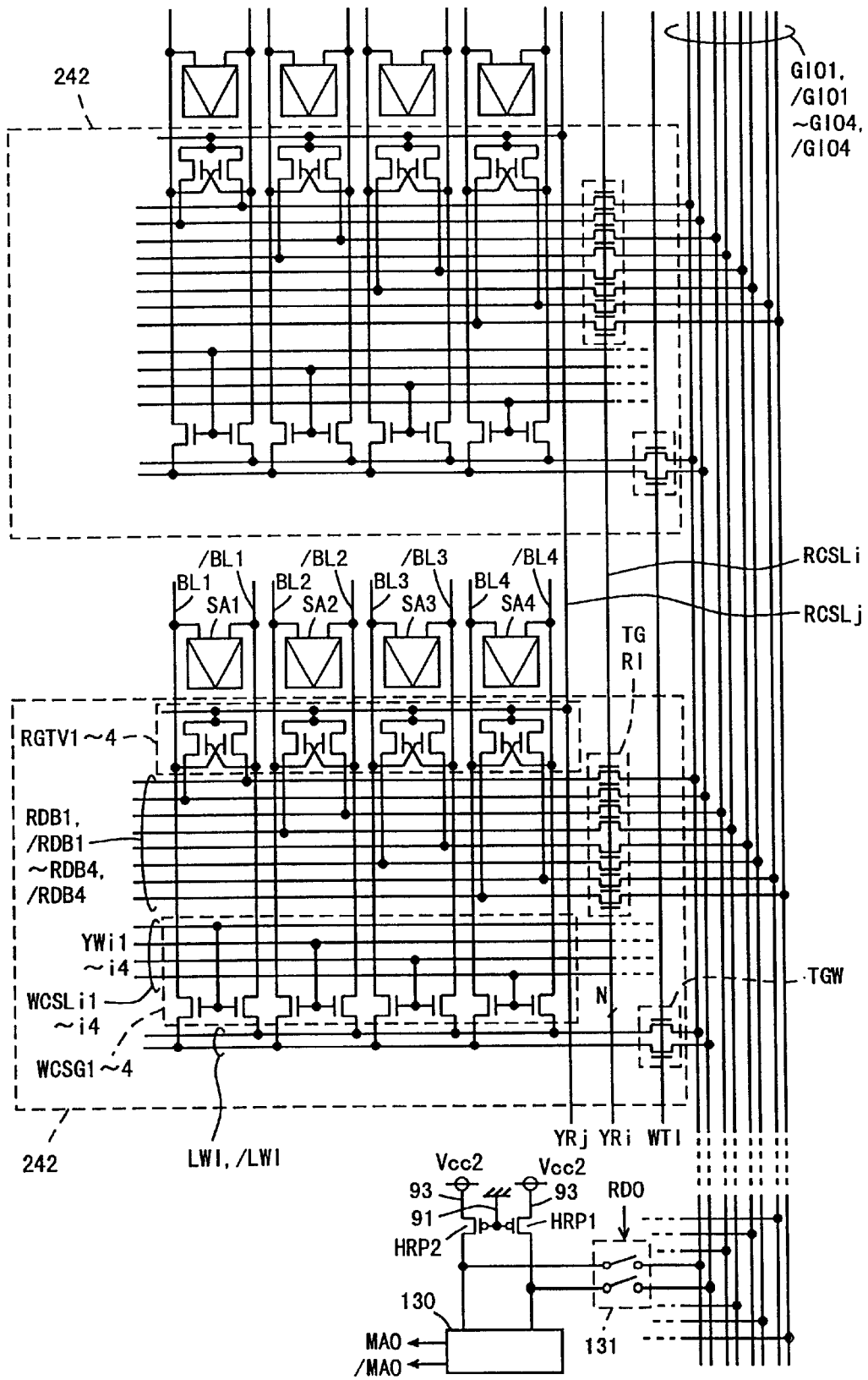
FIG. 13 is a circuit diagram showing a structure related to column selection of a semiconductor memory device of a second modification of the fourth embodiment.

FIG. 13 is a circuit diagram showing a semiconductor memory device of a second modification of the fourth embodiment, and particularly a structure of a circuit related to column selection.

In the semiconductor memory device of the second modification of the fourth embodiment, read column select signals YRij are divided into signals YRi, which are produced by decoding the sense amplifier blocks, and signals YRj for selecting all the columns in the sub-block (i=1–N, j=1–n), similarly to the fourth embodiment. However, write column select signals YWij are set as YWij (i: sense amplifier block number, j: the number indicating the position of column in the same sub-block) similarly to the second embodiment.

In the semiconductor memory device shown in FIG. 13, a column select gate 242 includes read gate circuits RGTV1–RGTV4, write column select gates WCSG1–WCSG4 and a transistor gate TGWI. Structures and operations of read gate circuits RGTV1–RGTV4 and transistor gate TGWI are the same as those in the fourth embodiment, and structures and operations of write column select gates WCSG1–WCSG4 are the same as those in the second embodiment. Therefore, description of these structures and operations will not be repeated.

By employing the column select signals and column select gates having the structure described above, read column select lines RCSLi and RCSLj transmitting read column select signals YRi and YRj are arranged parallel with the bit line pairs, as is done in FIG. 11, and write column select lines WCSLi1–WCSLi4 transmitting write column select signals YWi1–YWi4 are arranged perpendicularly to the bit line pairs. Thus, read column select lines RCSLi and RCSLj are perpendicular to write column select lines WCSLij.

Owing to the above structure, the column select lines are arranged in a distributed fashion so that some lines are parallel with the bit line pair and the others are perpendicular to the same. Therefore, concentration of the lines can be reduced in both the row and column directions, and the interconnections can be arranged without great difficulty in layout.

Third Modification of the Fourth Embodiment

Figure 14:
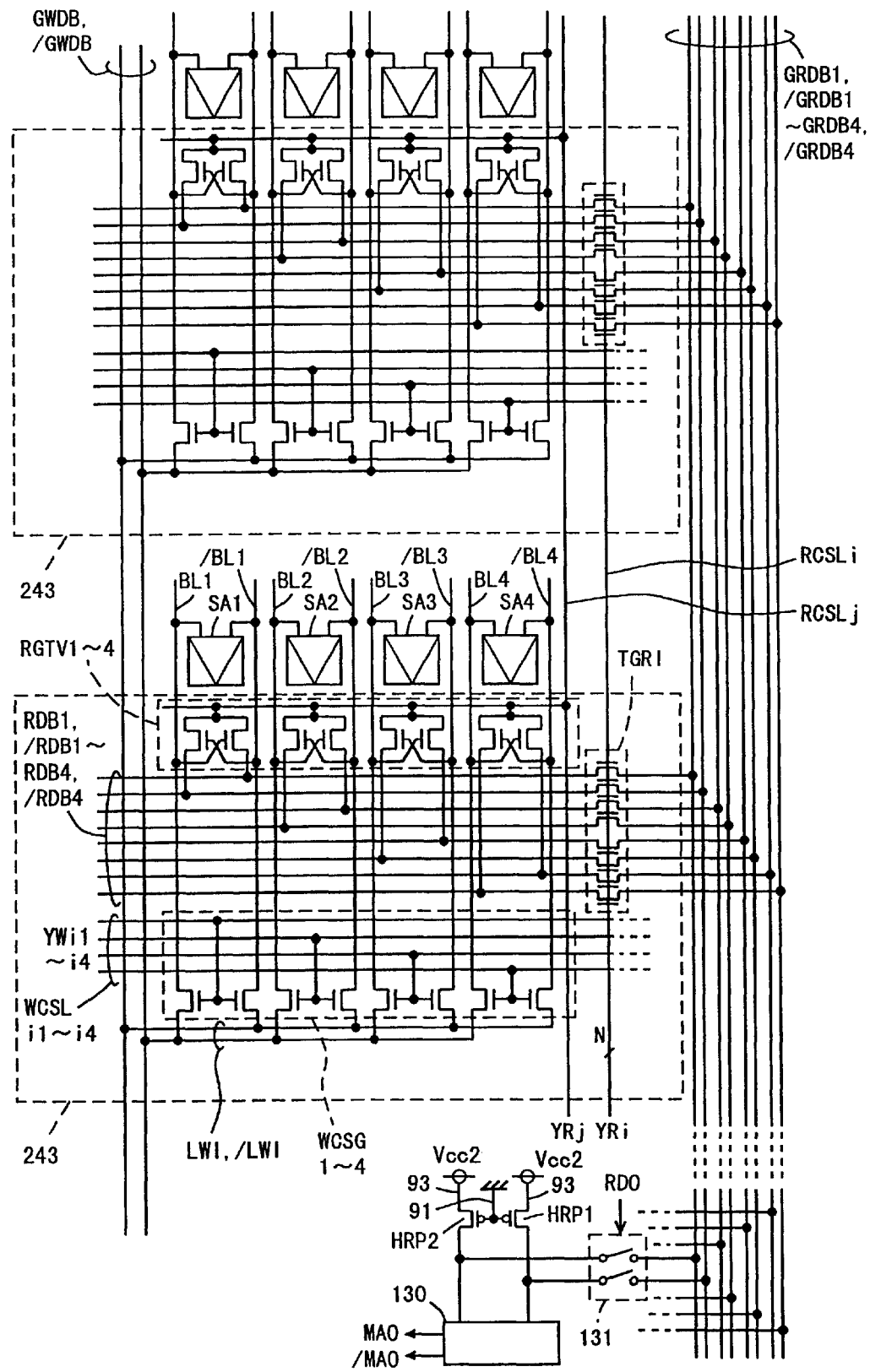
FIG. 14 is a circuit diagram showing a structure related to column selection of a semiconductor memory device of a third modification of the fourth embodiment.

FIG. 14 is a circuit diagram showing a semiconductor memory device of a third modification of the fourth embodiment and particularly a structure of a circuit related to column selection.

The semiconductor memory device of the third modification of the fourth embodiment shown in FIG. 14 has the structure of the semiconductor memory device of the second modification of the fourth embodiment, and additionally has such a feature that global I/O line pairs GIO1 and /GIO1–GIO4 and /GIO4 are divided into global read data bus pairs GRDB1 and /GRDB1–GRDB4 and /GRDB4 dedicated to read data as well as global write data bus pair GWDB and /GWDB, which is dedicated to write data and is independent of global read data bus pairs.

As described above, the global I/O line pairs are divided into the global read data bus pairs and global write data bus pair, whereby the transistor gate TGWI controlled in accordance with signal WTI can be eliminated in column select gate 243, and the circuit elements can be reduced in number. Structures and operations other than the above are the same as those in the second modification of the fourth embodiment, and therefore description will not be repeated.

By dividing the global data lines into lines for reading and lines for writing, the read and write operations can be completely isolated from each other, and both the operations can be performed completely in parallel so that the data processing performance can be further improved.

Structures and operations other than the above are the same as those in the second modification of the fourth embodiment, and therefore will not be described.

Fourth Modification of the Fourth Embodiment

Figure 15:
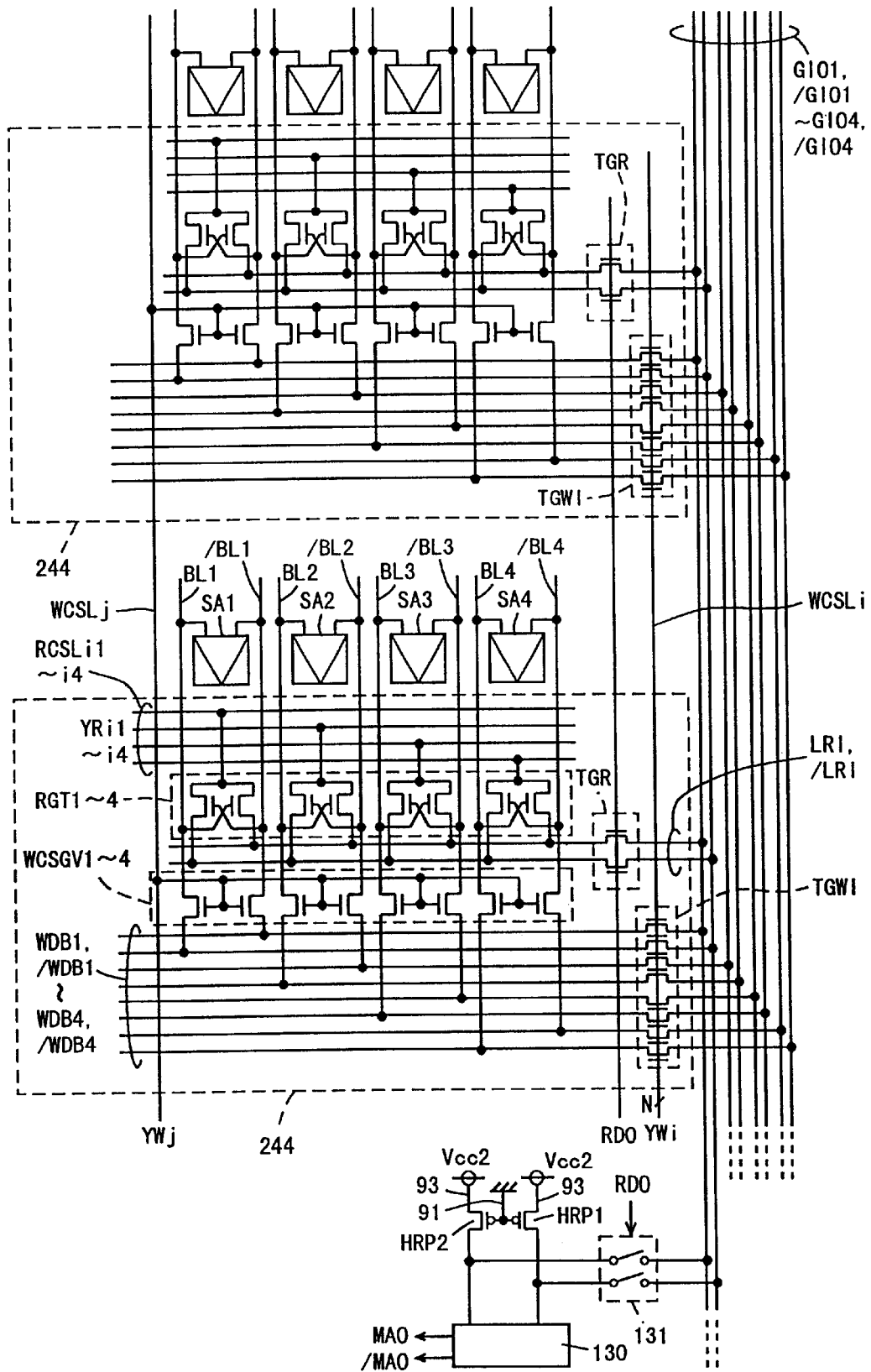
FIG. 15 is a circuit diagram showing a structure related to column selection of a semiconductor memory device of a fourth modification of the fourth embodiment.

FIG. 15 is a circuit diagram showing a semiconductor memory device of a fourth modification of the fourth embodiment, and particularly a structure of a circuit related to column selection.

In the semiconductor memory device of the fourth modification of the fourth embodiment, write column select signals YWij are divided into signals YWi, which are produced by decoding the sense amplifier blocks, and signals YWj for selecting all the columns in the sub-block (i=1–N, j=1–n), similarly to the fourth embodiment. However, read column select signals are set as YRij (i: sense amplifier block number, j: the number indicating the position of column in the same sub-block) similarly to the second embodiment.

In the semiconductor memory device shown in FIG. 15, a column select gate 244 includes read gate circuits RGT1–RGT4, write column select gates WCSGV1–WCSGV4, and transistor gate TGWI.

The structures and operations of read gate circuits RGT1–RGT4 are the same as those in the second embodiment, and the structures and operations of write column select gates WCSGV1–WCSGV4 and transistor gate TGWI are the same as those in the fourth embodiment. Description of these structures and operations will not be repeated.

By employing the column select signals and column select gates having the structure described above, write column select lines WCSLi and WCSLj transmitting write column select signals YWi and YWj are arranged parallel with the bit line pairs, similarly to the case shown in FIG. 11, and read column select lines RCSLi1–RCSLi4 transmitting read column select signals YRi1–YRi4 are arranged perpendicularly to the bit line pairs.

Thereby, read column select lines RCSLij are perpendicular to write column select lines WCSLi and WCSLj.

Owing to the above structure, the column select lines are arranged in a distributed fashion so that some lines are parallel with the bit line pair and the others are perpendicular to the same. Therefore, concentration of the lines can be reduced in both the row and column directions, and the lines can be arranged without great difficulty in layout.

Fifth Modification of the Fourth Embodiment

Figure 16:
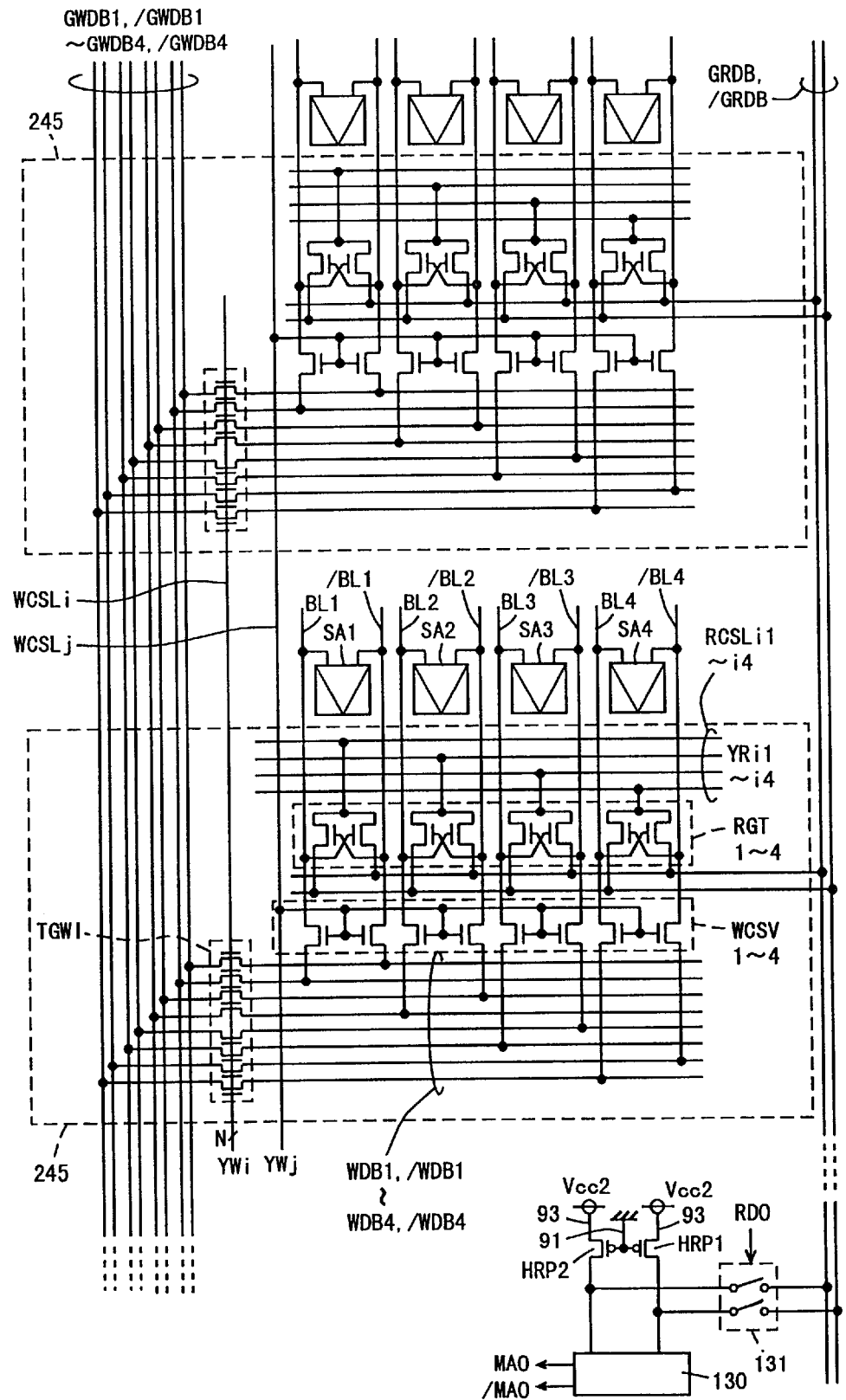
FIG. 16 is a circuit diagram showing a structure related to column selection of a semiconductor memory device of a fifth modification of the fourth embodiment.

FIG. 16 is a circuit diagram showing a semiconductor memory device of a fifth modification of the fourth embodiment shown in FIG. 15, and particularly a structure of a circuit related to column selection.

The semiconductor memory device of the fifth modification of the fourth embodiment shown in FIG. 16 has the structure of the semiconductor memory device of the fourth modification of the fourth embodiment, and additionally has a feature that global I/O line pairs GIO1 and /GIO1–GIO4 and /GIO4 are divided into global write data bus pairs GWDB1 and /GWDB1–GWDB4 and /GWDB4 as well as global read data bus pair GRDB and /GRDB which is independent of the global write data bus pairs.

By dividing the global data lines into lines for reading and writing, transistor gate TGR which is controlled in accordance with signal RDO can be eliminated in column select gate 245, and the circuit elements can be reduced in number. Further, the read and write operations can be completely isolated from each other, and both the operations can be performed completely in parallel so that the data processing performance can be further improved.

Structures and operations other than the above are the same as those in the fourth modification of the fourth embodiment 4, and therefore description will not be repeated.

Sixth Modification of the Fourth Embodiment

Figure 17:
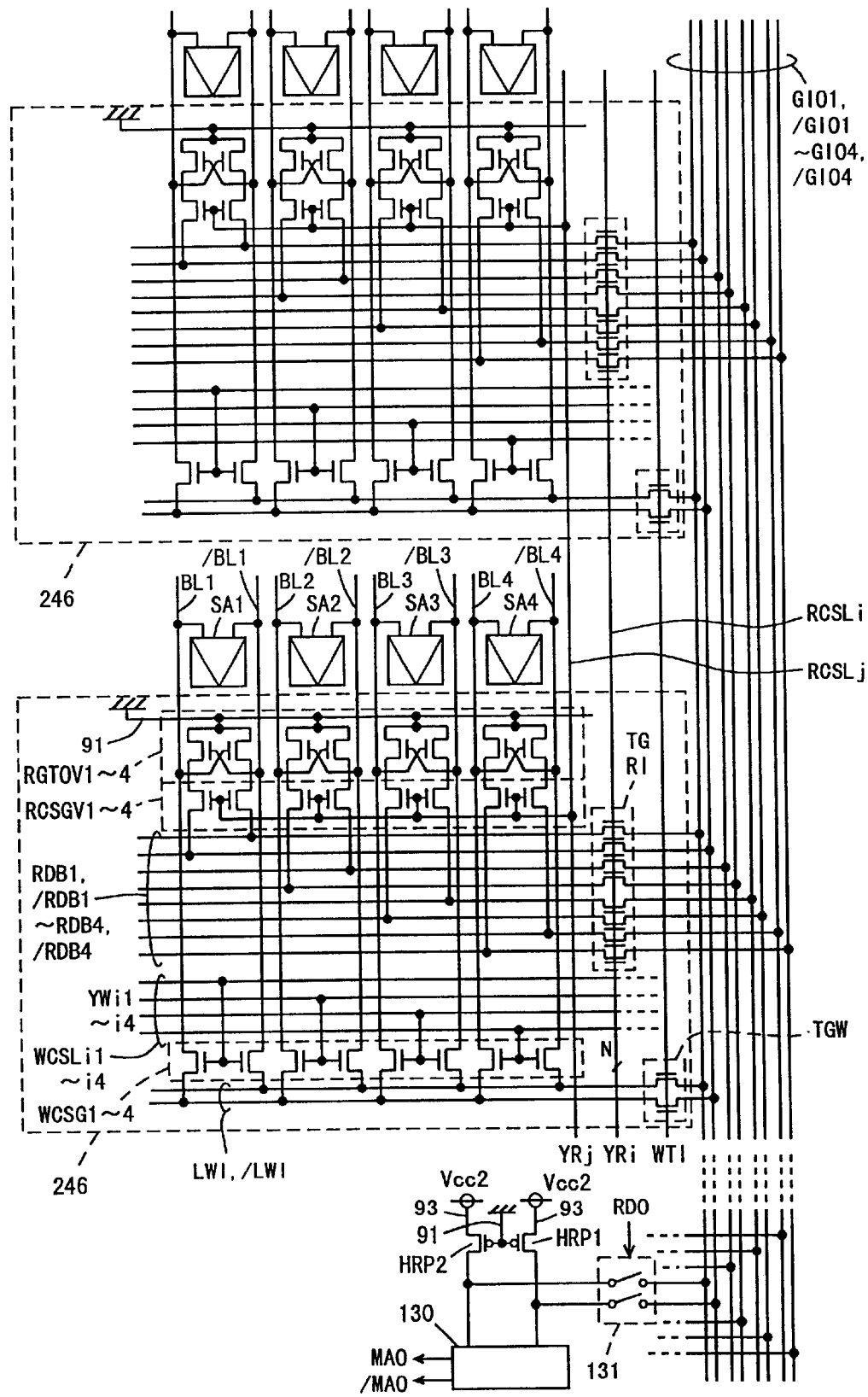
FIG. 17 is a circuit diagram showing a structure related to column selection of a semiconductor memory device of a sixth modification 6 of the fourth embodiment.

FIG. 17 is a circuit diagram showing a semiconductor memory device of further another modification of the fourth embodiment, and particularly a structure of a circuit related to column selection.

In the semiconductor memory device of the sixth modification of the fourth embodiment, read column select signals YRij are divided into signals YRi, which are produced by decoding the sense amplifier blocks, and signals YRj for selecting all the columns in the sub-block (i=1–N, j=1–n), similarly to the fourth embodiment. However, write column select signals YWij are set as YWij (i: sense amplifier block number, j: the number indicating the position of column in the same sub-block) similarly to the second embodiment.

In the semiconductor memory device shown in FIG. 17, a column select gate 246 includes read gate circuits RGTOV1–RGTOV4, read column select gates RCSGV1–RCSGV4, write column select gates WCSG1–WCSG4 and transistor gate TGRI.

Each of read gate circuits RGTOV1–RGTOV4 includes read gate transistors, which are provided correspondingly to bit line pairs BL1 and /BL1–BL4 and /BL4, respectively, and have sources connected to a ground interconnection 91. Read gate circuits RGTOV1–RGTOV4 execute the data read operation in accordance with the potential level on the bit line pairs.

Each of read column select gates RCSGV1–RCSGV4 has transistors which are provided correspondingly to bit line pairs BL1 and /BL1–BL4 and /BL4, and have gates connected to line RCSLj transmitting read column select signal YRj. Read column select gates RCSGV1–RCSGV4 operate in response to activation of signal YRj to transmit the data, which are read by read gate circuits RGTOV1–RGTOV4, onto the corresponding read data bus pairs, respectively.

The structures and operations of write column select gates WCSG1–WCSG4 are the same as those in the second embodiment, and the structure and operation of transistor gate TGRI are the same as those in the fourth embodiment. Therefore, description will not be repeated.

By employing the column select signals and column select gates having the structure described above, read column select lines RCSLi and RCSLj transmitting read column select signals YRi and YRj are arranged parallel with the bit line pairs similarly to the structure in FIG. 11, and write column select lines WCSLi1–WCSLi4 transmitting write column select signals YWi1–YWi4 are arranged along the direction perpendicular to the bit line pairs.

Owing to the above structure, the column select lines are arranged in a distributed fashion so that some lines are parallel with the bit line pair and the others are perpendicular to the same. Therefore, concentration of the lines can be reduced in both the row and column directions, and the lines can be arranged without great difficulty in layout.

Seventh Modification of the Fourth Embodiment

Figure 18:
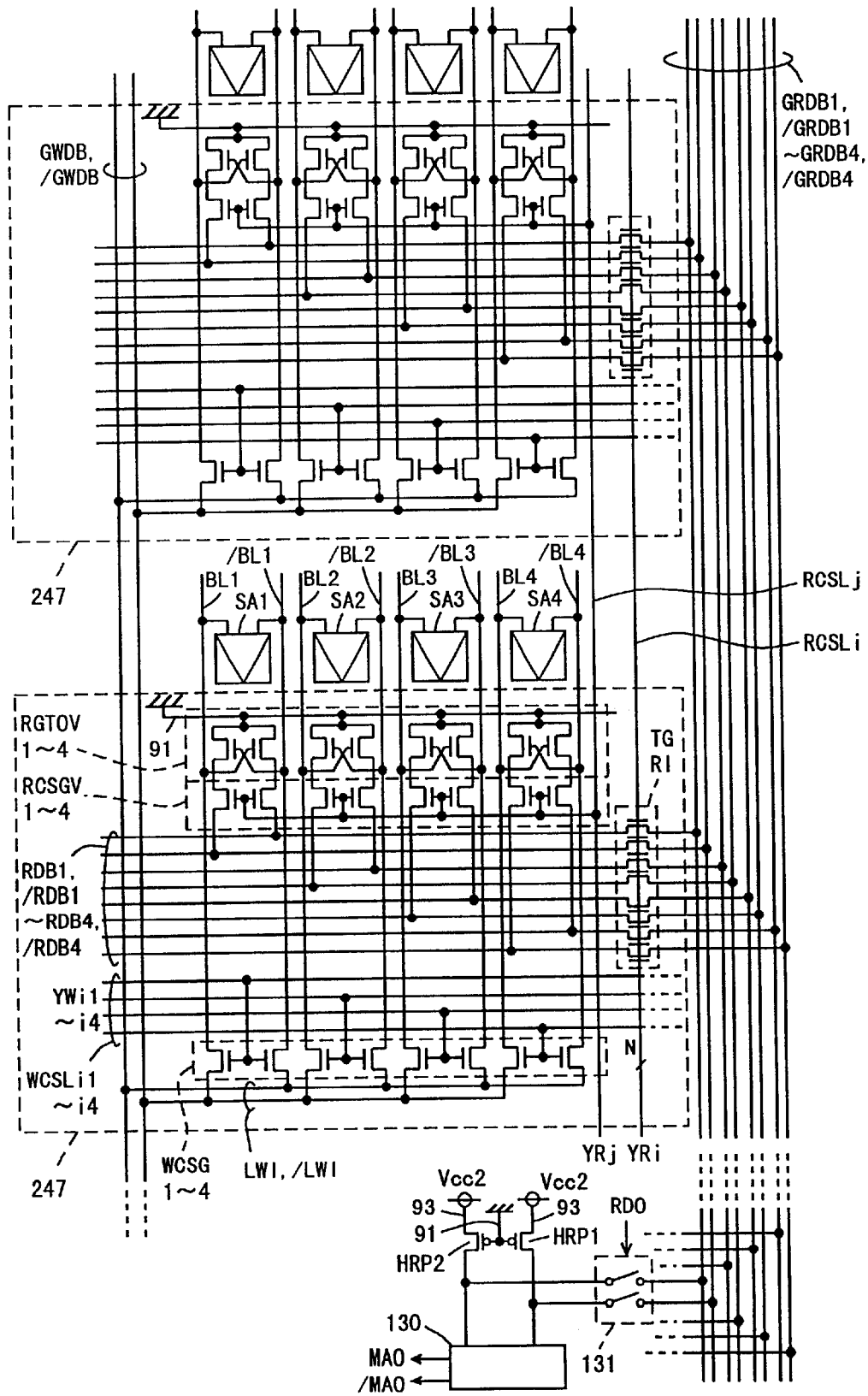
FIG. 18 is a circuit diagram showing a structure related to column selection of a semiconductor memory device of a seventh modification of the fourth embodiment.

FIG. 18 is a circuit diagram showing a seventh modification of the fourth embodiment of the present invention shown in FIG. 17, and particularly a structure of a circuit related to column selection of a semiconductor memory device.

The semiconductor memory device of the seventh modification of the fourth embodiment shown in FIG. 18 has the structure of the semiconductor memory device of the sixth modification of the fourth embodiment, and additionally has a feature that global I/O line pairs GIO1 and /GIO1–GIO4 and /GIO4 are divided into global read data bus pairs GRDB1 and /GRDB1–GRDB4 and /GRDB4 dedicated to read data as well as global write data bus pair GWDB and /GWDB which is dedicated to write data and is independent of the global read data bus pairs.

By dividing the global I/O line pairs into global read data bus pairs and global write data bus pair, transistor gate TGW which is controlled in accordance with signal WTI can be eliminated in column select gate 247, and the circuit elements can be reduced in number. Further, by dividing the global data lines into lines for reading and lines for writing, the read and write operations can be completely isolated from each other, and both the operations can be performed completely in parallel so that the data processing performance can be further improved.

Structures and operations other than the above are the same as those in the sixth modification of the fourth embodiment, and therefore description will not be repeated.

Fifth Embodiment

In the fifth embodiment, the semiconductor memory device has a structure in which some of read column select lines are arranged parallel with the bit line pairs for reducing concentration of the column select lines arranged in the same direction.

Figure 19:
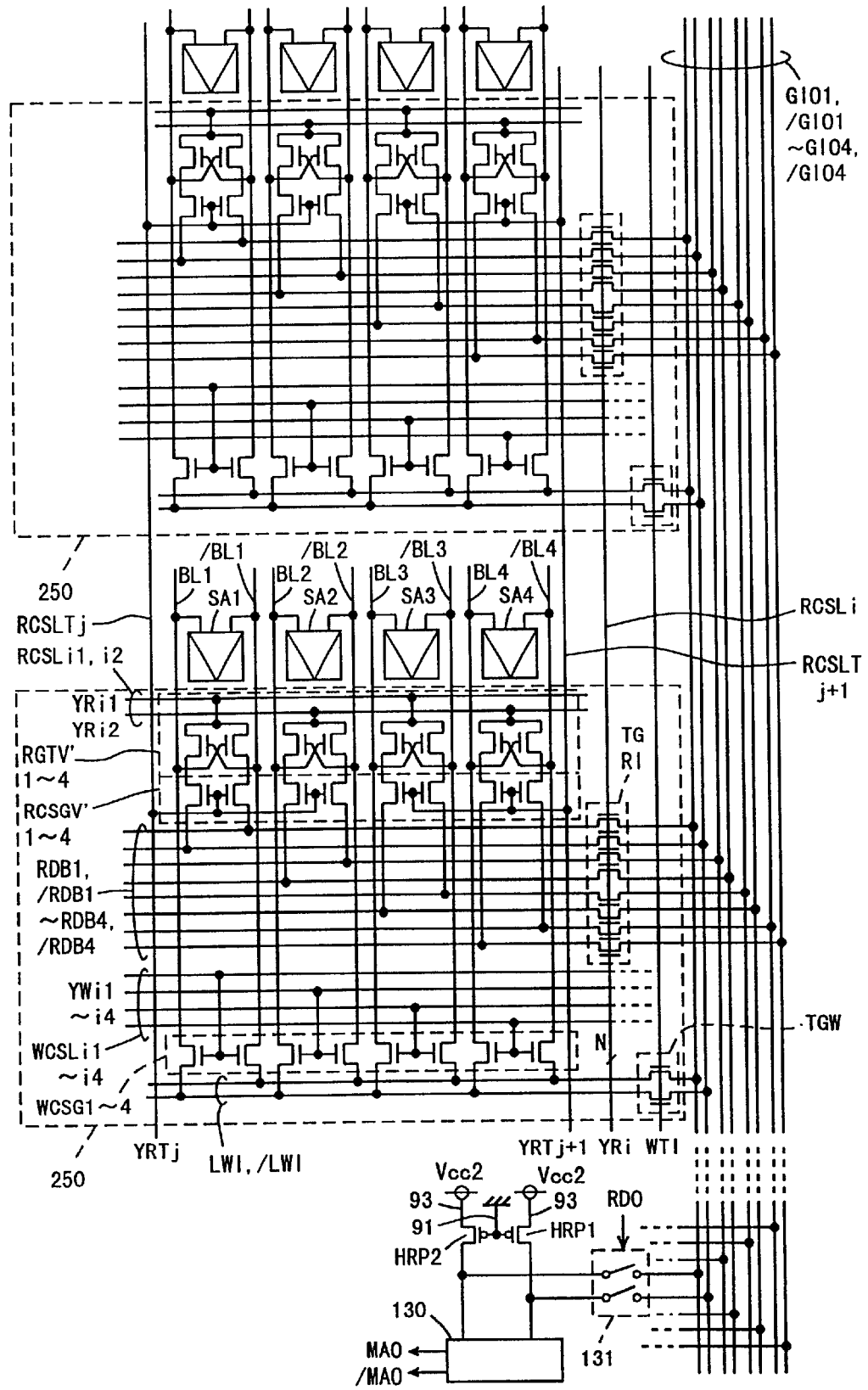
FIG. 19 is a circuit diagram showing a structure related to column selection of a semiconductor memory device of a fifth embodiment.

FIG. 19 is a circuit diagram showing a structure of a circuit related to column selection in a semiconductor memory device of the fifth embodiment.

In the semiconductor memory device of the fifth embodiment shown in FIG. 19, read column select signals YRij are divided into signals YRi, YRi1, YRi2 and YRTj.

Each read column select signal YRi (i=1–N) is set independently of those for the other sense amplifier blocks, and becomes active and attains "H" level when signal RDO is activated and the corresponding sense amplifier blocks are selected.

Each of column select signals YRi1 and YRi2 is used commonly to two of the columns included in the same sub-block. One of column select signals YRi1 and YRi2 is selectively activated ("L" level) while the other is deactivated in the selected sub-block.

Each read column select signals YRTj (j=1–2n) is applied commonly to the sub-blocks of N in number arranged in the column direction. Read column select signals YRTj are double in number the columns of sub-blocks, and are activated ("H" level) independently of each other.

Signals YRi are transmitted through read column select lines RCSLi (i=1–N) of N in number.

Signals YRi1 and YRi2 are transmitted through read column select lines RCSLi1 and RCSLi2, respectively. Signals YRTj are transmitted through read column select lines RCSLTj (j=1–2n) of 2n in number. In each sub-block, the read column is selected based on a combination between the states of read column select lines RCSLi1 and RCSLi2 and read column select lines RCSLTj and RCSLTj+1.

Write column select signals YWij are set as YWij (i: sense amplifier block number, j: the number indicating the position of column in the same sub-block), and select the write column in the manner already described.

Read column select lines RCSLi1 and RCSLi2 as well as write column select lines WCSLi1–WCSLi4 are arranged perpendicularly to the bit line pairs. Read column select lines RCSLTj, RCSLTj+1 and RCSLi are arranged parallel with the bit line pairs.

In a column select gate 250 of the semiconductor memory device of the fifth embodiment, the local read line pairs are likewise replaced with read data bus pairs RDB1 and /RDB1–RDB4 and /RDB4. Correspondingly, the structure employs four global I/O line pairs GIO1 and /GIO1–GIO4 and /GIO4. For the write operation, local write line pair LWI and /LWI is arranged commonly to the four columns in the sub-block.

Column select gate 250 includes read gates RGTV'1–RGTV'4, read column select gates RCSGV'1–RCSGV'4 and write column select gates WCSG1–WCSG4, which correspond to bit line pairs BL1 and /BL1–BL4 and /BL4, respectively.

Read gate circuits RGTV'1 and RGTV'3 include read gate transistors connected to read column select line RCSLi1, and read gate circuits RGTV'2 and RGTV'4 include read gate transistors connected to read column select line RCSLi2.

Thereby, when read column select signal YRi1 is activated, read gate circuits RGTV'1 and RGTV'3 read the data from bit line pairs BL1 and /BL1, and BL3 and /BL3, respectively. When read column select signal YRi2 is activated, read gate circuit RGTV'2 and RGTV'4 read the data from bit line pairs BL2 and /BL2, and BL4 and /BL4, respectively.

Read column select gates RCSGV'1 and RCSGV'2 include transistors which receive on their gates the signal from read column select line RCSLj, and connect the bit line pairs to the read data bus pairs. Read column select gates RCSGV'3 and RCSGV'4 include transistors which receive on their gates the signal from read column select line RCSLj+1, and connect the bit line pairs to the read data bus pairs.

In the sub-block including the memory cell column designated by the address signal, one of read column select signals YRi1 and YRi2 as well as one of read column select signals YRTj and YRTj+1 are activated. In column select gate 250, therefore, read column select signals YRi1 and YRi2 select and turn on two of the read gate circuits RGTV'1–RGTV'4, and one of these two memory cell columns is finally selected in accordance with combination of the signals YRTj and YRTj+1 so that the data is read from the bit line pair of the selected column onto the read data bus pair.

Read data bus pair is provided for each sub-block, and is connected to the corresponding global I/O line pair via transistor gate TGRI which is selectively turned on in accordance with read column select signal YRi.

For the write column selection, write column select gates WCSG1–WCSG4 are employed similarly to column select gate 220 of the second embodiment. Other structures and operations are the same as those already described, and therefore description will not be repeated.

Owing to the above structure of the column select gates, some of the column select lines can be arranged perpendicularly to the others so that concentration of the column select lines in one direction can be suppressed, and increase in layout area can be suppressed.

Modification of the Fifth Embodiment

Figure 20:
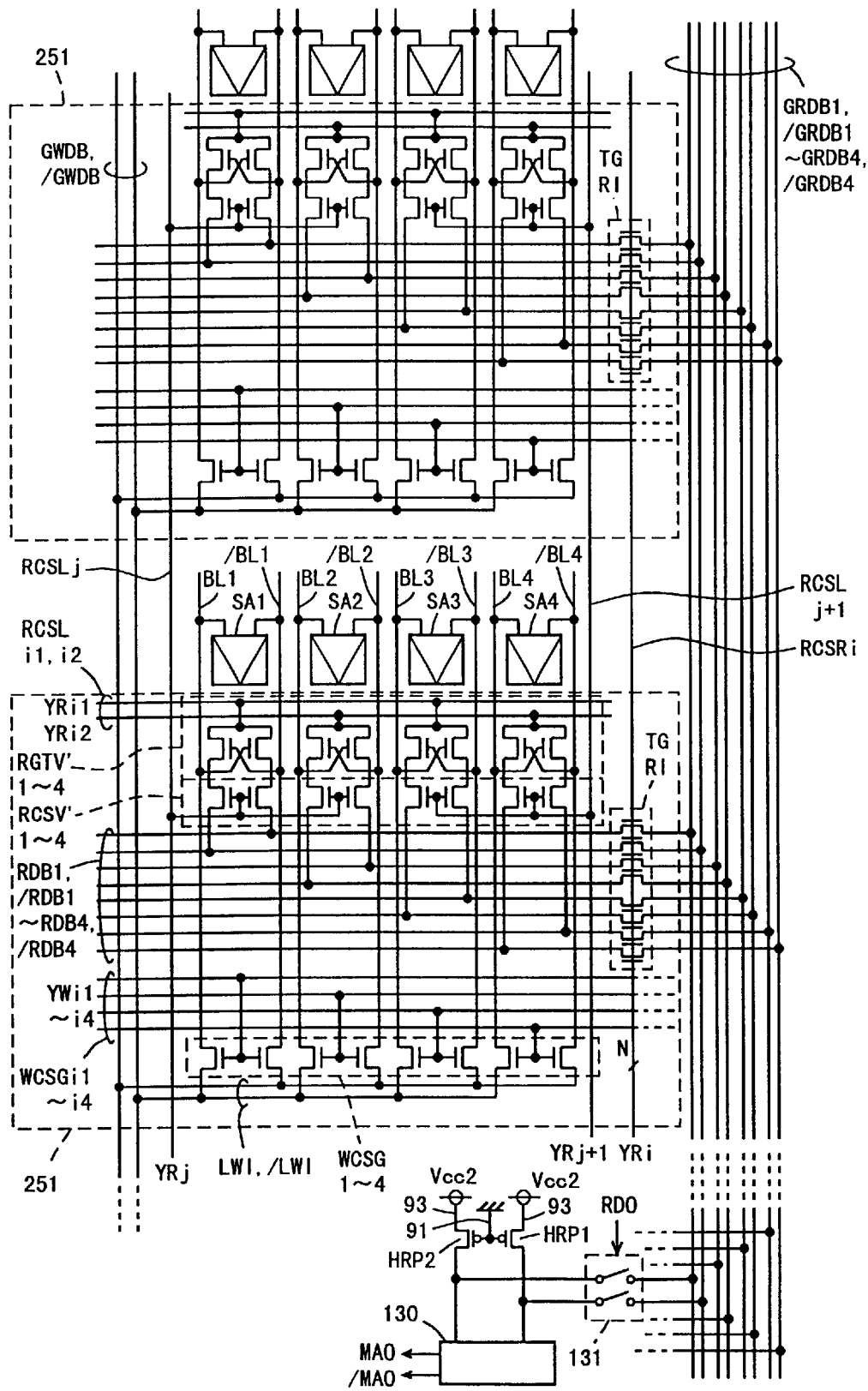
FIG. 20 is a circuit diagram showing a structure related to column selection of a semiconductor memory device of a modification of the fifth embodiment.

FIG. 20 is a circuit diagram showing a modification of the fifth embodiment of the present invention shown in FIG. 19, and particularly a structure of a circuit related to column selection of a semiconductor memory device.

In the semiconductor memory device shown in FIG. 20, global I/O line pairs GIO1 and /GIO1–GIO4 and /GIO4 are divided into global read data bus pairs GRDB1 and /GRDB1–GRDB4 and /GRDB4 dedicated to read data as well as global write data bus pair GWDB and /GWDB, which is dedicated to write data and is independent of global read data bus pairs.

As described above, the global I/O line pairs are divided into the global read data bus pairs and global write data bus pair, whereby the transistor gate TGW controlled in accordance with signal WTI can be eliminated in column select gate 251, and the circuit elements can be reduced in number.

By dividing the global data lines into lines for reading and lines for writing, the read and write operations can be completely isolated from each other, and both the operations can be performed completely in parallel so that the data processing performance can be further improved. Structures and operations other than the above are the same as those of column select gate 250, and therefore description will not be repeated.

The structure already described with respect to the second embodiment may be applied to the column select gates of the fourth and fifth embodiments, whereby the read gate circuit may be formed of P-type MOS transistors, or the hierarchical I/O lines may be formed between the plurality of sub-blocks.

Sixth Embodiment

In general, the data read operation is performed by amplifying a minute potential difference occurring on the data line pair, and the data write operation is performed by transmitting a voltage signal having an amplitude corresponding to "H" level onto one of the paired data lines. Therefore, a difference is likely to occur in operation speed between the data write operation and the data read operation. In the invention, the above difference may occur more remarkably because the speed of data read operation is increased by employment of the direct sensing system.

When actual access patterns are considered, generally the number of data read operations is considerably larger than the number of data write operations. Therefore, if the speed of operation of the semiconductor memory device as a whole is determined by the speed of the less-frequent data write operations, operation efficiency becomes very low.

In the actual data access of the semiconductor memory device, however, there is a tendency that the read operation simultaneously handles a large number of data in parallel, and the write operation handles a relatively small number of data in parallel. Accordingly, the number of columns, which are brought into correspondence with the global I/O line pair provided for each write data in the write operation, can be smaller than that of the columns, which are brought into correspondence with the global I/O line pair provided for each read data in the read operation.

In view of the above, the sixth embodiment employs such a structure that the read and write operations differs from each other in data bit number, i.e., number of columns which are brought into correspondence with the global I/O line pair.

Figure 21:
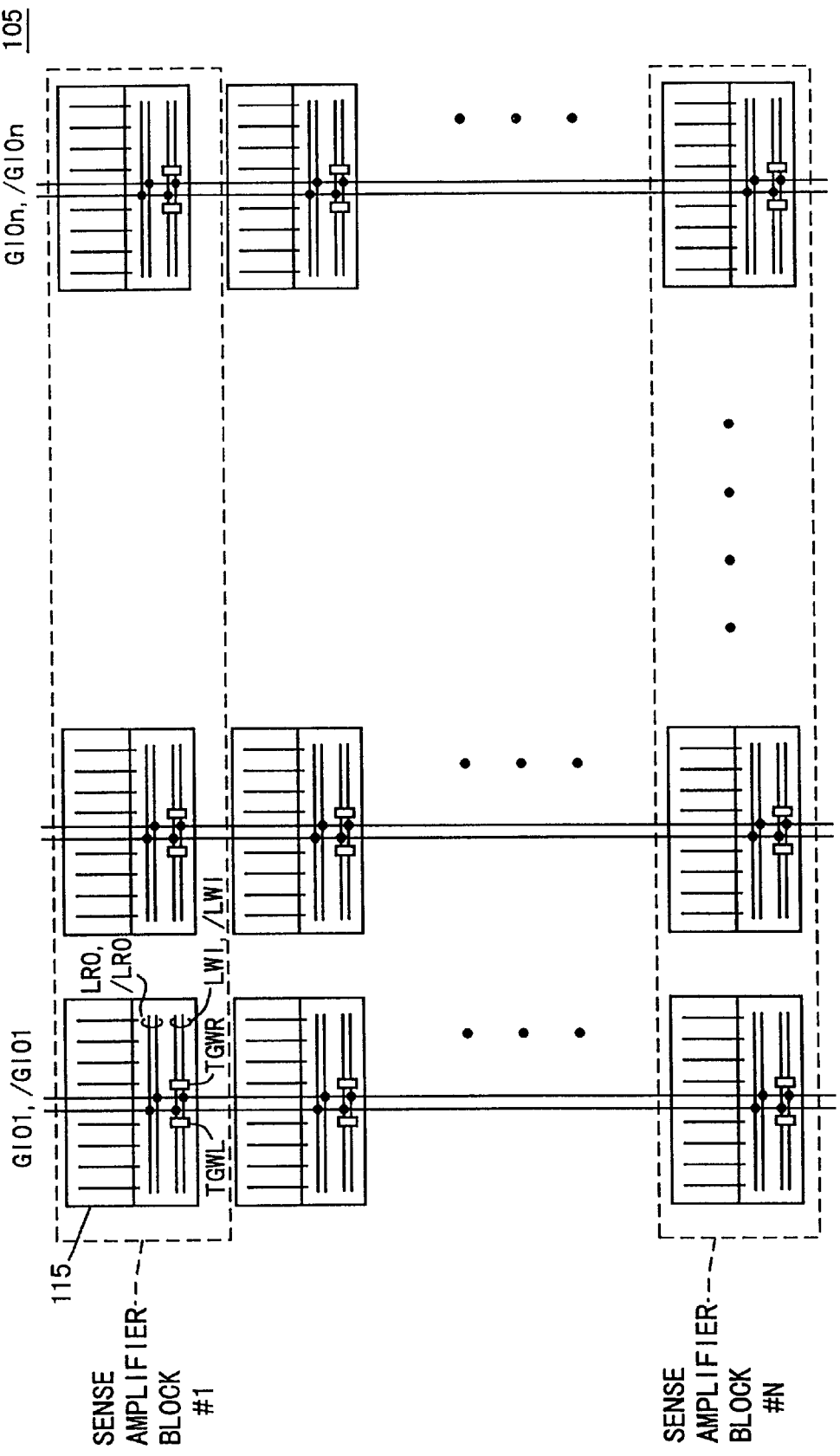
FIG. 21 schematically shows a structure of a memory cell array 105 of a semiconductor memory device of a sixth embodiment.

FIG. 21 schematically shows a structure of a memory cell array 105 of a semiconductor memory device of the sixth embodiment.

Referring to FIG. 21, memory cell array 105 includes sense amplifier blocks of N in number and global I/O line pairs of n in number, and is divided into sub-blocks of (N×n) in number, similarly to memory cell array 100 of the semiconductor memory device of the first embodiment shown in FIG. 2.

Each sub-block 115 has local write line pair LWI and /LWI, local read line pair LRO and /LRO, and transistors TGWR and TGWL arranged between local write line pair LWI and global I/O line pair GIO and /GIO. Transistors TGWR and TGWL are controlled independently of each other.

Figure 22:
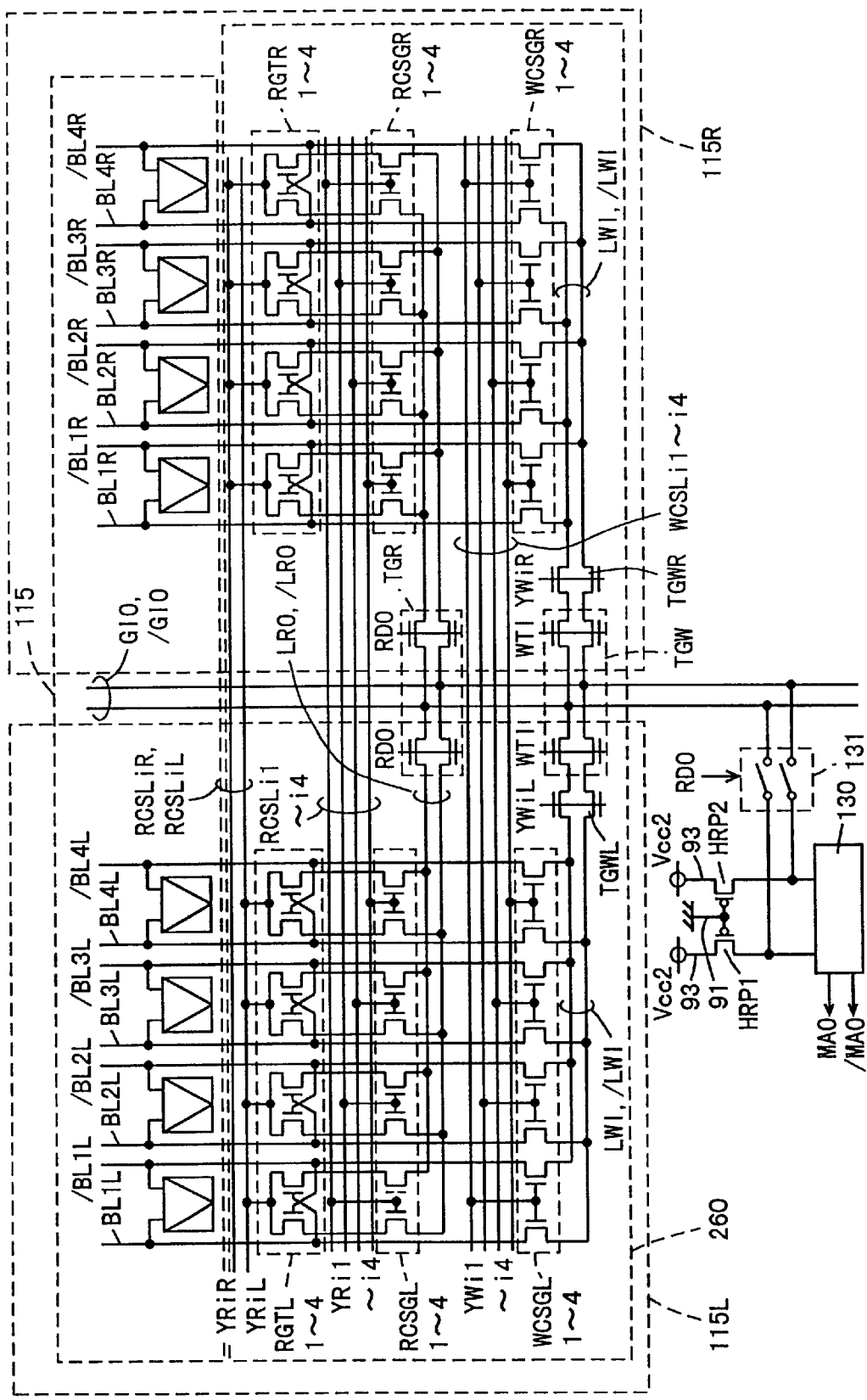
FIG. 22 is a circuit diagram showing a structure of a circuit related to column selection in memory cell array 105.

FIG. 22 is a circuit diagram showing a structure of a circuit related to column selection of memory cell array 105.

In memory cell array 105 shown in FIG. 22, sub-block 115 and a column select gate 260 are divided into left and right regions 115R and 115L with global I/O line pair GIO and /GIO therebetween. FIG. 22 shows by way of example regions 115R and 115L each including four columns.

Column select gate 260 performs the column select operation in sub-block 115. A column select gate 260 includes read gate circuits RGTL1–RGTL4 and RGTR1–RGTR4, read column select gates RCSGL1–RCSGL4 and RCSGR1–RCSGR4, write column select gates WCSGL1–WCSGL4 and WCSGR1–WCSGR4, transistors TGR and TGW, and TGWL and TGWR, which are arranged in the left and right regions 115L and 115R, respectively.

The column select operation in column select gate 260 is performed based on read column select signals YRiR and YRiL as well as write column select signals YWiR and YWiL, which are generated for selecting one of right and left regions 115R and 115L, as well as read column select signals YRi1–YRi4 and write column select signals YWi1–YWi4, which are generated commonly to both the right and left regions 115R and 115L for selecting one among the four columns in each region.

Read column select signals YRiR and YRiL are transmitted through read column select lines RCSLiR and RCSLiL. Read column select signals YRi1–YRi4 and write column select signals YWi1–YWi4 are transmitted through read column select lines RCSLi1–RCSLi4 and write column select lines WCSLi1–WCSLi4, respectively.

Read gate circuits RGTL1–RGTL4 include read gate transistors connected to read column select line RCSLiL, and read gate circuits RGTR1–RGTR4 include read gate transistors connected to read column select line RCSLiR. When read column select signal YRiL is activated, read gate circuits RGTL1–RGTL4 read data from lines BL1L and /BL1L–BL4L and /BL4L. When read column select signal YRiR is activated, read gate circuits RGTR1–RGTR4 read data from lines BL1R and /BL1R–BL4R and /BL4R.

Read column select gates RCSGL1–RCSGL4 include transistors which connect the read gate circuits arranged in the corresponding columns to the local read line pair in accordance with the potential level of read column select lines RCSLi1–RCSLi4, respectively. Likewise, read column select gates RCSGR1–RCSGR4 include transistors which connect the read gate circuits arranged in the corresponding columns to the local read line pair in accordance with the potential level of read column select lines RCSLi1–RCSLi4, respectively.

In the column select circuit 260, read gates RGTR1–RGTR4 or RGTL1–RGTL4 are turned on in response to signals YRiR and YRiL, and signals YRi1–YRi4 turn on the corresponding read column select gate so that data corresponding to one, which is selected from columns of eight in total number arranged in the right and left regions 115R and 115L, is read onto local read line pair LRO and /LRO.

The local read line pair and the global I/O line pair are connected via transistor gate TGR. Transistor gates TGR included in regions 115R and 115L are commonly controlled by the same control signal RDO.

The structures and operations of write column select gates WCSGL1–WCSGL4 and WCSGR1–WCSGR4 are the same as those of write column select gates WCSG1–WCSG4 in column select circuit 200 already described. In each of left and right regions 115L and 115R, therefore, the column selection is performed in accordance with write column select signals YWi1–YWi4, and the bit line pair is connected to the local write line pair in response to selection by signals YWi1–YWi4.

In region 115R, the local write line pair and the global I/O line pair are connected together via transistors TGWR and TGW. Likewise, in region 115L, the local write line pair and the global I/O line pair are connected together via transistors TGWL and TGW.

Transistors TGW included in both regions 115R and 115L are commonly controlled by the same control signal WT1, and transistors TGWL and TGWR are controlled by independent control signals YWiR and YWiL, respectively.

In the selected sense amplifier block, one of control signals YWiR and YWiL is selectively activated ("H" level) in accordance with region 115R or 115L including the column which corresponds to the address signal, and both the control signals YWiR and YWiL in each of the unselected sense amplifier blocks are inactive ("L" level).

By using the control signals described above, the local write line pair and the global I/O line pair are connected together in each of regions 115R and 115L, whereby eight columns are connected to one global I/O line pair in the read operation, and four columns are connected thereto in the write operation.

Owing to the above structure, the write and read operations differ from each other in the number of columns which are connected to the global I/O line pair in one column select operation. In this embodiment, since only some of the columns in the sub-block are brought into correspondence with the global I/O line pair in the write operation, the parasitic load capacitance of the data lines in the read operation can be different from that in the write operation so that the parasitic capacitance of the data lines can be relatively reduced in the write operation, and the speed of column select operation can be increased in the write operation.

By improving the column select speed in the write operation, the difference between the read and write operations can be reduced in the direct sensing method, and it is possible to overcome such a problem that the write speed determines the whole operation speed of the semiconductor memory device. Accordingly, the cycle time of the semiconductor memory device can be reduced, and in other words, the operation speed can be improved.

In the write operation shown in FIG. 22, the local write line pair to be connected to the global I/O line pair in the one column select operation is divided into two within the same sub-block. However, the number of division is not restricted to this. Control signals corresponding to signals YWiR and YWiL may be subdivided, and transistors corresponding to transistors TGWR and TGWL may be subdivided so that the number of division in the same sub-block may be further increased for reducing the parasitic capacitance of the data lines in the write operation.

Even if it is desired to increase the speed of read operation for another reason, similar structures may naturally be applied to the local read line pairs.

Modification of the Sixth Embodiment

Figure 23:
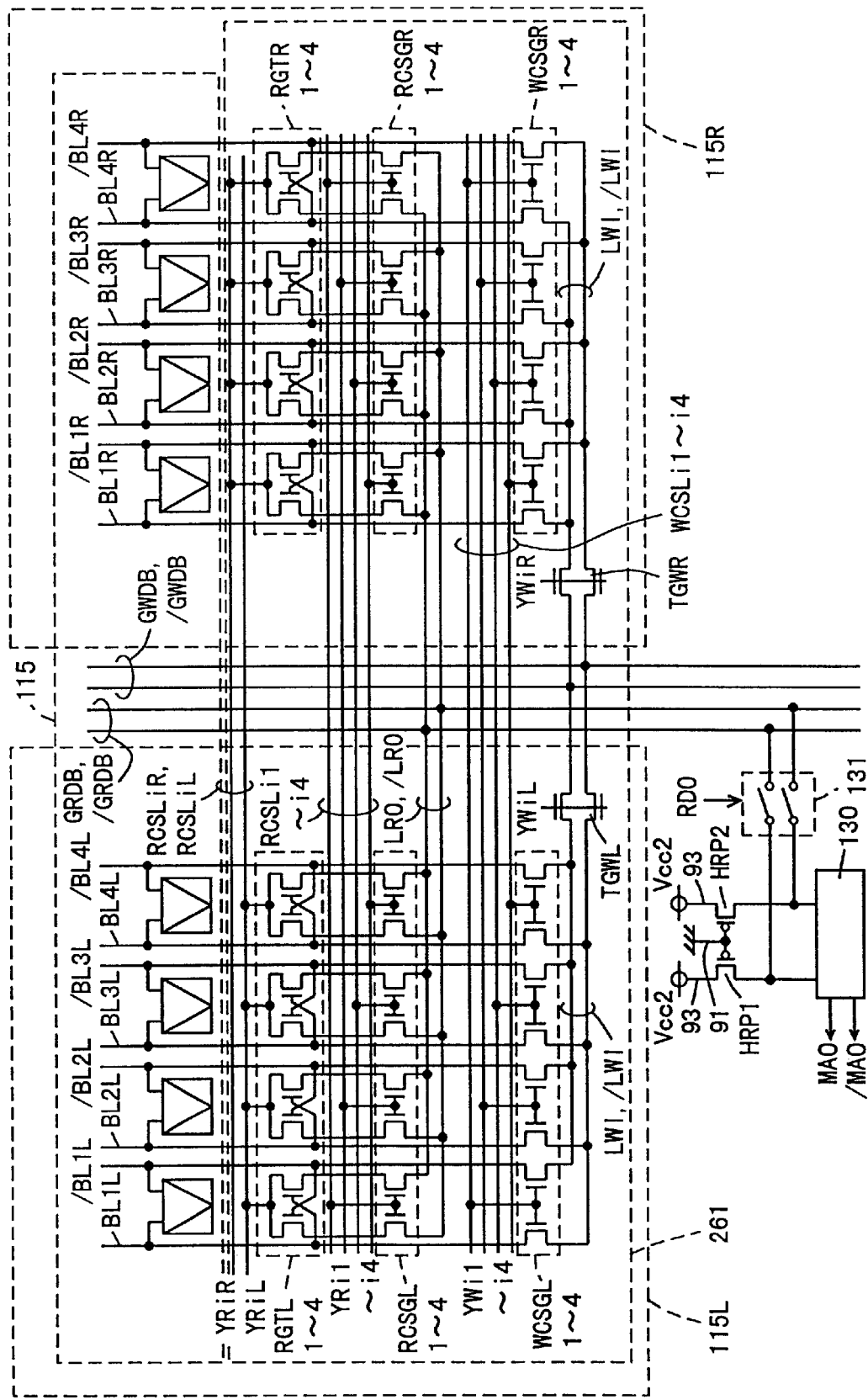
FIG. 23 schematically shows a structure of a memory cell array 105' of a semiconductor memory device of a modification of the sixth embodiment.

FIG. 23 schematically shows a semiconductor memory device of a modification of the sixth embodiment, and particularly a structure of a memory cell array 105'.

In the semiconductor memory device shown in FIG. 23, global I/O line pair GIO and /GIO is divided into global read data bus pair GRDB and /GRDB and global write data bus pair GWDB and /GWDB, which are independent of each other.

By dividing the global I/O line pair into the global read data bus pair and the global write data bus pair, transistors TGR and TGW which are controlled in accordance with signals RDO and WTI can be eliminated in column select gate 261, and the circuit elements can be reduced in number. Further, by dividing the global I/O lines into lines for reading and lines for writing, the read and write operations can be completely isolated from each other, and can be performed completely in parallel so that the data processing performance can be improved. Structures and operations other than the above are the same as those in the sixth embodiment, and therefore description will not be repeated.

In the sixth embodiment, the read gate circuit may be formed of P-type MOS transistors as already described in connection with the modification of the second embodiment. Further, the sixth embodiment may be combined with the fourth and fifth embodiments, whereby more efficient layout design can be achieved.

Seventh Embodiment

The seventh embodiment provides a structure for overcoming a problem of increase in layout area which may be caused by the direct sensing. For this, the seventh embodiment described below employ the column select gate, which uses the read column select line also as the output line of the read data.

Figure 24:
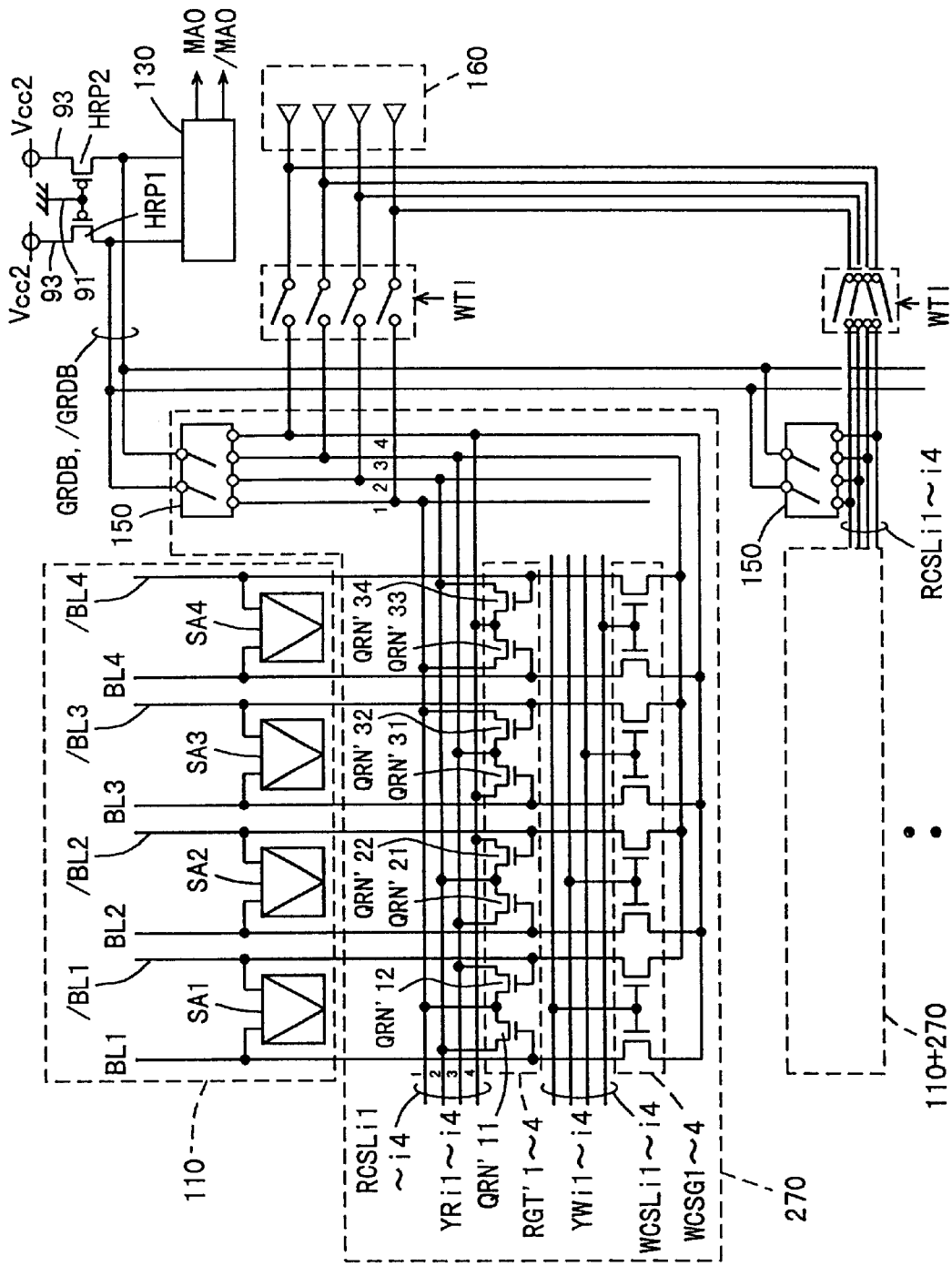
FIG. 24 is a circuit diagram showing a structure of a circuit related to column selection of a semiconductor memory device of a seventh embodiment.

FIG. 24 is a circuit diagram showing a structure of a circuit related to column selection of the semiconductor memory device of the seventh embodiment of the invention.

In the semiconductor memory device of the seventh embodiment shown in FIG. 24, column select gate 270 selects the column in the read and write operations.

Column select gate 270 includes read gate circuits RGT'1–RGT'4.

Read gate circuit RGT'1 has read gate transistors QRN'11 and QRN'12. The sources of read gate transistors QRN'11 and QRN'12 are connected to read column select line RCSLi1 transmitting read column select signal YRi1. The gate of read gate transistor QRN'11 is connected to one (BL1) of paired bit lines, and the gate of read gate transistor QRN'12 is connected to the other (/BL1).

The drain of read gate transistor QRN'11 is connected to read column select line RCSi2, and the drain of transistor QRN'12 is connected to line RCSLi3. Thereby, when read column select signal YRi1 is activated, the data corresponding to line BL1 is read onto read column select line RCSLi2, and the data corresponding to line /BL1 is read onto read column select line RCSLi3.

Likewise, when read column select signal YRi2 is activated, the data corresponding to line BL2 is read onto read column select line RCSLi3, and the data corresponding to line /BL2 is read onto read column select line RCSLi4. When read column select signal YRi3 is activated, the data corresponding to line BL3 is read onto read column select line RCSLi4, and the data corresponding to line /BL3 is read onto read column select line RCSLi1. When read column select signal YRi4 is activated, the data corresponding to line BL4 is read onto read column select line RCSLi1, and the data corresponding to line /BL4 is read onto read column select line RCSLi2. In this manner, the bit line pair data of the column corresponding to the activated read column select line is read onto another inactive read column select line pair which is, in advance, brought into correspondence with the above column.

Read column select lines RCSLi1–RCSLi4 are brought into correspondence with global read data bus pair GRDB and /GRDB by a column select line selector 150. As already described, when the column is activated, the data on the bit line pair is read out onto the read column select lines, which are already in correspondence with the column. Therefore, column select line selector 150 is responsive to read column select signal YRij to connect the read column select lines carrying the read date to the global read data bus pair.

In the column select gate 270, therefore, the data of the bit line pair of the column corresponding to the read column select signal is read and issued onto the global read data bus pair without employing the local read data line pair.

Description will now be given on the column selecting operation in the column select gate 270 during the write operation. In column select gate 270, write column select signals YWi1–YWi4 are selectively activated ("H" level), and thereby write column select gates WCSG1–WCSG4 are selectively turned on to select the write column.

Each of the write column select gates includes a gate transistor which connects one of the paired bit lines to read column select line RCSLi3 in response to the write column select signal, and a transistor which connects the other bit line to read column select line RCSLi4.

In the above description, lines RCSLi3 and RCSLi4 are described only as examples of the read column select lines connected to the respective bit lines. The read column select lines to be connected to the bit line pair in the write operation can be freely determined by changing the state of connection between the read column select line and the transistors forming the write column select gate.

In the data write operation, the write data is transmitted onto the read column select lines by a column select driver 160, and is written onto the bit line pair via one of write column select gates WCSG1–WCSG4 which are selectively turned on.

The structure of column select line selector 150 will now be described.

Figure 25:
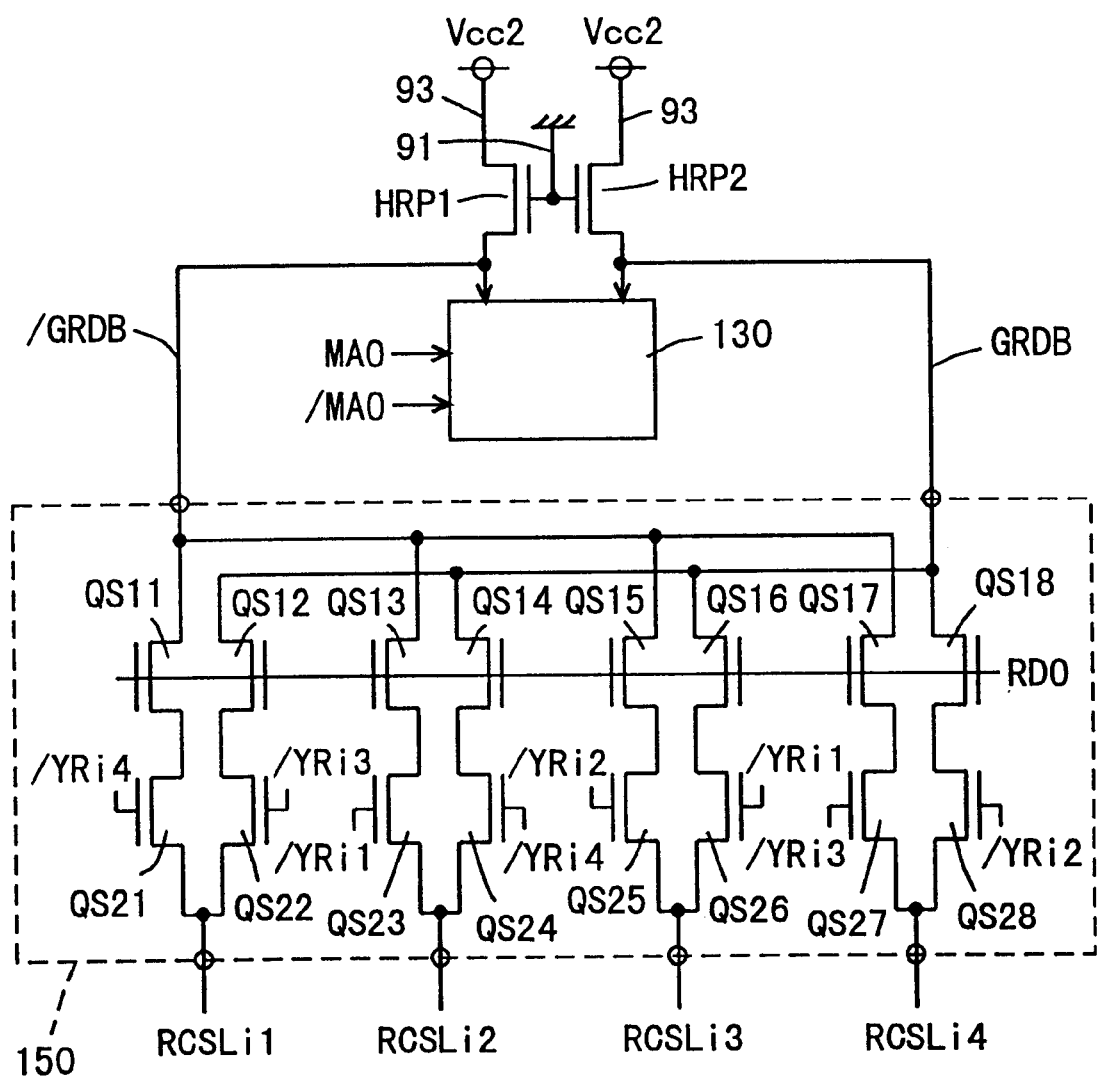
FIG. 25 is a circuit diagram showing a structure of a column select line selector 150.

FIG. 25 is a circuit diagram showing the structure of column select line selector 150.

Referring to FIG. 25, column select line selector 150 includes transistors QS11–QS18 receiving control signal RDO on their gates, and transistors QS21–QS28 which are connected in series to transistors QS11–QS18, respectively.

Transistors QS11–QS18 are controlled by control signal RDO, and are turned on when the read operation is activated. Transistors QS21–QS28 are responsive to activation of the read column select signal to connect selectively the read column select lines, onto which the data of the bit line pair is read, to the global read data bus pair.

When the read column select signal is activated, data is read from the bit line pair corresponding to the read column select line, which is determined in accordance with the combination between the read gate transistors and the read column select lines connected thereto. Therefore, the read column select signal is applied to the gates of transistors QS21–QS28 in a manner corresponding to the intended combination.

The column selecting operation by the column select gate 270 will now be described with reference to operation waveforms of the respective portions.

Figure 26:
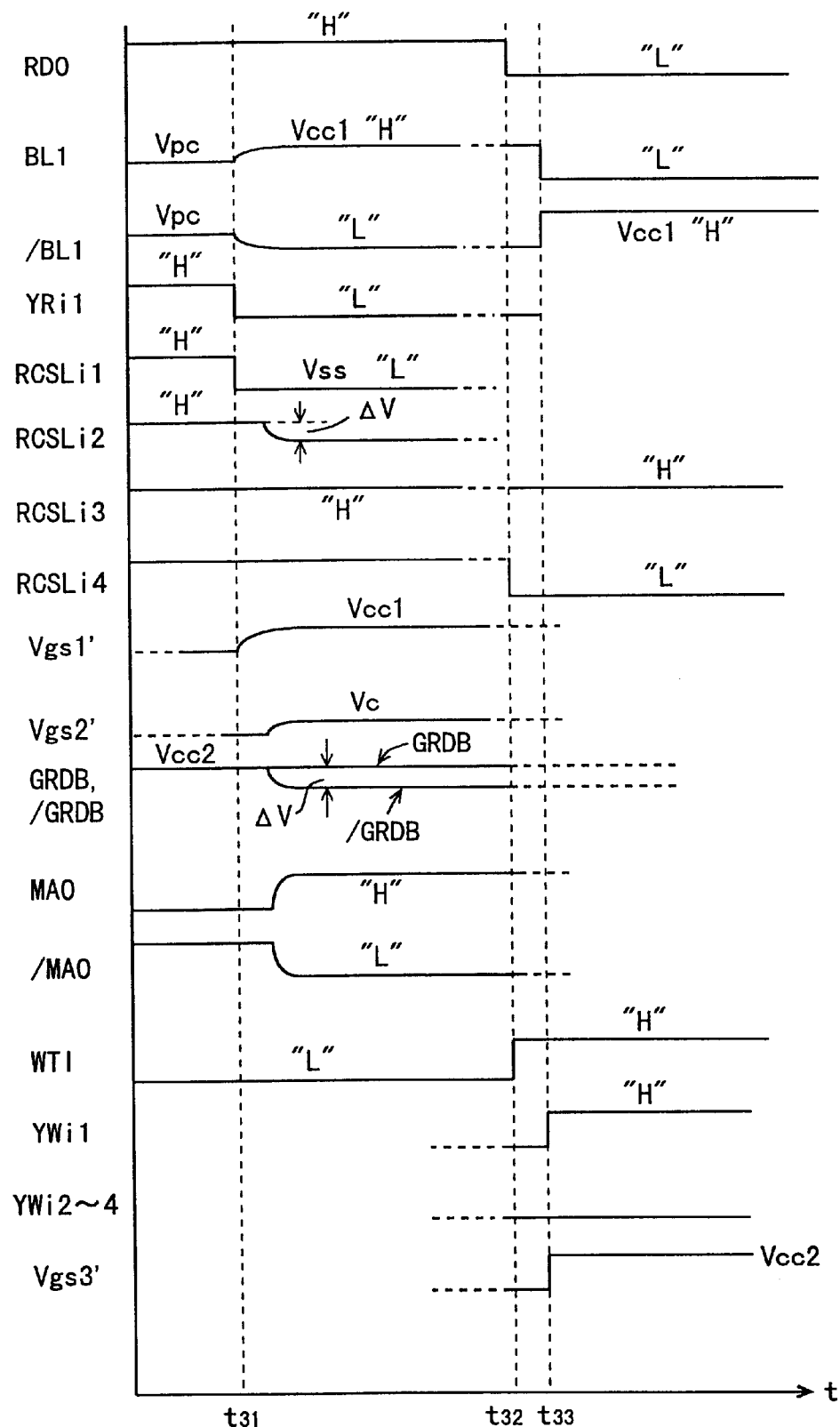
FIG. 26 is a waveform diagram of various signals for showing a column selecting operation of a column select gate 270.

FIG. 26 is a waveform diagram showing operation signals of the respective portions in column select gate 270 during the column select operation.

FIG. 26 shows by way of example an operation, in which data at "H" and "L" levels are read from lines BL1 and /BL1, respectively, and thereafter data at "L" and "H" levels are written onto lines BL1 and /BL1, respectively.

At time t31, read column select signal YRi1 is activated ("L" level) for reading the data on bit line pair BL1 and /BL1. Other read column select signals YRi2–YRi4 remain inactive ("H" level).

Prior to the above, control signal RDO is activated ("H" level) for starting the read operation, and the global read data bus pair is precharged to Vcc2 in advance.

At the substantially same time as the activation of read column select signal YRi1, the word line is activated, and data at "H" and "L" levels are read onto paired bit lines BL1 and /BL1, respectively. Thereby, gatesource voltage Vgs1' of read gate transistor QRN'11 goes to Vcc1 (bit line amplitude) so that read gate transistor QRN11' is turned on.

Thereby, read column select lines RCSLi1 and RCSLi2 are connected, and a current path including column select line selector 150 is formed through a Vcc2 line 93—a high-resistance load HRP1-/GRDB-RCSLi2-QRN'11-RCSLi1(Vss) so that the potentials on bus /GRDB and line RCSLi2 lower by ΔV from the precharged potential of Vcc2. Main read amplifier 130 amplifies potential difference ΔV occurring on the global read data bus pair, and issues output signals MAO at "H" level and /MAO at "L" level.

Meanwhile, read gate transistor QRN'12 receiving on its gate the potential on line /BL1 maintains the gate-source voltage of 0, and therefore remains in the off state. Accordingly, the potentials on GRDB and /RCSLi3 are kept at Vcc2.

In this manner, the column selection is performed for bit line pair BL1 and /BL1, and the potential drop of ΔV occurs on read column select line RCSLi2. In this case, gate-source voltages Vgs2' in other read gate transistors QRN'21, QRN'22 and QRN'23 connected to line RCSLi2 rise to Vc (Vc=Vcc1−(Vcc2−ΔV)).

For accurately performing the column selecting operation, the current drive performance of read gate transistor QRN'11–QRN'34 and resistance value RH of the high-resistance load must fall within the ranges satisfying the foregoing formula (1), similarly to the second embodiment. P-type MOS transistors may be used in high-resistance loads HRP1 and HRP2, whereby the potential difference occurring on the high-resistance loads can be clamped to a predetermined value or less so that the operation can be more stable.

In the write operation, control signal WTI is activated at time t32, and column select line driver 160 writes data at "H" or "L" level onto the read column select lines RCSLi1–RCSLi4. In this example, data at "H" and "L" level are written onto lines /BL1 and BL1 so that line RCSLi3 carries the potential at "H" level (Vcc2), and line RCSLi4 carries the potential at "L" level (Vss).

At time t33, write column select signal YWi1 is activated so that a gate-source voltage Vgs3' of the transistor forming write column select gate WCSG1 rises to Vcc1. Thereby, write column select gate WCSG1 is turned on, and data driven by column select line driver 160 is written onto bit line pair BL1 and /BL1 via lines RSCLi3 and RSCLi4.

According to the above structure, the read column select line can serve also as the output line for read data in column select gate 270 so that the local data line can be eliminated in each sub-block. Therefore, increase in layout area due to the direct sensing can be significantly suppressed.

Naturally, by combining the seventh embodiment with the modification of the second embodiment, the read gate circuit may be formed of the P-type MOS transistors, and the hierarchical I/O lines may be formed between the plurality of sub-blocks.

Eighth Embodiment

The eighth embodiment provides a redundant repair circuit, in which a problem relating to the layout area may become remarkable in accordance with increase in capacity of the memory, and particularly provides a structure of the redundant repair circuit which can suppress increase in layout area.

Figure 27:
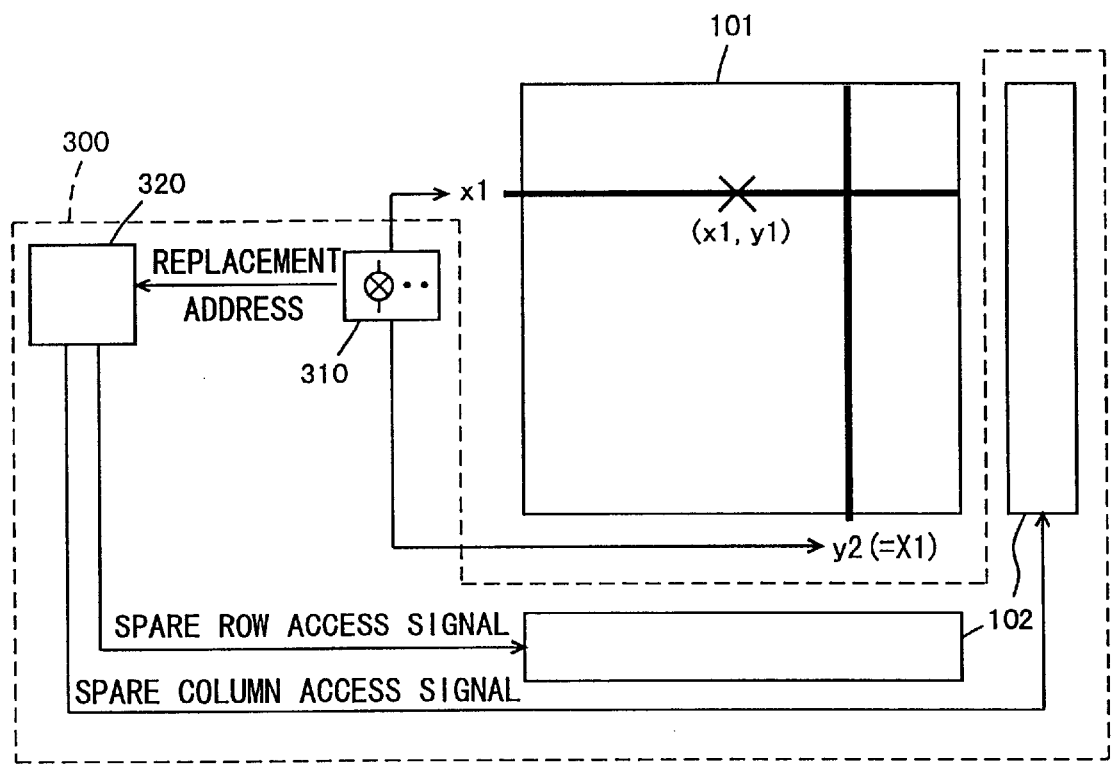
FIG. 27 conceptually shows a structure of a redundant repair circuit 300 of an eighth embodiment.

FIG. 27 conceptually shows a structure of a redundant repair circuit 300 of the eighth embodiment. Redundant repair circuit 300 includes a replacement address program circuit 310, an address comparing circuit 320 and spare memory cell array 102.

Redundant repair circuit 300 operates when a defect occurs in regular memory cell array 101, and sets a correspondence between the row or column of regular memory cells corresponding to the defect and the spare column or row in the spare memory cell array.

When a defect occurs in the regular memory cell, hardware processing for blowing a program fuse, e.g., by radiation with laser is effected on a program element provided in replacement address program circuit 310 for storing the address to be replaced (which will be referred to as a "replacement address" hereinafter). The address program elements are provided correspondingly in number to row address signals or column address signals for the regular memory cells.

Figure 28:
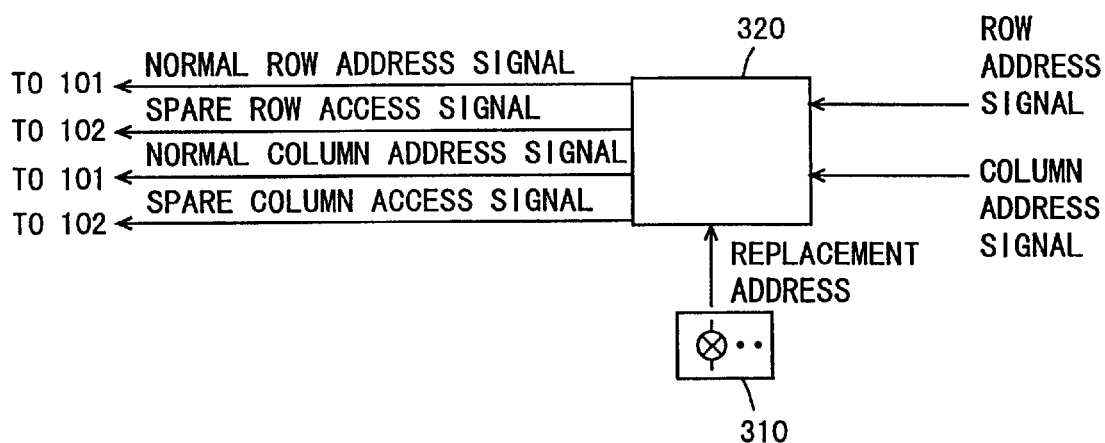
FIG. 28 conceptually shows an operation of an address comparing circuit 320.

FIG. 28 conceptually shows an operation of address comparing circuit 320. In FIG. 28, the memory cell in regular memory cell array 101 is selected in accordance with combination between the row address signals XA1–XAL and column address signals YA1–YAL, and the memory cell in spare memory cell array 102 is selected in accordance with spare row access signals SX1–SXK or spare column access signals SY1–SYK.

Referring to FIG. 28, an address comparing circuit 320 compares the received row and column addresses with the replacement addresses stored by the program elements in replacement address program circuit 310.

When the received row and column addresses do not match with the replacement addresses, i.e., when it is not necessary to repair a defect, the received row and column addresses are issued as a normal row address signal and a normal column address signal, as they are, and the corresponding row or column is accessed.

When at least one of the received row address and column address matches with the replacement addresses, i.e., when it is necessary to repair the defect, a spare row access signal or a spare column access signal is activated for accessing the corresponding spare row or spare column.

The eighth embodiment is characterized in that defect repairment is performed with the row and column addresses handled as a set. More specifically, when either one of the input row address and column address requires repairment of a defect, row and column of the normal memory cells as a set are simultaneously replaced by the corresponding spare row and the spare column as a set.

Figure 29:
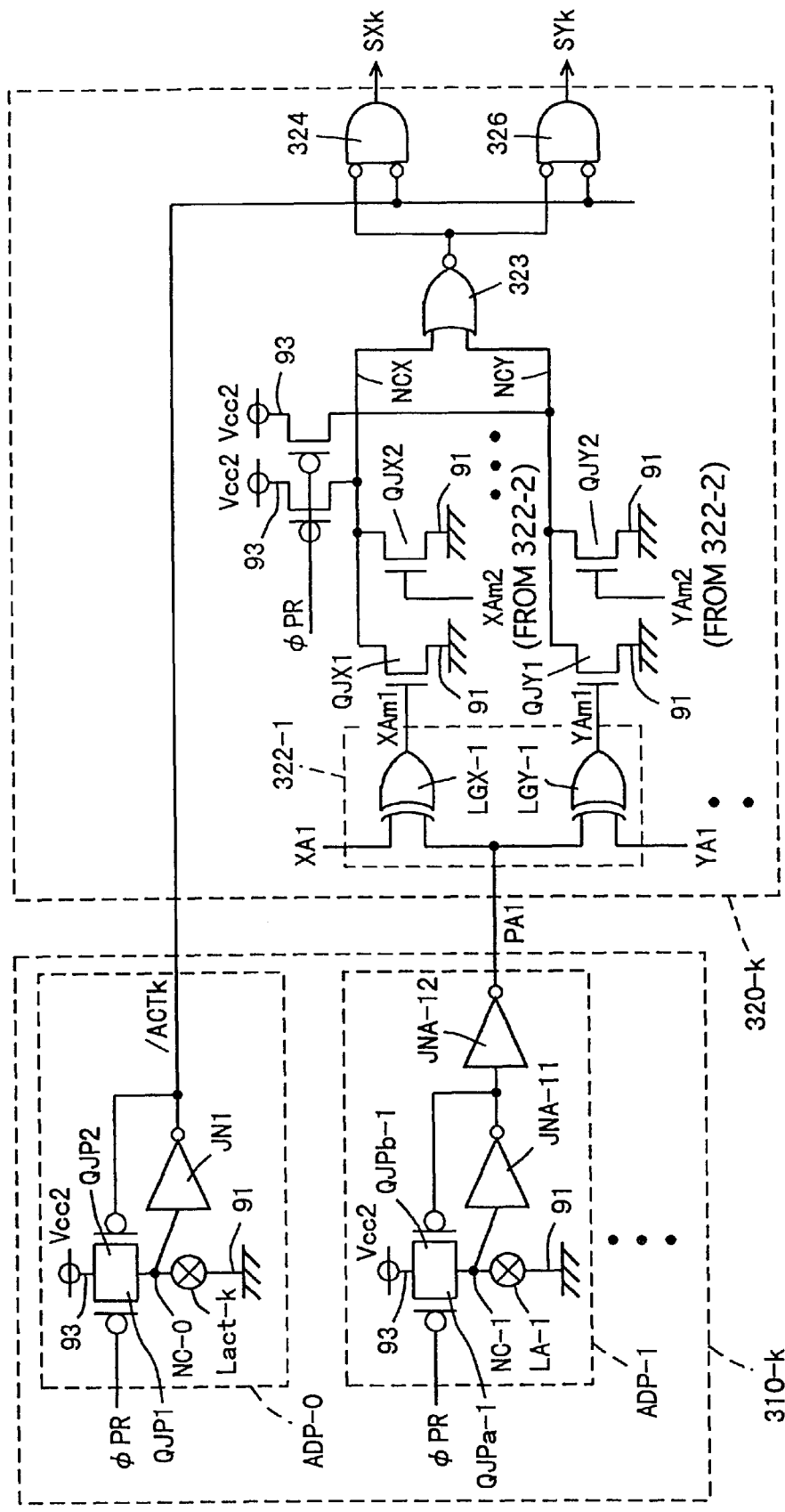
FIG. 29 shows specific structures of a replacement address program circuit 310 and an address comparing circuit 320.

FIG. 29 shows specific structures of replacement address program circuit 310 and address comparing circuit 320.

FIG. 29 shows only two circuits among those provided correspondingly in number to the spare rows and columns, and more specifically a replacement address program circuit 310-k, which generates a spare row access signal SXk and a spare column access signal SYk for activating the spare row and column in the k-th positions, as well as an address comparing circuit 320-k.

Replacement address program circuit 310-k includes fuse elements for activating the spare rows and columns and fuse elements for storing the replacement addresses, and can produce a spare activating signal /ACTk and replacement address signals PA1–PAL by appropriately blowing the fuse elements.

Replacement address program circuit 310-k includes a spare select circuit ADP-0 for activating signal /ACTk in response to blowing of fuse element Lact-k, which is provided for selecting the spare row and column in the kth positions.

Replacement address program circuit 310-k further includes an address program circuit ADP-1 for activating replacement address signal PA1 in response to blowing of fuse element LA-1.

Address program circuits ADP-1–ADP-L are provided correspondingly to the fuse elements, which are provided corresponding to respective bits of the row or column address signals in the regular memory cell, respectively.

Address comparing circuit 320-k makes comparison between the row address signal and the corresponding replacement address signal, and activates spare row access signal SXk when the compared signals match each other.

Similar comparison is performed between column address signals YA1–YAL and the corresponding replacement address signals, and spare column access signal SYk is activated.

When at least one of the row address signal and the column address signal matches with the corresponding replacement address signal, both the spare row access signal SXk and the spare column access signal SYk are activated.

Description will now be given on spare select circuit ADP-0 and address program circuit ADP-1–ADP-L in replacement address program circuit 310-k in greater detail.

Spare select circuit ADP-0 has an intermediate node NC-0, P-channel transistors QJP1 and QJP2 for connecting the intermediate node to a power supply line 93, fuse element Lact-k connected between intermediate node NC-0 and ground line 91, and an inverter JN1 which inverts the state of intermediate node NC-0 and issues signal /ACTk.

Before application of the address signal, transistor QJP1 is turned on in response to activation of a precharge signal φPR. In this case, signal /ACTk is inactive when fuse element Lact-k is unblown.

When fuse element Lact-k is already blown, signal /ACTk is activated ("L" level), and transistor QJP2 is turned on so that intermediate node NC-0 is in the fixed potential level even after deactivation of precharge signal φPR.

Address program circuit ADP-1 has the substantially same structures as spare select circuit ADP-0. Address program circuit ADP-1 activates replacement address signal PA1 in accordance with blowing of fuse element LA-1. Further, address program circuit ADP-1 has an inverter JNA-12 in addition to the structures of spare select circuit ADP-0 so that replacement address signal PA1 is active high ("H" level).

When replacement address signal PA1 becomes active, transistor QJPb-1 is turned on to fix the state of intermediate node NC-1. Although not shown, address program circuits ADP-2–ADP-L have structures similar to that of address program circuit ADP-1. Address program circuits ADP-2–ADP-L are provided correspondingly to the other fuse elements for activating the replacement address signals in response to blowing of the corresponding fuse elements, respectively.

In accordance with the signal level of respective bits of the defective address, corresponding fuse elements LA-1 to LA-L are fused. In the configuration of FIG. 29, fuse elements are fused for the bits of which signal level is "H", and the corresponding replacement address signals are activated (set to "H" level).

The structure of address comparing circuit 320-k will now be described below.

Address comparing circuit 320-k includes a match comparison gate 322-1 which compares row and column address signals XA1 and YA1 with replacement address signal PA1, and generates a row address comparing signal XAm1 and a column address comparing signal YAm1, common nodes NCX and NCY, an N-channel transistor QJX1 which receives row address comparing signal XAm1 on its gate, and connects common node NCX to ground line 91, and an N-channel transistor QJY1 which receives column address comparing signal YAm1 on its gate, and connects common node NCY to ground line 91.

Address comparing circuit 320-k further includes a logic gate 323 receiving voltage levels of common nodes NCX and NCY as two inputs and providing a result of NOR operation, a logic gate 324 which activates spare row access signal SXk and a logic gate 326 activating the spare column access signal SYk, in response to both the output of logic gate 323 and the signal /ACTk.

The match comparison gate 322-1 operates to activate (set to "L" level) row or column comparing signal XAm1 or YAm1 with logic gate ADX-1 or ADY-1 when the replacement address signal PA1 matches with the row or column address signal XA1 or YA1. Otherwise, it operates to inactive (set to "H" level) the row or column comparing signal XAm1 or YAm1.

In response to inactivation of row or column address comparing signal XAm1 or YAm1, transistor QJX1 or QJY1 is turned on, and common node NCX or NCY, which was precharged to "H" level in response to precharge signal φPR before address selection, is connected to the ground line.

Address comparing circuit 320-k further includes match comparison gates, which compare the other replacement address signals with corresponding row address signals XA2–XAL and corresponding column address signals YA2–YAL for issuing the row address comparing signals XAm2–XAm2L and column address comparing signals YAm2–YAmL.

Address comparing circuit 320-k further includes a plurality of transistors which receive on their gates the other row address comparing signals described above, and connect common node NCX to the ground line. Likewise, a plurality of transistors, which receive on their gates the other column address comparing signals described above, are connected between common node NCX and the ground line.

Therefore, when all the bits XA1 to XAL of the row address signal match with all the bits of the replacement address PA1–PAL programmed in the fuse, the voltage level of common node NCX is maintained at the "H" level, and when the row address signal and the replacement address are not in perfect match, the voltage level of the common node NCX attains to the "L" level. Similarly, when all the bits YA1 to YAL of the column address signal match with all the bits of the replacement address programmed in the fuse, the voltage level of common node NCY is maintained at the "H" level, and when the column address signal and the replacement address are not in perfect match, the voltage level of common node NCY attains to "L" level.

According to the above structure, spare access signal SXk and SYk are activated when the replacement repair is instructed in connection with either the row address signal or column address signal supplied to the address comparing circuit, i.e., when the corresponding fuse element is blown. In accordance with the activation of the spare access signal, the corresponding spare row and spare column are accessed.

In the eighth embodiment, consideration is given to the following fact in the redundant repair structure. Rather than the total number of spare rows and spare columns of the spare memory cells, the degree of freedom of replacement, which depends on the fashion of arrangement of the spare rows and columns as well as the manner of setting the correspondence with the defective address, determines whether the defect in the regular memory cell can be repaired or not in many cases. In view of this, the eighth embodiment is aimed at reduction in number of the program elements which are provided for respective spare columns and rows in the prior art while maintaining the redundant repair performance as a whole.

In match comparison gate 322, both the row and column address comparing signals are determined based on one replacement address signal. Thereby, one row and one column in the regular memory cell array are brought into correspondence with each other to handle them as one set, and the match comparison with the replacement address is performed on each set at a time for performing the address replacement.

In other words, the normal memory cell array is divided into a plurality of groups of the aforementioned set by set, and the spare memory cells are also divided into a plurality of groups each having spare rows and spare columns equal in number to the number of rows and columns included in one set mentioned above. In the feature of the eighth embodiment is that redundancy repairment is performed by the unit of the group.

Thereby, the replacement address program circuit may be provided with the address program elements for only the rows or columns so that the replacement address program elements can be reduced in number without reducing the maximum number of the rows or columns which can be repaired.

FIG. 29 shows by way of example a structure, in which the row and column addresses establishing a relationship of x=y (x: row address, y: column address) are simultaneously replaced with the same replacement address program element. The correspondence of the addresses is not restricted to the above, and arbitrary relationship can be employed provided that a one-to-one correspondence is present between the rows and columns.

For example, a relationship of, e.g., x=/y (y, is a complement of x) or x=y+a (a: constant) may be employed to provide a correspondence between the spare row address and the spare column address.

By employing the above structure in redundant repair circuit 300, the number of program elements can be effectively reduced while maintaining the defect repair performance by the redundant repair structure, and it is possible to reduce significantly the area of the program element portion in the redundant repair circuit, which may disadvantageously increase in accordance with increase in memory capacity.

Figure 30:
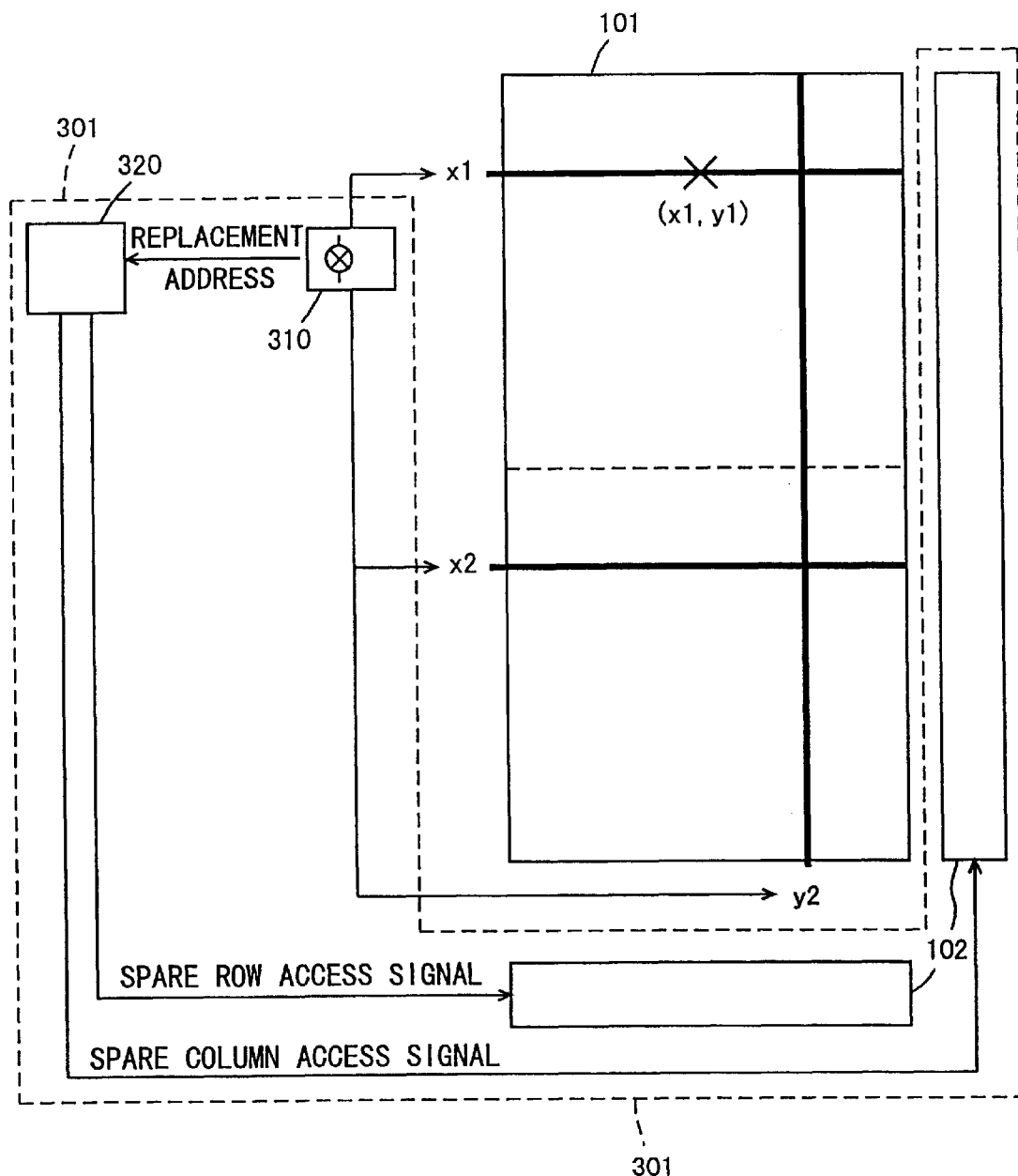
FIG. 30 conceptually shows a structure of a redundant repair circuit 301 in a structure having rows and columns of memory cells of different numbers.
Figure 31:
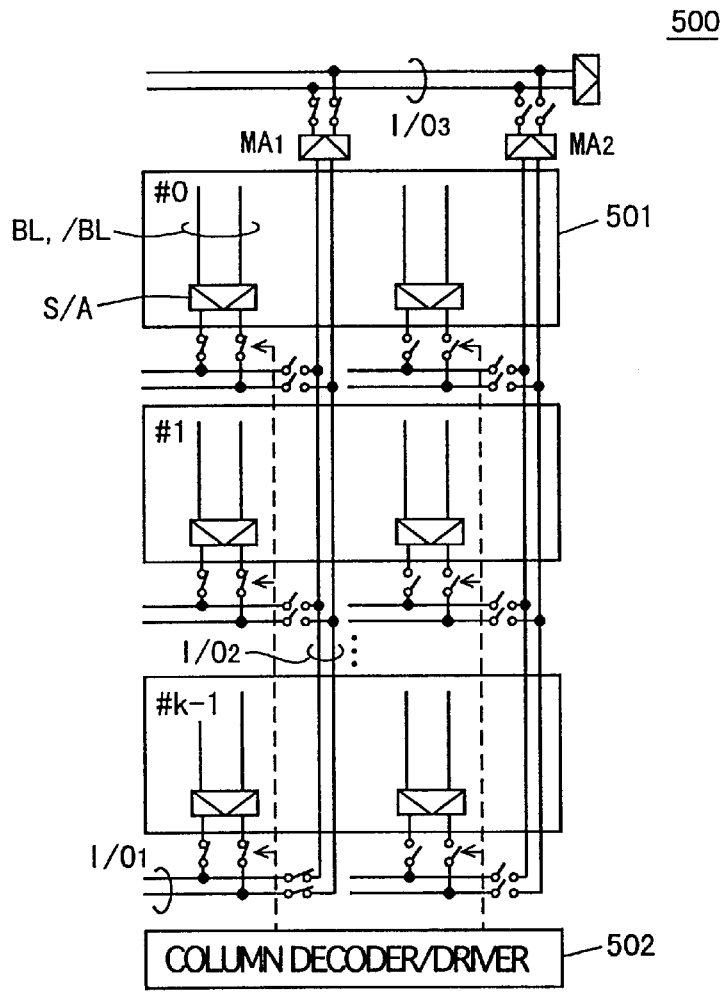
FIG. 31 conceptually shows a whole structure of a semiconductor memory device 500 having a typical hierarchical I/O line system.
Figure 32:
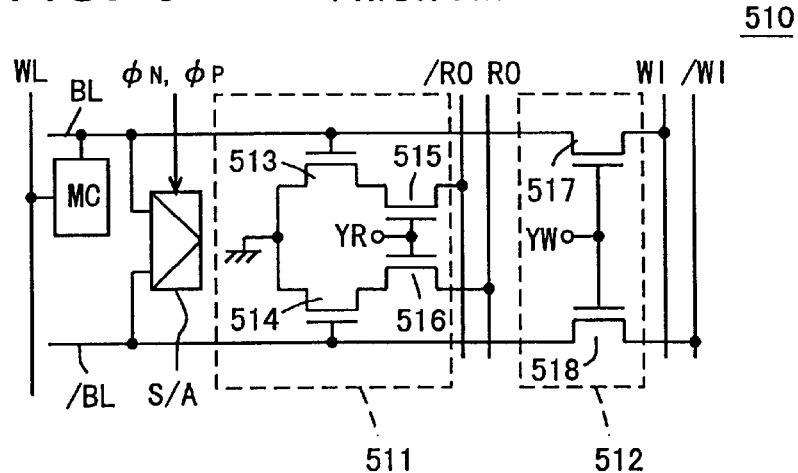
FIG. 32 is a circuit diagram showing a structure of a circuit related to column selection of a semiconductor memory device 510 having a typical direct sensing system.
Figure 33:
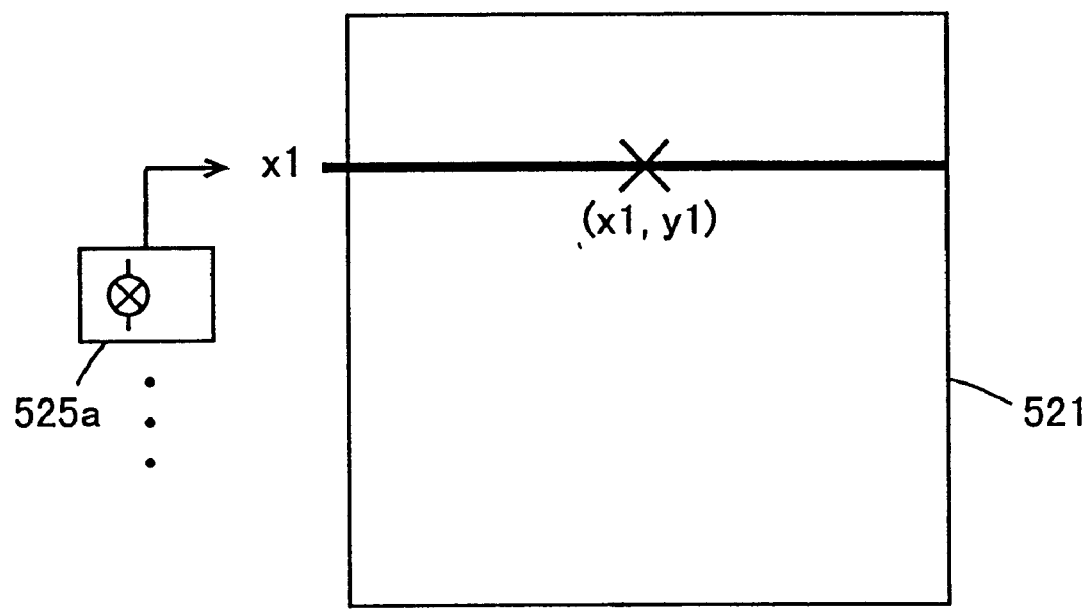
FIG. 33 conceptually shows a structure of a redundant repair circuit in a typical redundant repair structure.

FIG. 30 schematically shows a whole structure of a redundant repair circuit 301 of the eighth embodiment, in which regular memory cell array 101 is not square, and therefore the row addresses are different in number from the column addresses.

In this case where the row and column addresses are different in number from each other, a one-to-one correspondence shown in FIG. 28 cannot be established between x and y.

FIG. 30 shows by way of example arrangement of the replacement address program elements in the case where the number of the row addresses in the regular memory cell array is twice as large as the number of the column addresses, and therefore the memory cells in regular memory cell array 101 are selected by combinations between the row address signals of 2L in number and the column address signals of L in number.

For the redundant repair in the above case, the regular memory cell array is divided, e.g., into two regions each including the row addresses of L in number along dotted line in FIG. 30. In addition to the above division, repair row address signals XHA1–XHAL of L in number are employed commonly for the row addresses in both the two regions. More specifically, each repair row address signal is related to one row address in each region.

In replacement address program circuit 310 and address comparing circuit 320 shown in FIG. 29, address comparison is performed using repair row address signals XHA1–XHAL instead of row address signals XA1–XAL, and spare access signals SXk and SYk are activated so that two regular row addresses x1 and x2 are brought into correspondence with one regular column address y2 by replacement address program circuit 310. Thereby, one address program element can simultaneously perform the replacement of two x-addresses and one y-address for address replacement and determination.

Further, by such a structure in that in response to activation of the spare access signal SXk, two spare rows equal in number to the normal rows corresponding to one repairment row address signal are accessed simultaneously, it becomes possible to perform defect repairment by the unit of a set including two normal row addresses x1 and x2 and one normal column address y2.

As described above, if the row addresses are different in number from the column addresses, multiple addresses among the addresses which are larger in number are related to one of the addresses which are smaller in number, and the related addresses are simultaneously replaced. Thereby, the redundant repair of the whole memory cell array can be performed with the replacement address program elements of the bit number, which corresponds to the number of the fewer addresses (y-addresses in FIG. 29).

Owing to the above structure, the number of the address program elements can be significantly reduced, and the area of the program element portion can be reduced while maintaining the defect repair performance by the redundant program, even in the case where the row addresses are different in number from the column addresses.

According to the above manner, the column and row addresses of the regular memory cell array are divided, and the repair address designating signals which are provided commonly to the divided region are used for simultaneously replacing and repairing the row address(es) and the column address(es) of the different numbers. This method is not restricted to the foregoing case where the memory cell array is rectangular and therefore the ratio between numbers of rows and columns in the memory cell array is 1:n, and can likewise be applied to the case where the memory cell array is square (the ratio between numbers of rows and columns is 1:1, and the case where the memory cell array is rectangular and the ratio between numbers of rows and columns is n1:n2.

The eighth embodiment may be combined with the first to seventh embodiments, whereby the direct sensing system and the I/O line structure of parallel and hierarchical types can effectively reduce the layout area of the semiconductor memory device allowing fast processing of the memory of a large capacity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for reading and writing storage data in accordance with an address signal, comprising:
a plurality of memory cell blocks arranged in a matrix of a first number of columns and a second number of rows,
each of said memory cell blocks including
a plurality of memory cells arranged in a matrix of memory cell rows and memory cell columns,
bit line pairs arranged corresponding to said memory cell columns, respectively, and
at least one first data line pair for transmitting read data from one of said memory cells selected according to said address signal;
a plurality of read column select lines for instructing selection of at least one of said memory cell columns;
a column select circuit for selectively activating at least one of said read column select lines in accordance with said address signal; and
a plurality of read data transmitting circuits, provided corresponding to said memory cell blocks, respectively, for transmitting said read data sent from the selected memory cell column onto said first data line pair,
each of said read data transmitting circuits including
a plurality of first gate circuits provided correspondingly to said memory cell columns, respectively, and each being activated by the corresponding one among said read column select lines,
each of said first gate circuits having
a first read gate switch to be selectively activated by the corresponding read column select line in accordance with the potential level on one line of said paired bit lines, and
a second read gate switch to be selectively activated by the corresponding read column select line in accordance with the potential level on the other line of said paired bit lines.

2. The semiconductor memory device according to claim 1, wherein
each of said memory cell blocks includes a third number of memory cell columns;
said column select circuit selects one of said third number of memory cell columns, and sets the potential of the corresponding read column select line at a level causing turn-on of one of said first and second read gate switches corresponding to said selected memory cell column in accordance with the potential level on said bit line pair;
said semiconductor memory device further comprises a data line drive circuit for setting the potential level on said first data line pair; wherein
said data line drive circuit maintains the off state of said first and second read gate switches corresponding to the unselected memory cell columns by controlling the potential level of the line of said first data line pair connected to the activated read column select line.

3. The semiconductor memory device according to claim 2, wherein
the potential level on the activated read column select line is a first potential;
the potential level on the inactive read column select line is a second potential higher than said first potential;
said semiconductor memory device further comprises a power supply line for supplying a third potential higher than said first potential; wherein
said first read gate switch includes a first MOS transistor arranged for electrically connecting one line of said first data line pair to said corresponding read column select line, and having a gate connected to one line of said bit line pair;
said second read gate switch includes a second MOS transistor arranged for electrically connecting the other line of said first data line pair to said corresponding read column select line, and having a gate connected to the other line of said bit line pair;

said data line drive circuit includes
a main amplifier circuit for amplifying a potential difference on said first data line pair, and
a high-resistance circuit and a first mode select switch connected in series between said first data line pairs and said power supply line, said first mode select switch being turned on when a read operation is to be performed; and
said data line drive circuit keeps potential level of the line of said first data line pair connected to the activated read column select line by one of said first and second MOS transistors at a level higher than the voltage of said one line of said bit line pair minus a threshold voltage of said first MOS transistor and higher than the voltage of said other line of said bit line pair minus a threshold voltage of said second MOS transistor.

4. The semiconductor memory device according to claim 1, further comprising:
a plurality of second data line pairs each provided in common for the second number of said memory cell blocks belonging to the identical column of the memory cell blocks, and each connected to said first data line pairs of the second number of said memory cell blocks, and
a data line drive circuit for setting the potential levels on said first and second data line pairs; wherein
each of said memory cell blocks includes a third number of memory cell columns;
said column select circuit selects one of the third number of said memory cell columns, and sets the potential of the corresponding read column select line at a level causing turn-on of one of said first and second read gate switches corresponding to said selected memory cell column in response to the potential level on said bit line pair,
said data line drive circuit maintains the off state of said first and second read gate switches corresponding to the unselected memory cell columns by controlling the potential level of the line of said first data line pair connected to the activated read column select line.

5. The semiconductor memory device according to claim 4, wherein
the potential level on the activated read column select line is a first potential;
the potential level on the inactive read column select line is a second potential higher than said first potential;
said semiconductor memory device further comprises a power supply line for supplying a third potential higher than said first potential; wherein
each of said memory cell blocks further includes sense amplifiers each arranged for each of said bit line pairs for amplifying potential differences on said bit line pairs, respectively;
said bit line pair is precharged before one of word lines is activated;
said first read gate switch includes a first MOS transistor arranged for electrically connecting one line of said first data line pair to said corresponding read column select line, and having a gate connected to one line of said bit line pair;
said second read gate switch includes a second MOS transistor arranged for electrically connecting the other line of said first data line pair to said corresponding read column select line, and having a gate connected to the other line of said bit line pair;

said data line drive circuit includes
a main amplifier circuit for amplifying a potential difference occurring on said second data line pair, and
a high-resistance circuit and a first mode select switch connected in series between second data line pair and said power supply line, said first mode select switch being turned on when a read operation is to be performed; and
said data line drive circuit keeps potential level of the line of said first data line pair connected to the activated read column select line by one of said first and second MOS transistors at a level higher than a potential obtained by subtracting a threshold voltage of said first and second MOS transistors from said precharged potential on said bit line pair.

6. The semiconductor memory device according to claim 4, wherein
each of said memory cell blocks further includes a third data line pair for transmitting write data to the memory cell selected according to said address signal;
said column select circuit generates a column select signals for selecting one from the third number of memory cell columns to be supplied with said write data, and a memory cell block select signal for selecting one of the second number of said memory cell blocks provided corresponding to one same said second data line pair; and
said semiconductor memory device further comprises:
a plurality of memory cell block select lines for transmitting said memory cell block select signal,
a plurality of write column select lines transmitting said column select signals,
a plurality of fourth data line pairs each provided in common for the second number of said memory cell blocks belonging to one same column of said memory cell blocks, and connected to each of said third data line pairs in each of said memory cell blocks,
a memory cell block select gate provided for each of said memory cell blocks for connecting said fourth data line pair to said third data line pair in response to said memory cell block select signal, and
a plurality of write data transmitting circuits for connecting said third data line pair to said bit line pair of the selected memory cell column in response to said column select signals,
each of said write data transmitting circuits including
a plurality of second gate circuits provided for said memory cell columns in said memory cell block, and being activated by the corresponding write column select lines, respectively, and each of said second gate circuits including:
a first write gate switch for connecting one line of said bit line pair to one line of said third data line pair in accordance with the potential level on said write column select line, and
a second write gate switch for connecting the other line of said bit line pair to the other line of said third data line pair in accordance with the potential level on said write column select line.

7. The semiconductor memory device according to claim 1, wherein
each of said memory cell blocks further includes a third data line pair for transmitting write data to said memory cells;

said column select circuit generates column select signals for selecting the memory cell column to be supplied with said write data in accordance with said address signal;

said semiconductor memory device further comprises:
a plurality of write column select lines transmitting said column select signals,
a plurality of second data line pairs each provided in common for the second number of said memory cell blocks belonging to one same column of the memory cell blocks, and connected to each of said first data line pairs in each of said memory cell blocks,
a plurality of fourth data line pairs provided in common for the second number of said memory cell blocks belonging to one same column of the memory cell blocks, and connected to each of said third data line pairs in each of said memory cell blocks, and
a plurality of write data transmitting circuits for connecting the third data line pair to said bit line pair of the selected memory cell column in response to said column select signals,
each of said write data transmitting circuits including
a plurality of second gate circuits provided for said memory cell columns in each said memory cell block, and being activated by the corresponding write column select lines, respectively, and
each of said second gate circuits including
a first write gate switch for connecting one line of said bit line pair to one line of said third data line pair in accordance with the potential level on said write column select line, and
a second write gate switch for connecting the other line of said bit line pair to the other line of said third data line pair in accordance with the potential level on said write column select line.

8. The semiconductor memory device according to claim 7, wherein
said first and third data line pairs are provided for each of said memory cell columns in the corresponding memory cell block;
said read column select lines include
a plurality of read column sub select lines arranged in the column direction of said memory cell blocks, each for instructing selection of the memory cell columns included in same column of memory cell blocks, and
a plurality of read memory cell block select lines arranged in said column direction, each for instructing selection of one of the second number of said memory cell blocks corresponding to one same read column sub select line in the read operation;
said column select signals include
a plurality of column select sub signals for selecting the memory cell columns included in one same column of memory cell blocks, and
a plurality of memory cell block select signals each for selecting one of the second number of said memory cell blocks corresponding to one same read column sub select line in the write operation;
said write column select lines include
a plurality of write column sub select lines arranged in the column direction of said memory cell blocks each for transmitting said column select sub signal, and
a plurality of write memory cell block select lines arranged in said column direction each for transmitting said memory cell block select signal;
said first and second read gate switches connect said read column sub select line to said first data line pair;
said first and second write gate switches are turned on in response to the column select sub signal on the corresponding write column sub select line; and
each of said memory cell blocks includes
a read memory cell block select switch arranged between said first and second data line pairs, and being turned on in accordance with the potential level on said read memory cell block select line, and
a write memory cell block select switch arranged between said third and fourth data line pairs, and being turned on in accordance with the memory cell block select signal on said write memory cell block select line.

9. The semiconductor memory device according to claim 7, wherein
at least a part of said plurality of read column select lines are arranged perpendicular to said write column select lines.

10. The semiconductor memory device according to claim 9, wherein
said first data line pair is provided for each of said memory cell columns in the corresponding memory cell block;
said third data line pair is provided in common for said memory cell columns in the corresponding memory cell block;
said read column select lines include
a plurality of read column sub select lines arranged in the column direction of said memory cell block, each for instructing selection of the memory cell columns included in same column of memory cell blocks, and
a plurality of read memory cell block select lines arranged in said column direction, each for instructing selection of one from the second number of said memory cell blocks corresponding to the same read column sub select line in the read operation;
said column select signals include
a plurality of column select sub signals each for selecting one from said plurality of memory cell columns included in each memory cell block belonging to one same row of said memory cell blocks;
said write column select lines include
a plurality of write column sub select lines arranged in the row direction of said memory cell blocks, each for transmitting said column select sub signal;
said first and second read gate switches connect said read column sub select line to said first data line pair;
said first and second write gate switches are turned on in accordance with the column select sub signal on said write column sub select line; and
each of said memory cell blocks further includes
a read memory cell block select switch arranged between said first and second data line pairs, and being turned on in response to the potential level on said read memory cell block select line.

11. The semiconductor memory device according to claim 9, wherein
said first data line pair is provided in common for said memory cell columns in the corresponding memory cell block;
said third data line pair is provided for each of said memory cell columns in the corresponding memory cell block;

said read column select lines include a plurality of read column sub select lines arranged in the row direction of said memory cell blocks, each for selecting one of said memory cell columns included in each of said memory cell blocks belonging to one same row of the memory cell blocks;

said plurality of column select signals include a plurality of column select sub signals each for selecting all the memory cell columns included in one same column of memory cell block, and a plurality of memory cell block select signals each for selecting one of the second number of said memory cell blocks corresponding to the same column select sub signal in the write operation;

said write column select lines include a plurality of write column sub select lines arranged in the column direction of said memory cell block, each for transmitting said column select sub signal, and a plurality of write memory cell block select lines, arranged in said column direction, each for transmitting said memory cell block select signal;

said first and second read gate switches connect the corresponding read column sub select line to said first data line pair;

said first and second write gate switches are turned on in response to the column select sub signal on said write column sub select line; and each of said memory cell blocks includes a write memory cell block select switch arranged between said third and fourth data line pairs, and being turned on in accordance with the memory cell block select signal on said write memory cell block select line.

12. The semiconductor memory device according to claim 9, wherein said read column select lines include a plurality of first read column sub select lines arranged in the row direction of said memory cell block, each for instructing selection of a plural number of memory cell columns from said plurality of memory cell columns included in said memory cell blocks belonging to one same row, and a plurality of second read column sub select lines arranged in the column direction of said memory cell block, each for instructing selection of one from said plural number of said memory cell columns;

said first and second read gate switches connect the corresponding first read column sub select line to said first data line pair;

each of said read data transmitting circuits further includes a plurality of third gate circuits provided corresponding to said memory cell columns in each said memory cell block, respectively, and each being activated by the corresponding second read column sub select line; and each of said third gate circuits includes a third read gate switch for connecting said first read gate switch to one line of said first data line pair in accordance with the potential level on corresponding second read column sub select line, and a fourth read gate switch for connecting said second read gate switch and the other line of said first data line pair in accordance with the potential level on the corresponding second read column sub select line.

13. The semiconductor memory device according to claim 1, wherein said column select circuit generates column select signals for selecting the memory cell column to be supplied with write data in accordance with said address signal;

each of said memory cell blocks further includes a second data line pair for transmitting said write data to said memory cell column;

said semiconductor memory device further comprises:

a plurality of write column select lines transmitting said column select signals, a plurality of third data line pairs each provided in common for the second plurality of said memory cell blocks belonging to one same column of the memory cell blocks, and a plurality of write data transmitting circuits for connecting said second data line pair to said bit line pair in the selected memory cell column in accordance with said column select signals, each of said write data transmitting circuits including a plurality of second gate circuits provided correspondingly to said memory cell columns in said memory cell block, and being activated by the corresponding write column select lines, respectively; and wherein each of said second gate circuit includes a first write gate switch for connecting one line of said bit line pair and one line of said second data line pair in accordance with the column select signal on the corresponding write column select line, and a second write gate switch for connecting the other line of said bit line pair and the other line of said second data line pair in accordance with the column select signal on the corresponding write column select line; and said semiconductor memory device further comprises a plurality of first mode select switches provided corresponding to said memory cell blocks respectively, each for connecting said first data line pair and corresponding third data line pair when read operation is to be performed and a plurality of second mode select switches provided corresponding to said memory cell blocks, respectively, for connecting said second data line pair and corresponding third data line pair when write operation is to be performed.

14. The semiconductor memory device according to claim 13, wherein said memory cell block includes a third number of memory cell columns;

said third number of memory cell columns are divided into a fourth number of sub-groups;

said column select circuit further generates a plurality of column sub-group select signals for selecting a part of said fourth number of sub-groups;

said second data line pairs are divided and arranged corresponding to each of said sub-groups; and each of said sub-groups further includes a sub switch for connecting the divided second data line pair to corresponding third data line pair in accordance with corresponding one among said column sub-group select signals.

15. The semiconductor memory device according to claim 13, wherein at least a part of said plurality of read column select lines are arranged perpendicular to said write column select lines.

16. A semiconductor memory device for reading and writing storage data in accordance with an address signal, comprising:

a plurality of memory cell blocks arranged in a matrix of
a first number of columns and a second number of rows, each of said memory cell blocks including
a plurality of memory cells arranged in a matrix of memory cell rows and memory cell columns, and
bit line pairs arranged correspondingly to said memory cell columns, respectively;

a plurality of read column select lines for instructing selection of one of said memory cell columns;

a column select circuit for selectively activating at least one of said read column select lines in accordance with said address signal;

a plurality of global data line pairs each provided in common for the second number of said memory cell blocks belonging to one same column of the memory cell blocks, a plurality of read data transmitting circuits, provided corresponding to said memory cell blocks, respectively, for transmitting said read data sent from the selected memory cell column onto said global data line pair, each of said read data transmitting circuits including a third number of first gate circuits each provided for each of said memory cell columns in each of said memory cell blocks, each of said first gate circuits being activated by a corresponding one of said read column select lines and having
a first read gate switch for connecting said corresponding one of said read column select lines to a first one out of the remainder of said read column select lines in accordance with the potential level on one line of said bit line pair, and
a second read gate switch for connecting said corresponding one of read column select lines to a second one out of the remainder of said read column select lines in accordance with the potential level on the other line of said bit line pair; and a plurality of column select line switching circuits each for connecting said first and second ones of said read column select lines to the lines of said global data line pair, respectively, in accordance with an instruction from said column select circuit.

17. The semiconductor memory device according to claim 16, wherein the potential level on the activated read column select line is a first potential;

the potential level on the inactive read column select line is a second potential higher than said first potential;

said semiconductor memory device further comprises:

a power supply line for supplying a third potential higher than said first potential, and a data line drive circuit for setting the potential levels on said global data line pairs;

said first read gate switch includes a first MOS transistor electrically connecting the corresponding read column select line to said first one of said read column select lines and having a gate connected to one line of said bit line pair;

said second read gate switch includes a second MOS transistor electrically connecting said corresponding read column select line to said second one of said read column select lines, and having a gate connected to the other line of said bit line pair;

said data line drive circuit includes
a main amplifier circuit for amplifying a potential difference on said global data line pair, and
a high-resistance circuit connected between said global data line pair and said power supply line; and said data line drive circuit keeps potential level of the read column select line connected to the activated read column select line by one of said first and second MOS transistors at a level higher than the voltage of said one line of said bit line pair minus a threshold voltage of said first MOS transistor and higher than the voltage of said other line of said bit line pair minus a threshold voltage of said second MOS transistor.

18. The semiconductor memory device according to claim 16, wherein said column select circuit generates column select signals for selecting the memory cell column to be supplied with write data in accordance with said address signal;

said semiconductor memory device further comprises:

a plurality of write column select lines for transmitting said column select signals, a plurality of write drive circuits each provided for each of said global data line pairs, for transmitting said write data and inverted data of said write data onto two of said read column select lines, respectively, and a plurality of write data transmitting circuits for transmitting said write data onto said bit line pair in accordance with said column select signals, each of said write data transmitting circuits including a plurality of second gate circuits provided correspondingly to said memory cell columns in each of said memory cell blocks and being activated by the corresponding one of said write column select lines, respectively, and each of said second gate circuits including
a first write gate switch for connecting one line of said bit line pair to one of said two read column select lines in accordance with said column select signal, and
a second write gate switch for connecting the other line of said bit line pair and the other line of said two read column select lines in accordance with said column select signal.

19. A semiconductor memory device for reading and writing storage data in accordance with an address signal, comprising:

a plurality of memory cell blocks arranged in a matrix of a first number of columns and a second number of rows, each of said memory cells blocks including
a plurality of memory cells arranged in a matrix of memory cell rows and memory cell columns,
bit line pairs arranged corresponding to memory cell columns, respectively, and
at least one first data line pair for transmitting read data from one of said memory cells selected according to said address signal;

a plurality of read column select line for instructing selection of at least one of said memory cell columns;

a column select circuit for selectively activating at least one of said read column select lines in accordance with said address signal; and a plurality of read data transmitting circuits, providing corresponding to said memory cell blocks, respectively, for transmitting said read data sent from the selected memory cell column onto said first data line pair, each of said read data transmitting circuits including
a plurality of first gate circuits provided correspondingly to said memory cell columns, respectively, and each being activated by the corresponding one among said read column select lines,
each of said first gate circuits having
a first read gate switch for connecting the corresponding read column select line to one line of said first data line pair in accordance with the potential level on one of said paired bit lines, and
a second read gate switch for connecting the corresponding read column select line to one line of said first data line pair in accordance with the potential level on the other of said paired bit lines; wherein
each of said memory cell blocks includes a third number of memory cell columns;
said column select circuit selects one of said third number of memory cell columns, and sets the potential of the corresponding read column select line at a level causing turn-on of one of said first and second read gate switches corresponding to said selected memory cell column in accordance with the potential level on said bit line pair;
said semiconductor memory device further comprises a data line drive circuit for setting the potential level on said first data line pair; wherein
said data line drive circuit maintains the off state of said first and second read gate switches corresponding to the unselected memory cell columns by controlling the potential level of the line of said first data line pair connected to the activated read column select line.

20. A semiconductor memory device according to claim 19, wherein
the potential level on the activated read column select line is a first potential;
the potential level on the inactive read column select line is a second potential higher than said first potential;
said semiconductor memory device further comprises a power supply line for supplying a third potential higher than said first potential; wherein
said first read gate switch includes a first MOS transistor arranged for electrically connecting one line of said first data line pair to said corresponding read column select line, and having a gate connected to one line of said bit line pair;
said second read gate switch includes a second MOS transistor arranged for electrically connecting the other line of said first data line pair to said corresponding read column select line, and having a gate connected to the other line of said bit line pair;
said data line drive circuit includes
a main amplifier circuit for amplifying a potential difference on said first data line pair, and
a high-resistance circuit and a first mode select switch connected in series between said first data line pairs and said power supply line, said first mode select switch being turned on when a read operation is to be performed; and
said data line drive circuit keeps potential level of the line of said first data line pair connected to the activated read column select line by one of said first and second MOS transistors at a level higher than the voltage of said one line of said bit line pair minus a threshold voltage of said first MOS transistor and higher than the voltage of said other line of said bit line pair minus a threshold voltage of said second MOS transistor.

21. A semiconductor memory device for reading and writing storage data in accordance with an address signal, comprising:
a plurality of memory cell blocks arranged in a matrix of a first number of columns and a second number of rows,
each of said memory cell blocks including
a plurality of memory cell arranged in a matrix of memory cell rows and memory cell columns,
bit line pairs arranged corresponding to said memory cell columns, respectively, and
at least one first data line pair for transmitting read data from one of said memory cells selected according to said address signal;
a plurality of read column select lines for instructing selection of at least one of said memory cell columns;
a column select circuit for selectively activating at least one of said read column select lines in accordance with said address signal; and
a plurality of read data transmitting circuits, provided corresponding to said memory cell blocks, respectively, for transmitting said read data sent from the selected memory cell column onto said first data line pair,
each of said read data transmitting circuits including
a plurality of first gate circuits provided correspondingly to said memory cell columns, respectively, and each being activated by the corresponding one among said read column select lines,
each of said first gate circuits having
a first read gate switch for connecting the corresponding read column select line to one line of said first data line pair in accordance with the potential level on one of said paired bit lines, and
a second read gate switch for connecting the corresponding read column select line to the other line of said first data line pair in accordance with the potential level on the other of said paired bit lines; further comprising:
a plurality of second data line pairs each provided in common for the second number of said memory cell blocks belonging to the identical column of the memory cell blocks, and each connected to said first data line pairs of the second number of said memory cell blocks, and
a data line drive circuit for setting the potential levels on said first and second data line pairs; wherein
each of said memory cell blocks includes a third number of memory cell columns;
said column select circuit selects one of the third number of said memory cell columns, and sets the potential of the corresponding read column select line at a level causing turn-on of one of said first and second read gate switches corresponding to said selected memory cell column in response to the potential level on said bit line pair,
said data line drive circuit maintains the off state of said first and second read gate switches corresponding to the unselected memory cell columns by controlling the potential level of the line of said first data line pair connected to the activated read column select line.

22. The semiconductor memory device according to claim 21, wherein
the potential level on the activated read column select line is a first potential,
the potential level on the inactive read column select line is a second potential higher than said first potential;

said semiconductor memory device further comprises a power supply line for supplying a third potential higher than said first potential; wherein each of said memory cell blocks further includes sense amplifiers each arranged for each of said bit line pairs for amplifying potential differences on said bit line pairs, respectively;

said bit line pair is precharged before one of word lines is activated;

said first read gate switch includes a first MOS transistor arranged for electrically connecting one line of said first data line pair to said corresponding read column select line, and having a gate connected to one line of said bit line pair;

said second read gate switch includes a second MOS transistor arranged for electrically connecting the other line of said first data line pair to said corresponding read column select line, and having a gate connected to the other line of said bit line pair;

said data line drive circuit includes
 a main amplifier circuit for amplifying a potential difference occurring on said second data line pair, and
 a high-resistance circuit and a first mode select switch connected in series between second data line pair and said power supply line, said first mode select switch being turned on when a read operation is to be performed; and said data line drive circuit keeps potential level of the line of said first data line pair connected to the activated read column select line by one of said first and second MOS transistors at a level higher than a potential obtained by subtracting a threshold voltage of said first and second MOS transistors from said precharged potential on said bit line pair.

23. The semiconductor memory device according to claim 21, wherein each of said memory cell blocks further includes a third data line pair for transmitting write data to the memory cell selected according to said address signal;

said column select circuit generates a column select signals for selecting one from the third number of memory cell columns to be supplied with said write data, and a memory cell block select signal for selecting one of the second number of said memory cell blocks provided corresponding to one same said second data line pair; and said semiconductor memory device further comprises:
 a plurality of memory cell block select lines for transmitting said memory cell block select signal,
 a plurality of write column select lines transmitting said column select signals,
 a plurality of fourth data line pairs each provided in common for the second number of said memory cell blocks belonging to one same column of said memory cell blocks, and connected to each of said third data line pairs in each of said memory cell blocks,
a memory cell block select gate provided for each of said memory cell blocks for connecting said fourth data line pair to said third data line pair in response to said memory cell block select signal, and
a plurality of write data transmitting circuits for connecting said third data line pair to said bit line pair of the selected memory cell column in response to said column select signals,
 each of said write data transmitting circuits including a plurality of second gate circuits provided for said memory cell columns in said memory cell block, and being activated by the corresponding write column select lines, respectively, and each of said second gate circuits including:
 a first write gate switch for connecting one line of said bit line pair to one line of said third data line pair in accordance with the potential level on said write column select line, and
 a second write gate switch for connecting the other line of said bit line pair to the other line of said third data line pair in accordance with the potential level on said write column select line.

24. A semiconductor memory device for reading and writing storage data in accordance with an address signal, comprising:

a plurality of memory cell blocks arranged in a matrix of a first number of columns and a second number of rows, each of said memory cell blocks including
 a plurality of memory cells arranged in a matrix of memory cell rows and memory cell columns,
 bit line pairs arranged corresponding to said memory cell columns, respectively, and
 at least one first data line pair for transmitting read data from one of said memory cells selected according to said address signal;

a plurality of read column select lines for instructing selection of at least one of said memory cell columns;

a column select circuit for selectively activating at least one of said read column select lines in accordance with said address signal; and a plurality of read data transmitting circuits, provided corresponding to said memory cell blocks, respectively, for transmitting said read data sent from the selected memory cell column onto first data line pair, each of said read data transmitting circuits including
 a plurality of first gate circuits provided correspondingly to said memory cell columns, respectively, and each being activated by the corresponding one among said read column select lines, each of first gate circuits having
 a first read gate switch for connecting the corresponding read column select line to one line of said first data line pair in accordance with the potential level on one of said paired bit lines, and
 a second read gate switch for connecting the corresponding read column select line to the other line of said first data line pair in accordance with the potential level on the other of said paired bit lines; wherein each of said memory cell blocks further includes a third data line pair for transmitting write data to said memory cells;

said column select circuit generates column select signals for selecting the memory cell column to be supplied with said write data in accordance with said address signal;

said semiconductor memory device further comprises:
 a plurality of write column select lines transmitting said column select signals,
 a plurality of second data line pairs each provided in common for the second number of said memory cell blocks belonging to one same column of the memory cell blocks, and connected to each of said first data line pairs in each of said memory cell blocks, a plurality of fourth data line pairs provided in common for the second number of said memory cell blocks belonging to one same column of the memory cell blocks, and connected to each of said third data line pairs in each of said memory cell blocks, and a plurality of write data transmitting circuits for connecting the third data line pair to said bit line pair of the selected memory cell column in response to said column select signals, each of said write data transmitting circuits including a plurality of second gate circuits provided for said memory cell columns in each said memory cell block, and being activated by the corresponding write column select lines, respectively, and each of said second gate circuits including a first write gate switch for connecting one line of said bit line pair to one line of said third data line pair in accordance with the potential level on said write column select line, and a second write gate switch for connecting the other line of said bit line pair to the other line of said third data line pair in accordance with the potential level on said write column select line.

25. The semiconductor memory device according to claim 24, wherein wherein first and third data lines are provided for each of said memory cell columns in the corresponding memory cell block;

said read column select lines include a plurality of read column sub select lines arranged in the column direction of said memory cell blocks, each for instructing selection of the memory cell columns included in same column of memory cell blocks, and a plurality of read memory cell block select lines arranged in said column direction, each for instructing selection of one of the second number of said memory cell blocks corresponding to one same read column sub select line in the read operation;

said column select signals include a plurality of column select sub signals for selecting the memory cell columns included in one same column of memory cell blocks, and a plurality of memory cell block signals each for selecting one of the second number of said memory cell blocks corresponding to one same read column sub select line in the write operation;

said write column select lines include a plurality of write column sub select lines arranged in the column direction of said memory cell blocks each for transmitting said column select sub signal, and a plurality of write memory cell block select lines arranged in said column direction each for transmitting said memory cell block select signal;

said first and second read gate switches connect said read column sub select line to said first data line pair;

said first and second write gate switches are turned on in response to the column select sub signal on the corresponding write column sub select line; and each of said memory cell blocks includes a read memory cell block select switch arranged between said first and second data line pairs, and being turned on in accordance with the potential level on said read memory cell block select line, and a write memory cell block select switch arranged between said third and fourth data line pairs, and being turned on in accordance with the memory cell block select signal on said write memory cell block select line.

26. The semiconductor memory device according to claim 24, wherein at least a part of said plurality of read column select lines are arranged perpendicular to said write column select lines.

27. The semiconductor memory device according to claim 26, wherein said first data line pair is provided for each of said memory cell columns in the corresponding memory cell block;

said third data line pair is provided in common for said memory cell columns in the corresponding memory cell block;

said read column select lines include a plurality of read column sub select lines arranged in the column direction of said memory cell block, each for instructing selection of the memory cell columns included in same column of memory cell blocks, and a plurality of read memory cell block select lines arranged in said column direction, each for instructing selection of one from the second number of said memory cell blocks corresponding to the same read column sub select line in the read operation;

said column select signals include a plurality of column select sub signals each for selecting one from said plurality of memory cell columns included in each memory cell block belonging to one same row of said memory cell blocks;

said write column select lines include a plurality of write column sub select lines arranged in the row direction of said memory cell blocks, each for transmitting said column select sub signal;

said first and second read gate switches connect said read column sub select line to said first data line pair;

said first and second write gate switches are turned on in accordance with the column select sub signal said write column sub select line; and each of said memory cell blocks further includes a read memory cell block select switch arranged between said first and second data line pairs, and being turned on in response to the potential level on said read memory cell block select line.

28. The semiconductor memory device according to claim 26, wherein said first data line pair is provided in common for said memory cell columns in the corresponding memory cell block;

said third data line pair is provided for each of said memory cell columns in the corresponding memory cell block;

said read column select lines include a plurality of read column sub select lines arranged in the row direction of said memory cell blocks, each for selecting one of said memory cell columns included in each of said memory cell blocks belonging to one same row of the memory cell blocks;

said plurality of column select signals include a plurality of column select sub signals each for selecting all the memory cell columns included in one same column of memory cell block, and a plurality of memory cell block select signals each for selecting one of the second number of said memory cell blocks corresponding to the same column select sub signal in the write operation;

said write column select lines include a plurality of write column sub select lines arranged in the column direction of said memory cell block, each for transmitting said column select sub signal, and a plurality of write memory cell block select lines, arranged in said column direction, each for transmitting said memory cell block select signal;

said first and second read gate switches connect the corresponding read column sub select line to said first data line pair;

said first and second write gate switches are turned on in response to the column select sub signal on said write column sub select line; and each of said memory cell blocks includes a write memory cell block select switch arranged between said third and fourth data line pairs, and being turned on in accordance with the memory cell block select signal on said write memory cell block select line.

29. The semiconductor memory device according to claim 26, wherein said read column select lines include a plurality of first read column sub select lines arranged in the row direction of said memory cell block, each for instructing selection of a plural number of memory cell columns from said plurality of memory cell columns included in said memory cell blocks belonging to one same row, and a plurality o second read column sub select lines arranged in the column direction of said memory cell block, each for instructing selection of one from said plural number of said memory cell columns;

said first and second read gate switches connect the corresponding first read column sub select line to said first data line pair;

each of said read data transmitting circuits further includes a plurality of third gate circuits provided corresponding to said memory cell columns in each said memory cell block, respectively, and each being activated by the corresponding second read column sub select line; and each of said third gate circuits includes a third read gate switch for connecting said first read gate switch to one line of said first data line pair in accordance with the potential level on corresponding second read column sub select line, and a fourth read gate switch for connecting said second read gate switch and the other line of said first data line pair in accordance with the potential level on the corresponding second read column sub select line.

30. A semiconductor memory device for reading and writing storage data in accordance with an address signal, comprising:

a plurality of memory cell blocks arranged in a matrix of a first number of columns and a second number of rows, each of said memory cell blocks including a plurality of memory cells arranged in a matrix of memory cell rows and memory cell columns, bit line pairs arranged corresponding to said memory cell columns, respectively, and at least one first data line pair for transmitting read data from one of said memory cells selected according to said address signal;

a plurality of read column select lines for instructing selection of at least one of said memory cell columns;

a column select circuit for selectively activating at least one of said read column select lines in accordance with said address signal; and a plurality of read data transmitting circuits, provided corresponding to said memory cell blocks, respectively, for transmitting said read data sent from the selected memory cell column onto first data line pair, each of said read data transmitting circuits including a plurality of first gate circuits provided correspondingly to said memory cell columns, respectively, and each being activated by the corresponding one among said read column select lines, each of first gate circuits having a first read gate switch for connecting the corresponding read column select line to one line of said first data line pair in accordance with the potential level on one of said paired bit lines, and a second read gate switch for connecting the corresponding read column select line to the other line of said first data line pair in accordance with the potential level on the other of said paired bit lines; wherein said column select circuit generates column select signals for selecting the memory cell column to be supplied with write data in accordance with said address signal;

each of said memory blocks further includes a second data line pair for transmitting said write data to said memory column;

said semiconductor memory device further comprises:

a plurality of write column select lines transmitting said column select signals, a plurality of third data line pairs each provided in common for the second plurality of said memory cell blocks belonging to one same column of the memory cell blocks, and a plurality of write data transmitting circuits for connecting said second data line pair to said bit line pair in the selected memory cell column in accordance with said column select signals, each of said write data transmitting circuits including a plurality of second gate circuits provided correspondingly to said memory cell columns in said memory cell block, and being activated by the corresponding write column select lines, respectively; and wherein each of said second gate circuit includes a first write gate switch for connecting one line of said bit line pair and one line of said second data line pair in accordance with the column select signal on the corresponding write column select line, and a second write gate switch for connecting the other line of said bit line pair and the other line of said second data line pair in accordance with the column select signal on the corresponding write column select line; and said semiconductor memory device further comprises a plurality of first mode select switches provided corresponding to said memory cell blocks respectively, each for connecting said first data line pair and corresponding third data line pair when read operation is to be performed and a plurality of second mode select switches provided corresponding to said memory cell blocks, respectively, for connecting said second data line pair and corresponding third data line pair when write operation is to be performed.

31. The semiconductor memory device according to claim 30, wherein
- said memory cell block includes a third number of memory cell columns;
- said third number of memory cell columns are divided into a fourth number of sub-groups;
- said column select circuit further generates a plurality of column sub-group select signals for selecting a part of said fourth number of sub-groups;
- said second data line pairs are divided and arranged corresponding to each of said sub-groups; and
- each of said sub-groups further includes a sub switch for connecting the divided second data line pair to corresponding third data line pair in accordance with corresponding one among said column sub-group select signals.

32. The semiconductor memory device according to claim 30, wherein
- at least a part of said plurality of read column select lines are arranged perpendicular to said write column select lines.

33. A semiconductor memory device for reading and writing storage data in accordance with an address signal, comprising:
- a plurality of memory cell blocks arranged in a matrix of a first number of columns and a second number of rows,
- each of said memory cell blocks including
  - a plurality of memory cells arranged in a matrix of memory cell rows and memory cell columns, and
  - bit line pairs arranged correspondingly to said memory cell columns, respectively;
  - a plurality of read column select lines for instructing selection of one of said memory cell columns;
- a column select circuit for selectively activating at least one of said read column select lines in accordance with said address signal;
- a plurality of global data line pairs each provided in common for the second number of said memory cell blocks belonging to one same column of the memory cell blocks,
- a plurality of read data transmitting circuits, provided correspondingly to said memory cell blocks, respectively, for transmitting said read data sent from the selected memory cell column onto said global data line pair,
- each of said read data transmitting circuits including a third number of first gate circuits each provided for each of said memory cell columns in each of said memory cell blocks,
- each of said first gate circuits being activated by a corresponding one of said read column select lines and having
  - a first read gate switch for connecting said corresponding one of said read column select lines to a first one out of the remainder of said read column select lines in accordance with the potential level on one line of said bit line pair, and
  - a second read gate switch for connecting said corresponding one of read column select lines to a second one out of the remainder of said read column select lines in accordance with the potential level on the other line of said bit line pair; and
- a plurality of column select line switching circuits each for connecting said first and second ones of said read column select lines to the lines of said global data line pair, respectively, in accordance with an instruction from said column select circuit.

34. The semiconductor memory device according to claim 33, wherein
- the potential level on the activated read column select line is a first potential;
- the potential level on the inactive read column select line is a second potential higher than said first potential;
- said semiconductor memory device further comprises:
- a power supply line for supplying a third potential higher than said first potential, and
- a data line drive circuit for setting the potential levels on said global data line pairs;
- said first read gate switch includes a first MOS transistor electrically connecting the corresponding read column select line to said first one of said read column select lines and having a gate connected to one line of said bit line pair;
- said second read gate switch includes a second MOS transistor electrically connecting said corresponding read column select line to said second one of said read column select lines, and having a gate connected to the other line of said bit line pair;
- said data line drive circuit includes
  - a main amplifier circuit for amplifying a potential difference on said global data line pair, and
  - a high-resistance circuit connected between said global data line pair and said power supply line; and
- said data line drive circuit keeps potential level of the read column select line connected to the activated read column select line by one of said first and second MOS transistors at a level higher than the voltage of said one line of said bit line pair minus a threshold voltage of said first MOS transistor and higher than the voltage of said other line of said bit line pair minus a threshold voltage of said second MOS transistor.

35. The semiconductor memory device according to claim 33, wherein
- said column select circuit generates column select signals for selecting the memory cell column to be supplied with write data in accordance with said address signal;
- said semiconductor memory device further comprises:
- a plurality of write column select lines for transmitting said column select signals,
- a plurality of write drive circuits each provided for each of said global data line pairs, for transmitting said write data and inverted data of said write data onto two of said read column select lines, respectively, and
- a plurality of write data transmitting circuits for transmitting said write data onto said bit line pair in accordance with said column select signals,
- each of said write data transmitting circuits including a plurality of second gate circuits provided correspondingly to said memory cell columns in each of said memory cell blocks and being activated by the corresponding one of said write column select lines, respectively, and
- each of said second gate circuits including
- a first write gate switch for connecting one line of said bit line pair to one of said two read column select lines in accordance with said column select signal, and
- a second write gate switch for connecting the other line of said bit line pair and the other line of said two read column select lines in accordance with said column select signal.

* * * * *

UNITED STATES PATENT AND TRADEMARK OFFICE
CERTIFICATE OF CORRECTION

PATENT NO. : 6,542,428 B2
DATED : April 1, 2003
INVENTOR(S) : Hideto Hidaka

It is certified that error appears in the above-identified patent and that said Letters Patent is hereby corrected as shown below:

<u>Title page,</u>
Item [56], References Cited, OTHER PUBLICATIONS, the first reference listed should be changed to -- Ultra LSI Memory" by Kiyoo Ito, Baifukan, Nov. 5, 1994, pp. 165-169, 181-183 --

Signed and Sealed this

Seventeenth Day of February, 2004

JON W. DUDAS
*Acting Director of the United States Patent and Trademark Office*